(12) United States Patent
Xu et al.

(10) Patent No.: US 12,435,442 B2
(45) Date of Patent: Oct. 7, 2025

(54) STRAIN ENGINEERING AND EPITAXIAL STABILIZATION OF HALIDE PEROVSKITES

(71) Applicant: THE REGENTS OF THE UNIVERSITY OF CALIFORNIA, Oakland, CA (US)

(72) Inventors: Sheng Xu, La Jolla, CA (US); Yimu Chen, La Jolla, CA (US); Yusheng Lei, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 281 days.

(21) Appl. No.: 17/619,728

(22) PCT Filed: Jun. 29, 2020

(86) PCT No.: PCT/US2020/040083
§ 371 (c)(1),
(2) Date: Dec. 16, 2021

(87) PCT Pub. No.: WO2020/264483
PCT Pub. Date: Dec. 30, 2020

(65) Prior Publication Data
US 2022/0320433 A1 Oct. 6, 2022

Related U.S. Application Data
(60) Provisional application No. 62/868,370, filed on Jun. 28, 2019.

(51) Int. Cl.
*C30B 29/12* (2006.01)
*C30B 19/08* (2006.01)
(Continued)

(52) U.S. Cl.
CPC .............. *C30B 29/12* (2013.01); *C30B 19/08* (2013.01); *C30B 19/10* (2013.01); *C30B 19/12* (2013.01);
(Continued)

(58) Field of Classification Search
CPC ......... C30B 19/08; C30B 19/10; C30B 19/12; C30B 29/12; C30B 29/54; C30B 7/005;
(Continued)

(56) References Cited

U.S. PATENT DOCUMENTS

2018/0090312 A1 3/2018 Pickett
2018/0151301 A1* 5/2018 Fetzer .................... H10K 30/10
(Continued)

FOREIGN PATENT DOCUMENTS

CN 107141222 A 9/2017
EP 3136450 A1 3/2017
(Continued)

OTHER PUBLICATIONS

Smith, C. S. Piezoresistance effect in germanium and silicon. Phys. Rev. 94, 42-49 (1954).
(Continued)

*Primary Examiner* — Matthew J Song
(74) *Attorney, Agent, or Firm* — Kaplan Breyer Schwarz LLP

(57) ABSTRACT

In accordance with a method of forming a halide perovskite thin film, a first halide perovskite material is chosen from which a halide perovskite thin film is to be formed. An epitaxial substrate formed from a second halide perovskite material is also chosen. The halide perovskite thin film is epitaxially formed on the substrate from the first halide perovskite material. The substrate is chosen such that the halide perovskite thin film formed on the substrate has a selected value of at least one property. The property is
(Continued)

selected from the group including crystal structure stability, charge carrier mobility and band gap.

21 Claims, 40 Drawing Sheets

(51) Int. Cl.
| | |
|---|---|
| C30B 19/10 | (2006.01) |
| C30B 19/12 | (2006.01) |
| C30B 29/54 | (2006.01) |
| H10K 30/20 | (2023.01) |
| H10K 71/12 | (2023.01) |
| H10K 85/50 | (2023.01) |
| H01G 9/20 | (2006.01) |
| H10K 85/30 | (2023.01) |

(52) U.S. Cl.
CPC ............ *C30B 29/54* (2013.01); *H10K 30/20* (2023.02); *H10K 71/12* (2023.02); *H10K 85/50* (2023.02); *H01G 9/2009* (2013.01); *H10K 85/30* (2023.02)

(58) Field of Classification Search
CPC ........ C30B 7/06; H01G 9/2009; H10K 30/20; H10K 30/451; H10K 71/12; H10K 85/30; H10K 85/50
See application file for complete search history.

(56) References Cited

U.S. PATENT DOCUMENTS

| | | |
|---|---|---|
| 2018/0211791 A1 | 7/2018 | Kim et al. |
| 2018/0248052 A1 | 8/2018 | Seok et al. |
| 2019/0173025 A1 | 6/2019 | Uchida et al. |
| 2021/0148004 A1* | 5/2021 | Lunt, III ............. C23C 14/0694 |

FOREIGN PATENT DOCUMENTS

| | | |
|---|---|---|
| EP | 3244455 A1 | 11/2017 |
| EP | 3306691 A1 | 4/2018 |
| WO | 2018231909 A1 | 12/2018 |
| WO | WO-2019100041 A1 * | 5/2019 ............. C09K 11/06 |

OTHER PUBLICATIONS

Llordés, A. et al. Nanoscale strain-induced pair suppression as a vortex-pinning mechanism in high-temperature superconductors. Nat. Mater. 11, 329-336 (2012).
Yang, W. S. et al. Iodide management in formamidinium-lead-halide-based perovskite layers for efficient solar cells. Science 356, 1376-1379 (2017).
Lin, K. et al. Perovskite light-emitting diodes with external quantum efficiency exceeding 20 per cent. Nature 562, 245-248 (2018).
Feng, J. et al. Single-crystalline layered metal-halide perovskite nanowires for ultrasensitive photodetectors. Nat. Electron. 1, 404-410 (2018).
Lu, X. et al. Enhanced structural stability and photo responsiveness of CH3NH3SnI3 perovskite via pressure-induced amorphization and recrystallization. Adv. Mater. 28, 8663-8668 (2016).
Liu, G. et al. Pressure-induced bandgap optimization in lead-based perovskites with prolonged carrier lifetime and ambient retainability. Adv. Funct. Mater. 27, 1604208 (2017).
Wang, Y. et al. Pressure-induced phase transformation, reversible amorphization, and anomalous visible light response in organolead bromide perovskite. J. Am. Chem. Soc. 137, 11144-11149 (2015).
Chen, B. et al. Large electrostrictive response in lead halide perovskites. Nat. Mater. 17, 1164 (2018).
Zhao, J. et al. Strained hybrid perovskite thin films and their impact on the intrinsic stability of perovskite solar cells. Sci. Adv. 3, eaao5616 (2017).
Zhu, C. et al. Strain engineering in perovskite solar cells and its impacts on carrier dynamics. Nat. Commun. 10, 815 (2019).
Steele, J. A. et al. Thermal unequilibrium of strained black CsPbI3 thin films. Science 365, 679-684 (2019).
Wang, Y. et al. Nontrivial strength of van der Waals epitaxial interaction in soft perovskites. Phys. Rev. Mater. 2, 076002 (2018).
Li, X., et al. Residual nanoscale strain in cesium lead bromide perovskite reduces stability and shifts local luminescence. Chem. Mater. 31, 2778-2785 (2019).
Wang, Y. et al. Defect-engineered epitaxial $VO_{2\pm\delta}$ in strain engineering of heterogeneous soft crystals. Sci. Adv. 4, eaar3679 (2018).
Han, Q. et al. Single crystal formamidinium lead iodide (FAPbI3): insight into the structural, optical, and electrical properties. Adv. Mater. 28, 2253-2258 (2016).
Fang, Y., Dong, Q., Shao, Y., Yuan, Y. & Huang, J. Highly narrowband perovskite singlecrystal photodetectors enabled by surface-charge recombination. Nat. Photon. 9, 679-686 (2015).
Pohl, U. W. Epitaxy of Semiconductors: Introduction to Physical Principles (Springer, 2013).
Chen, T. et al. Entropy-driven structural transition and kinetic trapping in formamidinium lead iodide perovskite. Sci. Adv. 2, e1601650 (2016).
Maculan, G. et al. CH3NH3PbCl3 single crystals: inverse temperature crystallization and visible-blind UV-photodetector. J. Phys. Chem. Lett. 6, 3781-3786 (2015).
Rakita, Y., Cohen, S. R., Kedem, N. K., Hodes, G. & Cahen, D. Mechanical properties of APbX3 (A= Cs or CH3NH3; X= I or Br) perovskite single crystals. MRS Commun. 5, 623-629 (2015).
Steele, J. A. et al. Direct laser writing of δ- to α-phase transformation in formamidinium lead iodide. ACS Nano 11, 8072-8083 (2017).
Li, D. et al. Size-dependent phase transition in methylammonium lead iodide perovskite microplate crystals. Nat. Commun. 7, 11330 (2016).
Sarmah, S. P. et al. Double charged surface layers in lead halide perovskite crystals. Nano Lett. 17, 2021-2027 (2017).
Kanemitsu, Y. Luminescence spectroscopy of lead-halide perovskites: materials properties and application as photovoltaic devices. J. Mater. Chem. C 5, 3427-3437 (2017).
Xie, L.-Q. et al. Understanding the cubic phase stabilization and crystallization kinetics in mixed cations and halides perovskite single crystals. J. Am. Chem. Soc. 139, 3320-3323 (2017).
Katan, C., Mohite, A. D. & Even, J. Entropy in halide perovskites. Nat. Mater. 17, 377-379 (2018).
Ge, C. et al. Ultralow thermal conductivity and ultrahigh thermal expansion of singlecrystal organic-inorganic hybrid perovskite CH3NH3PbX3 (X = Cl, Br, I). J. Phys. Chem. C 122, 15973-15978 (2018).
Yin, W.-J., Yang, J.-H., Kang, J., Yan, Y. & Wei, S.-H. Halide perovskite materials for solar cells: a theoretical review. J. Mater. Chem. A 3, 8926-8942 (2015).
Giorgi, G., Fujisawa, J.-I., Segawa, H. & Yamashita, K. Small photocarrier effective masses featuring ambipolar transport in methylammonium lead iodide perovskite: a density functional analysis. J. Phys. Chem. Lett. 4, 4213-4216 (2013).
Herz, L. M. Charge-carrier mobilities in metal halide perovskites: fundamental mechanisms and limits. ACS Energy Lett. 2, 1539-1548 (2017).
Dong, Q. et al. Electron-hole diffusion lengths > 175 μm in solution-grown CH3NH3PbI3 single crystals. Science 347, 967-970 (2015).
Zheng, X. et al. Improved phase stability of formamidinium lead triiodide perovskite by strain relaxation. ACS Energy Lett. 1, 1014-1020 (2016).
Fu, Y. et al. Stabilization of the metastable lead iodide perovskite phase via surface functionalization. Nano Lett. 17, 4405-4414 (2017).
Saidaminov, M. I. et al. Suppression of atomic vacancies via incorporation of isovalent small ions to increase the stability of halide perovskite solar cells in ambient air. Nat. Energy 3, 648-654 (2018).

(56) References Cited

OTHER PUBLICATIONS

Liu, Y. et al. A 1300 mm2 ultrahigh-performance digital imaging assembly using highquality perovskite single crystals. Adv. Mater. 30, 1707314 (2018).

Weller, M. T., et al., "Cubic Perovskite Structure of Black Formamidinium Lead Iodide, a-[HC(NH2)2]PbI3, at 298 K", ACS Publications, J. Phys. Chem. Lett., vol. 6, No. 16, Aug. 20, 2015, pp. 3209-3212.

Zhaolai, C., et al., Single-Crystal MAPbI 3 Perovskite Solar Cells Exceeding 21% Power Conversion Efficiency, ACS Energy Letters, vol. 4, No. 6, May 7, 2019, pp. 1258-1259.

\* cited by examiner

STRAIN ENGINEERING AND EPITAXIAL STABILIZATION OF HALIDE PEROVSKITES

CROSS-REFERENCE TO RELATED APPLICATION

This application claims the benefit of U.S. Provisional Application No. 62/868,370, filed Jun. 28, 2019, the contents of which are incorporated herein by reference.

BACKGROUND

Strain engineering is an effective tool for enhancing semiconductor device performance. Halide perovskites have shown promise in device applications due to their desirable electronic and optoelectronic properties that make them suitable for use in photovoltaics, photodetectors and LEDs, for example. While applying strain to halide perovskites has been attempted in many ways, including hydrostatic pressurization, electrostriction, annealing, Van der Waals force, thermal expansion mismatch, and heat-induced substrate phase transition. However, controllable and device-compatible strain engineering of halide perovskites remains challenging.

SUMMARY

Disclosed herein are methods, materials, structures, articles of manufacture, devices and applications that pertain to the strained epitaxial growth of halide perovskite single crystals on lattice-mismatched halide perovskite substrates as an approach to engineering the structure and properties of these materials as desired for device applications. This strain engineering capability opens up new opportunities for designing and fabricating a diverse range of high performance electronic and optoelectronic devices using crystalline hybrid perovskites.

In an exemplary embodiment, the first strained epitaxial growth of halide perovskite single crystals on lattice-mismatched halide perovskite substrates is described. The strain engineering of α-formamidinium lead iodide (α-FAPbI3) was studied by experimental techniques and first-principles calculations. By tailoring the substrate composition and therefore the lattice parameter, a compressive strain as high as 2.4% is applied to the epitaxial α-FAPbI3 thin film, which is shown to effectively change the crystal structure, reduce the bandgap, and increase hole mobility of α-FAPbI3. Strained epitaxy is also shown to have a significant stabilization effect on the α-FAPbI3 phase.

In accordance with one aspect of the subject matter described herein, a method of forming a halide perovskite thin film is provided. In accordance with the method, a first halide perovskite material is chosen from which a halide perovskite thin film is to be formed. An epitaxial substrate formed from a second halide perovskite material is also chosen. The halide perovskite thin film is epitaxially formed on the substrate from the first halide perovskite material. The substrate is chosen such that the halide perovskite thin film formed on the substrate has a selected value of at least one property. The property is selected from the group including crystal structure stability, charge carrier mobility and band gap.

In accordance with another aspect of the subject matter described herein, a method of tuning at least one property of a halide perovskite thin film is provided. In accordance with the method, an epitaxial substrate formed from a second halide perovskite material is chosen based on a selection of a first halide perovskite material from which the halide perovskite thin film is to be formed. The halide perovskite thin film is epitaxially formed on the substrate from the first halide perovskite material. The substrate is chosen such that the halide perovskite thin film formed on the substrate has a compressive or tensile strain with a specified value.

In accordance with yet another aspect of the subject matter described herein, a method of forming a halide perovskite thin film is provided. In accordance with the method, a first halide perovskite material is chosen from which a halide perovskite thin film is to be formed and a single crystal halide perovskite substrate is chosen from a second halide perovskite material on which the halide perovskite thin film is to be formed to tune a property of the halide perovskite thin film using strain modulation to thereby impose a compressive or tensile strain on the halide perovskite thin film. The halide perovskite thin film is epitaxially formed on the chosen halide perovskite substrate from the first halide perovskite material.

As an example of one illustrative use case, strain engineering of α-FAPbI3 is applied to enhance photodetector performance.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter. The claimed subject matter is not limited to implementations that solve any or all disadvantages noted in any part of this disclosure.

BRIEF DESCRIPTION OF THE DRAWINGS

FIG. 7b shows the corresponding height scanning curve of the strained epitaxial α-FAPbI$_3$ thin film of FIG. 7a.

DETAILED DESCRIPTION

In one aspect of the subject matter described herein, α-FAPbI$_3$ is epitaxially grown on a series of mixed methylammonium lead chloride/bromide (MAPbCl$_x$Br$_{3-x}$) single crystalline substrates by the reverse temperature growth method. The MAPbCl$_x$Br$_{3-x}$ substrates with different compositional ratios and thus lattice parameters are grown by solutions with different Cl/Br precursor molar ratios (see Table 1).

TABLE 1

Summary of the substrate growth precursor ratios, the resulting substrate compositional Br ratios, and lattice parameters.

| Cl/Br Solution Ratio | Compositional Br Ratio (%) | Formula | Lattice Parameter (Å) |
| --- | --- | --- | --- |
| Cl Only | 0 | $MAPbCl_{3.00}Br_{0.00}$ | 5.70 |
| 1/2 | 50.0 | $MAPbCl_{1.50}Br_{1.50}$ | 5.83 |
| 1/2.5 | 58.0 | $MAPbCl_{1.25}Br_{1.75}$ | 5.86 |
| 1/3 | 62.1 | $MAPbCl_{1.15}Br_{1.85}$ | 5.87 |
| 1/4 | 64.3 | $MAPbCl_{1.05}Br_{1.95}$ | 5.88 |
| 1/6 | 76.8 | $MAPbCl_{0.70}Br_{2.30}$ | 5.89 |
| 1/8 | 80.6 | $MAPbCl_{0.60}Br_{2.40}$ | 5.90 |
| 1/19 | 85.2 | $MAPbCl_{0.45}Br_{2.55}$ | 5.92 |
| Br Only | 100 | $MAPbCl_{0.00}Br_{3.00}$ | 5.95 |

Note that the strain in the epilayer is not only determined by the lattice mismatch, but also the relaxation mechanisms. Lattice distortion relaxes the strain, so the region near the heteroepitaxy interface has the highest strain, which gradually drops at regions distant from the interface. The total elastic strain energy increases as the film grows thicker, until it eventually crosses the threshold energy for structural defect generation, and dislocations will form to partially relieve the misfit. A slow growth rate of the epilayer is chosen as it also impacts the defect concentration in the epilayer. The crystalline quality of the substrates is carefully optimized as the defects in the substrates can propagate into the epilayer.

Figure 6A:
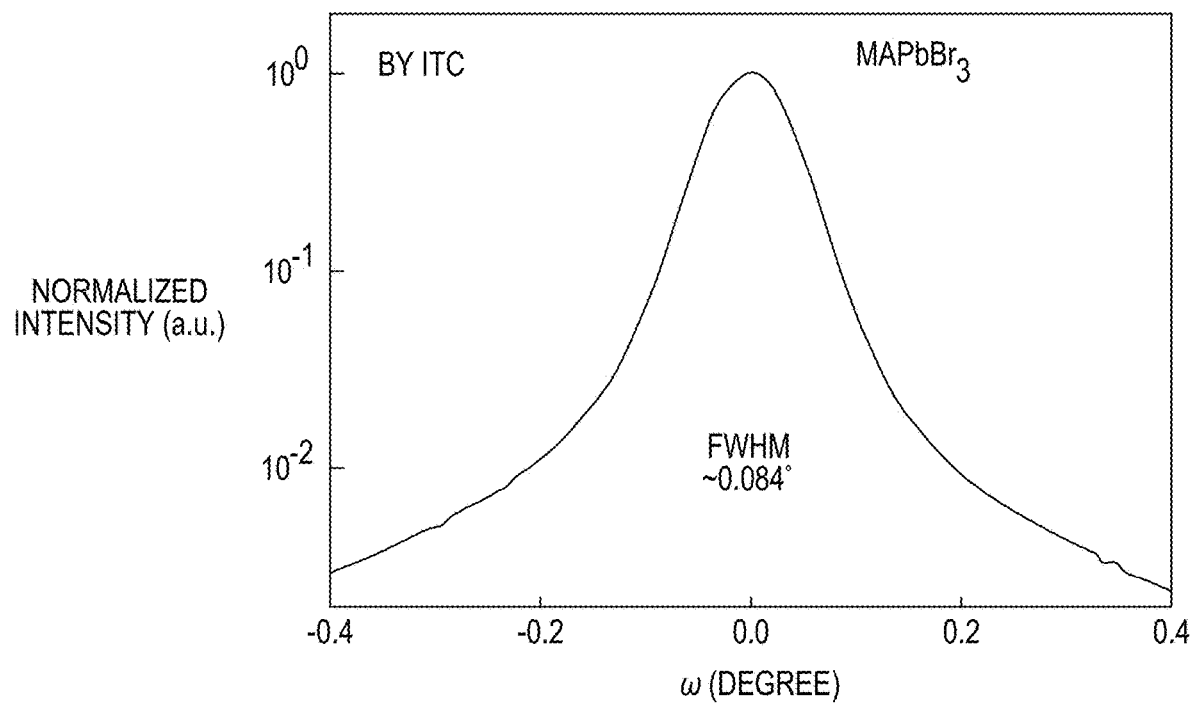
FIGS. 6a to 6f show the rocking curve measurements of substrates grown by the inverse temperature crystallization (ITC) and slow solvent evaporation (SSE) methods.
Figure 6B:
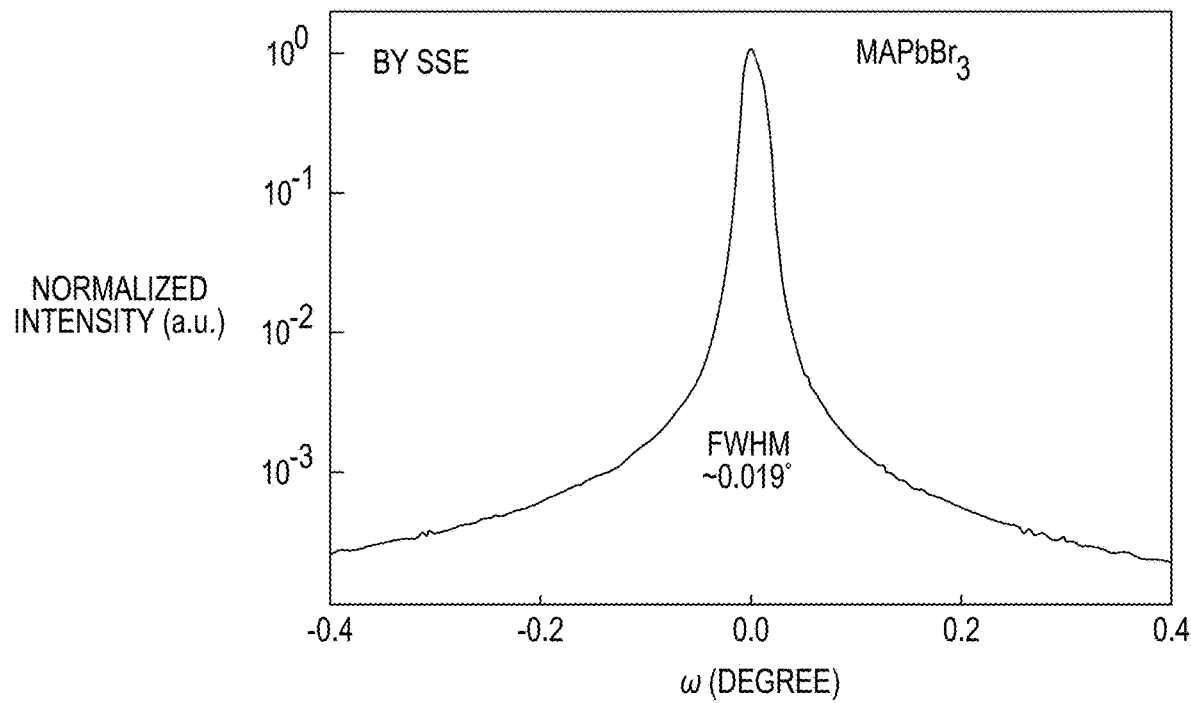
Figure 6C:
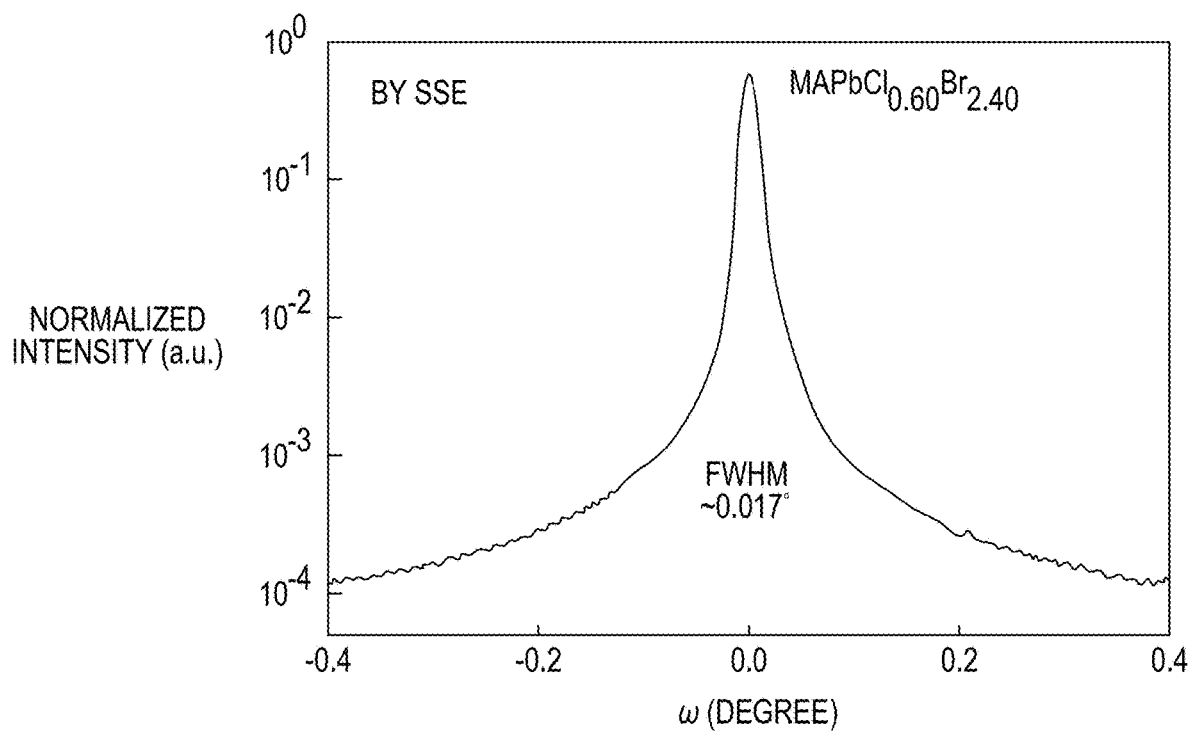
Figure 6D:
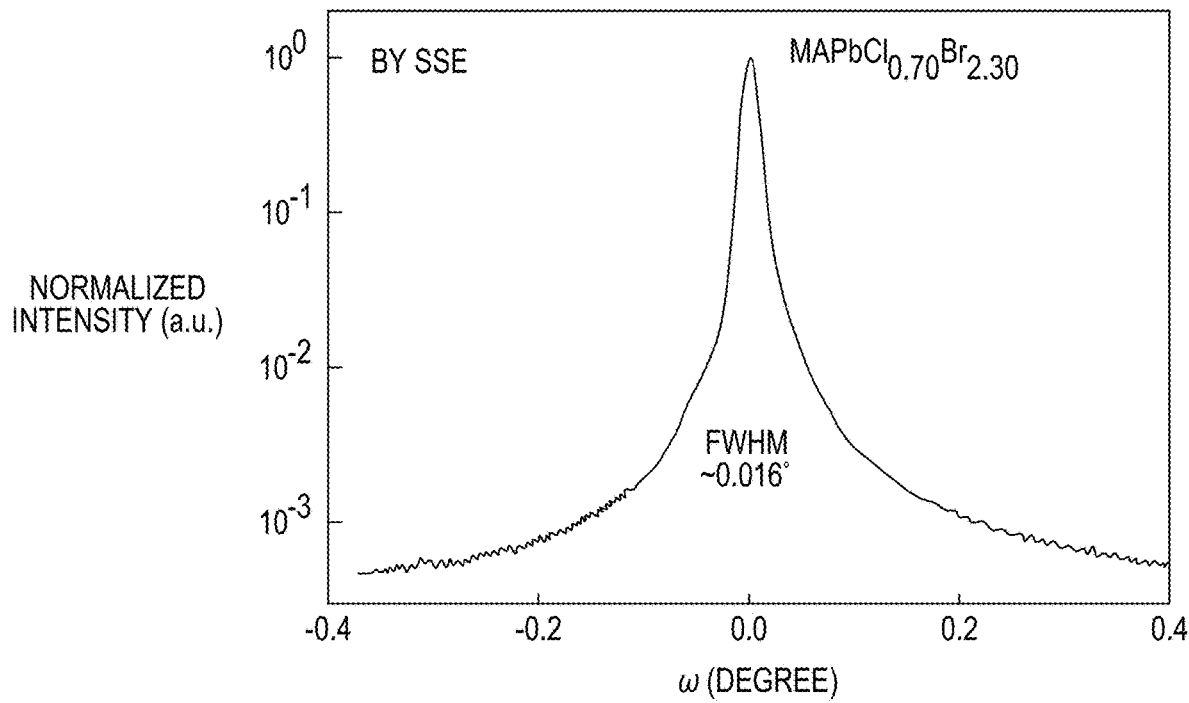
Figure 6E:
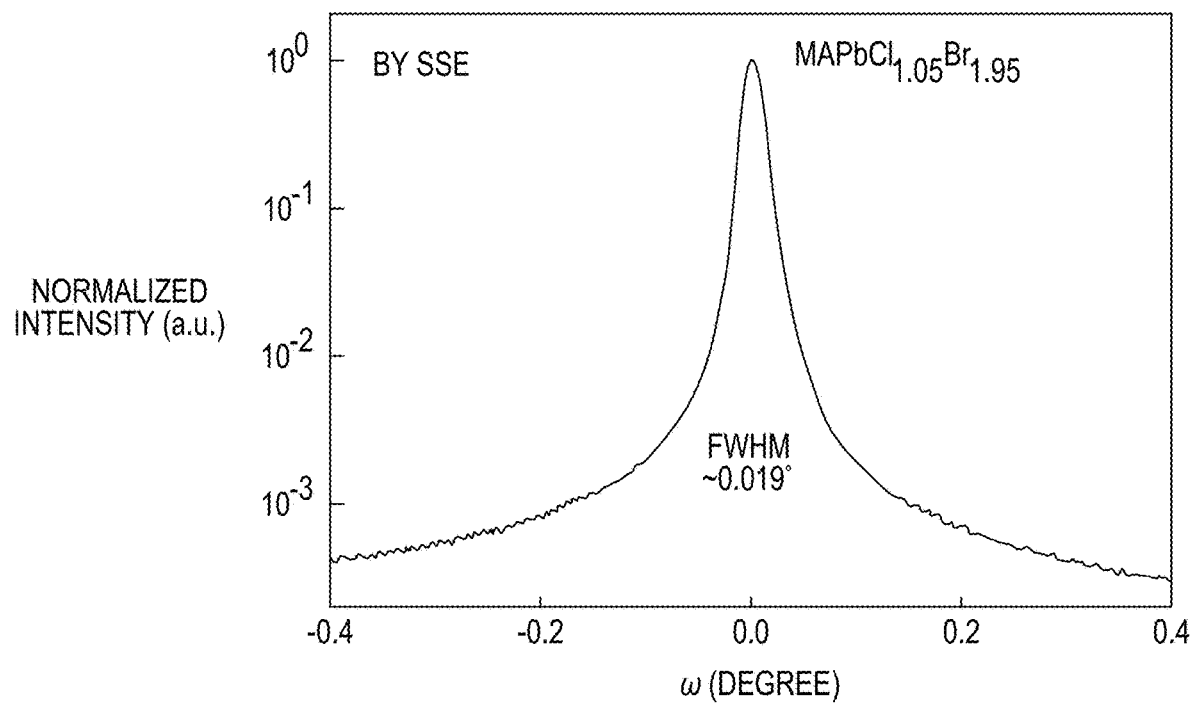
Figure 6F:
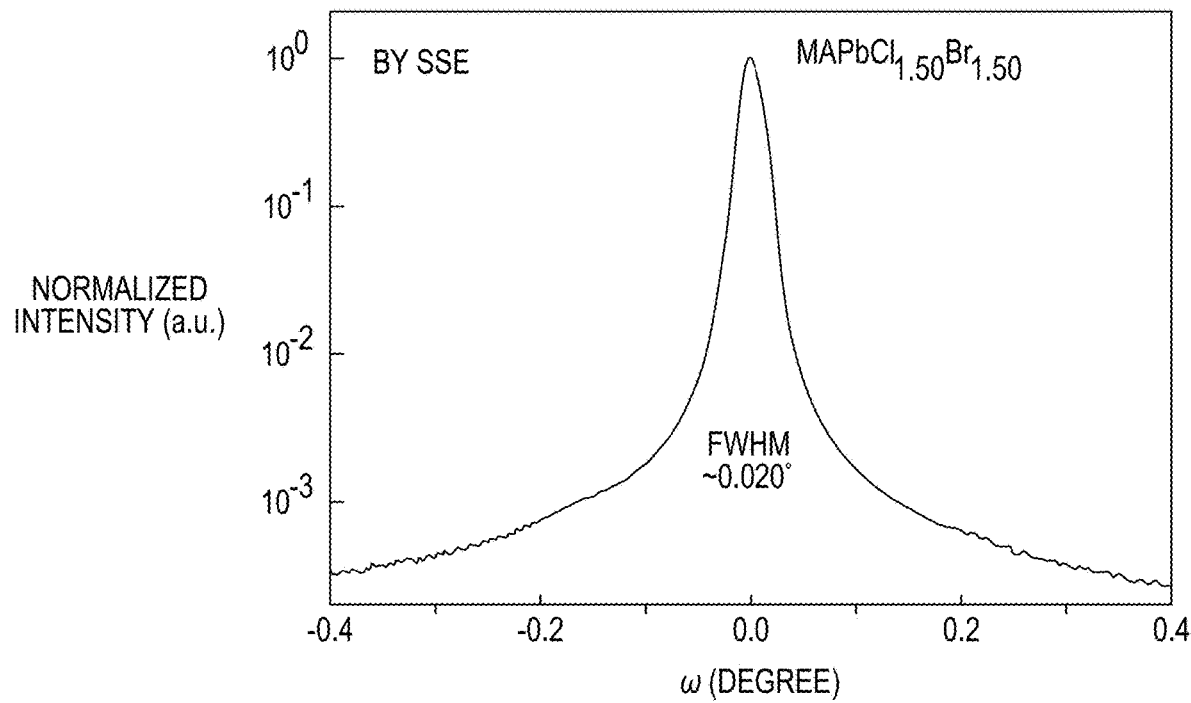
Figure 6G:
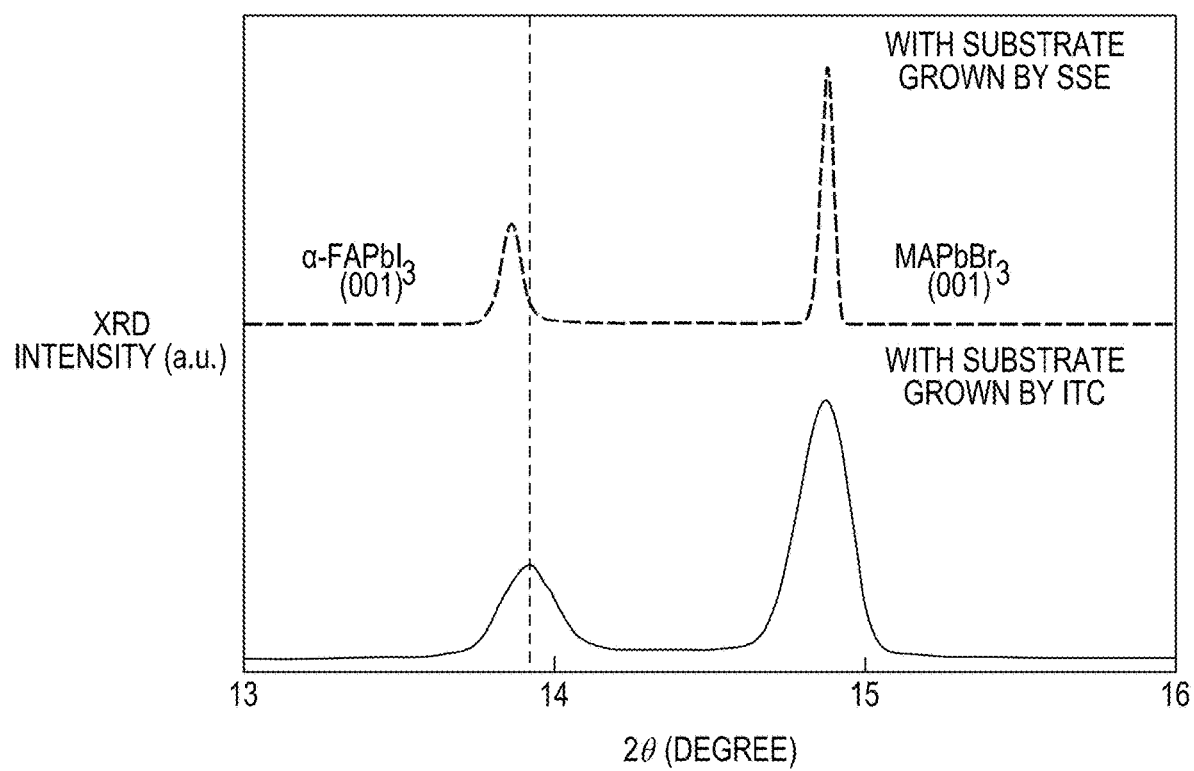
FIG. 6g shows the XRD patterns of strained α-FAPbI$_3$ on a substrate with higher crystal quality (red curve) and relaxed α-FAPbI$_3$ on a substrate with lower crystal quality (gray curve).

FIGS. 6a to 6f show the rocking curve measurements of substrates grown by the inverse temperature crystallization (ITC) and slow solvent evaporation (SSE) methods. Lower full width at half maximum (FWHM) values by the SSE indicates a better crystal quality. FIG. 6g shows the XRD patterns of strained α-FAPbI$_3$ on a substrate with higher crystal quality and relaxed α-FAPbI$_3$ on a substrate with lower crystal quality. Dislocations in the substrates can propagate into and relax the strain in the epitaxial α-FAPbI$_3$. The vertical dashed line labels the (001) peak position of strain-free α-FAPbI$_3$. The peak position from the strain-relaxed FAPbI$_3$ shifts back to that of strain-free α-FAPbI$_3$.

Figure 1A:
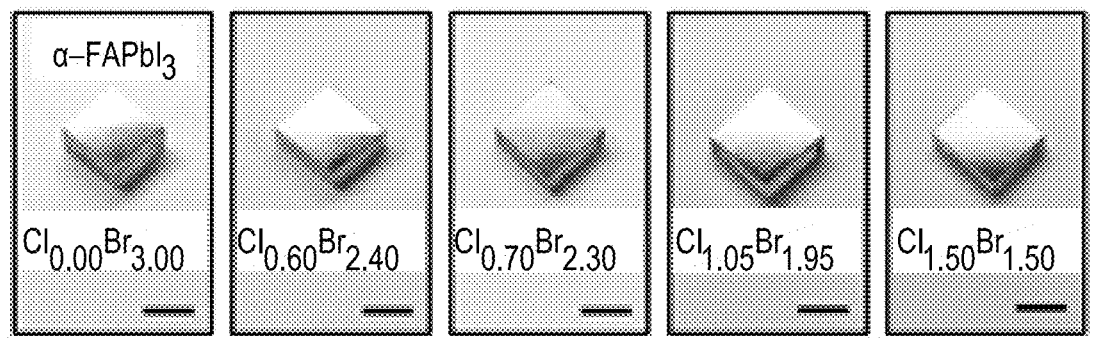
FIG. 1a shows optical images of a series of MAPbCl$_x$Br$_3$, substrates with a layer of epitaxial α-FAPbI$_3$ thin film on top.
Figure 1B:
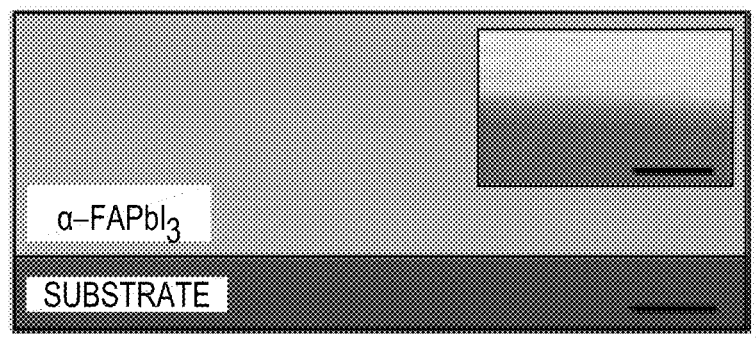
FIG. 1B shows A cross-sectional Scanning Electron Microscope (SEM) image of the epitaxial thin film shown in FIG. 1a with controlled uniform thickness.
Figure 7A:
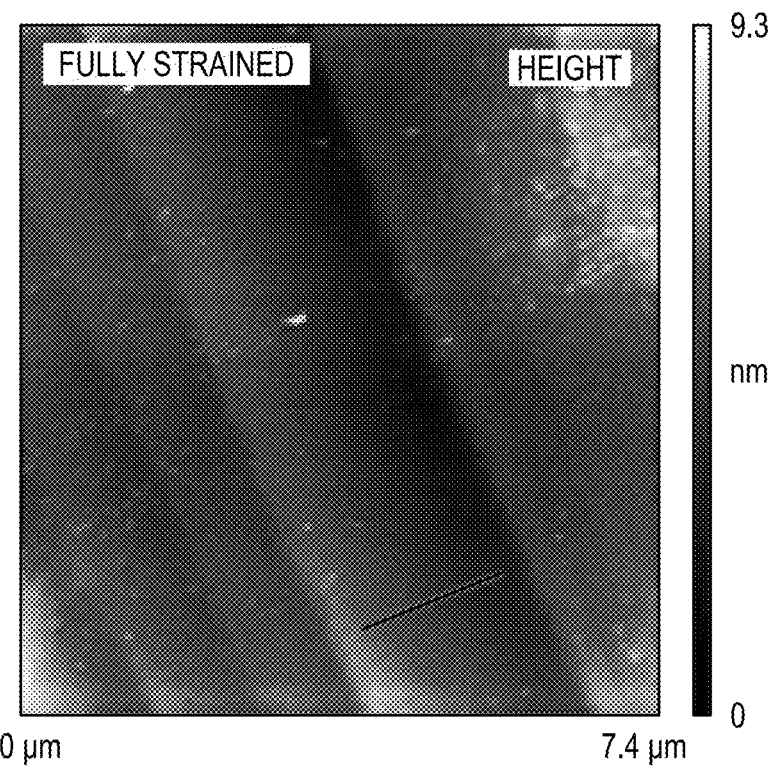
FIG. 7a shows a topography image of a strained epitaxial α-FAPbI$_3$ thin film.
Figure 7B:
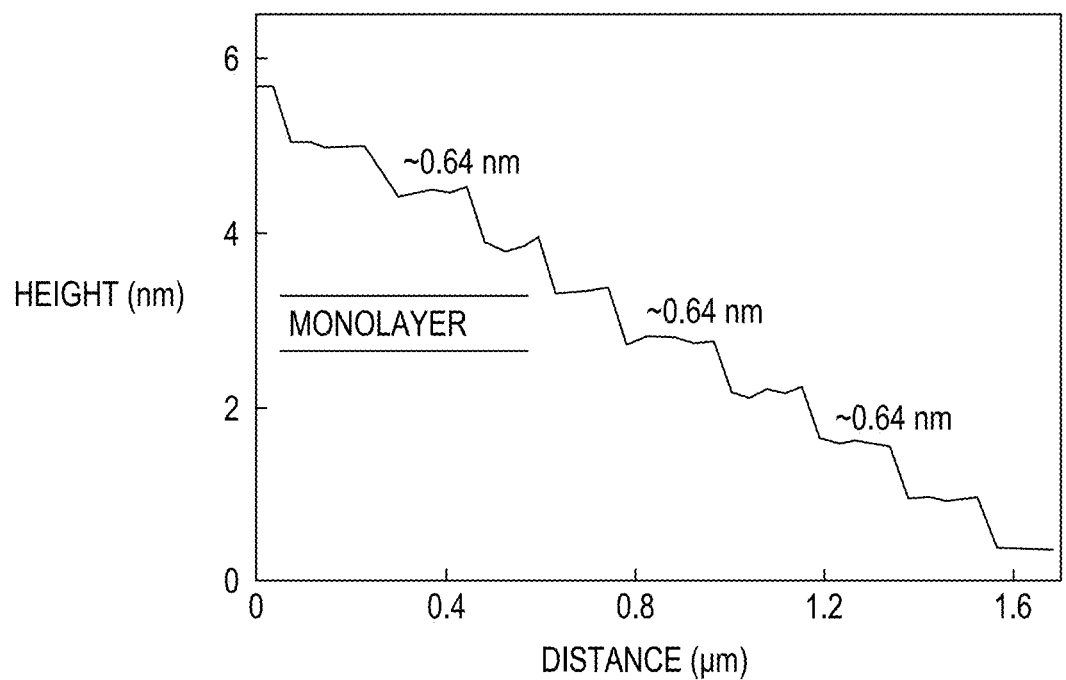
Figure 7C:
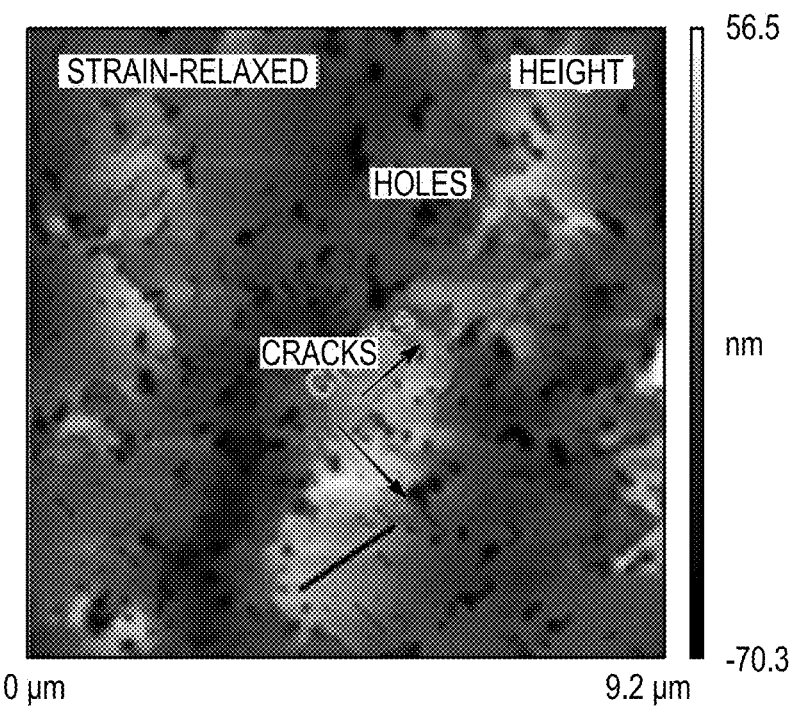
FIG. 7c shows a topography image of a strain-relaxed epitaxial α-FAPbI$_3$ thick film and FIG. 7d shows the corresponding height scanning curve of the strain-relaxed epitaxial α-FAPbI$_3$ thick film.
Figure 7D:
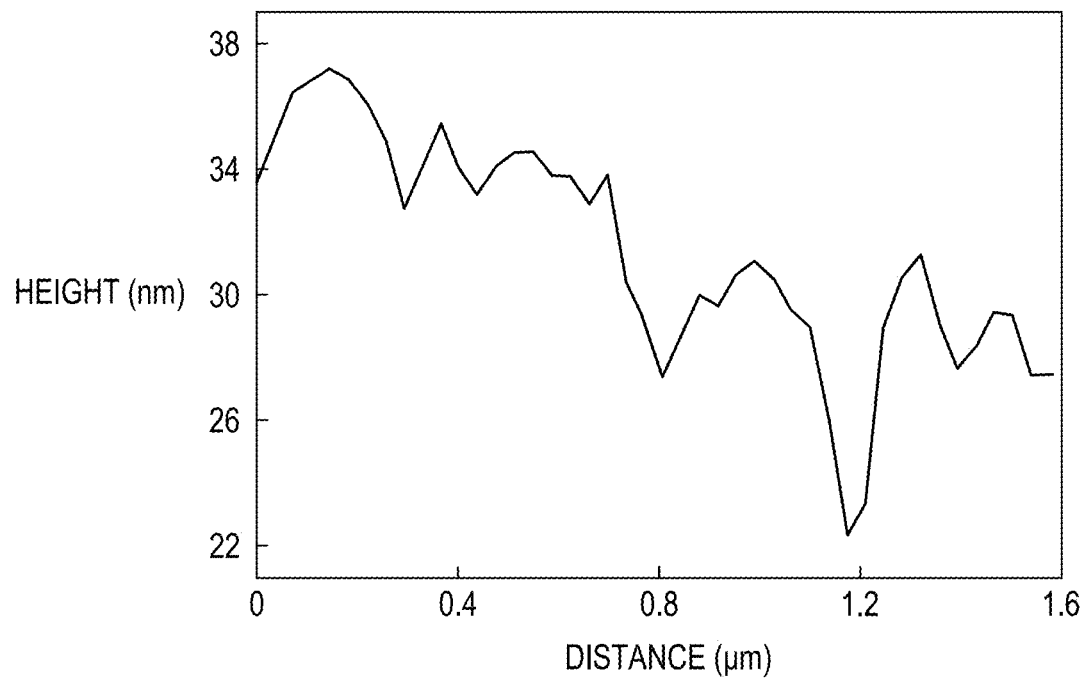

Heteroepitaxial growth leads to controllable film thickness, preferential growth sites/orientations, compatible fabrication protocols with existing infrastructures, and scalable large-area device applications. FIG. 1a shows optical images of a series of MAPbCl$_x$Br$_{3-x}$ substrates with a layer of epitaxial α-FAPbI$_3$ film on the top. The epilayer has a uniform thickness with a well-defined film-substrate interface (FIG. 1b). The film topography can reveal the growth mechanism and sometimes defects for strain relaxation. A sub-100 nm α-FAPbI$_3$ thin film shows a clear interface (FIG. 1b), and a well-defined terrain morphology, with a step height close to one layer of α-FAPbI$_3$ unit cell, indicating a layer-by-layer growth behavior of the epitaxial α-FAPbI$_3$ (FIGS. 7a and 7b). A 10 μm film, on the other hand, shows non-conformal growth, indicating strain relaxation by dislocation formation (FIGS. 7c and 7d).

Figure 1C:
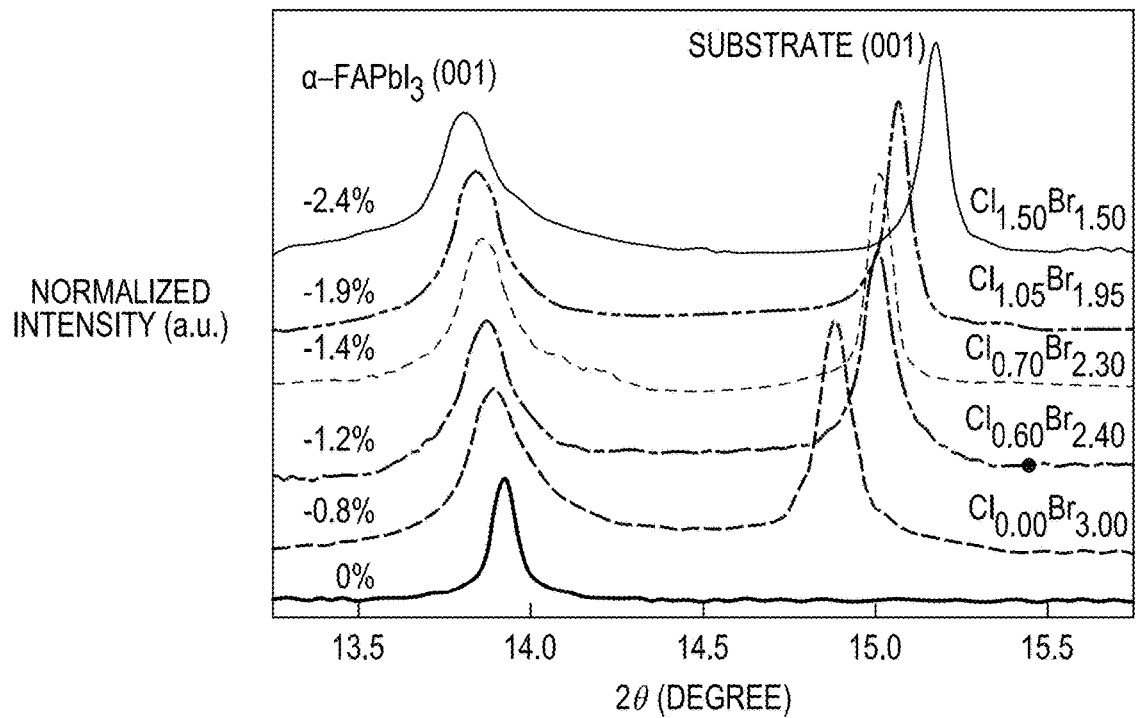
FIG. 1c shows a high resolution XRD ω-2θ scan of the (001) peaks of the epitaxial thin film samples on different substrates showing the increase of tetragonality with increasing lattice mismatch.
Figure 8A:
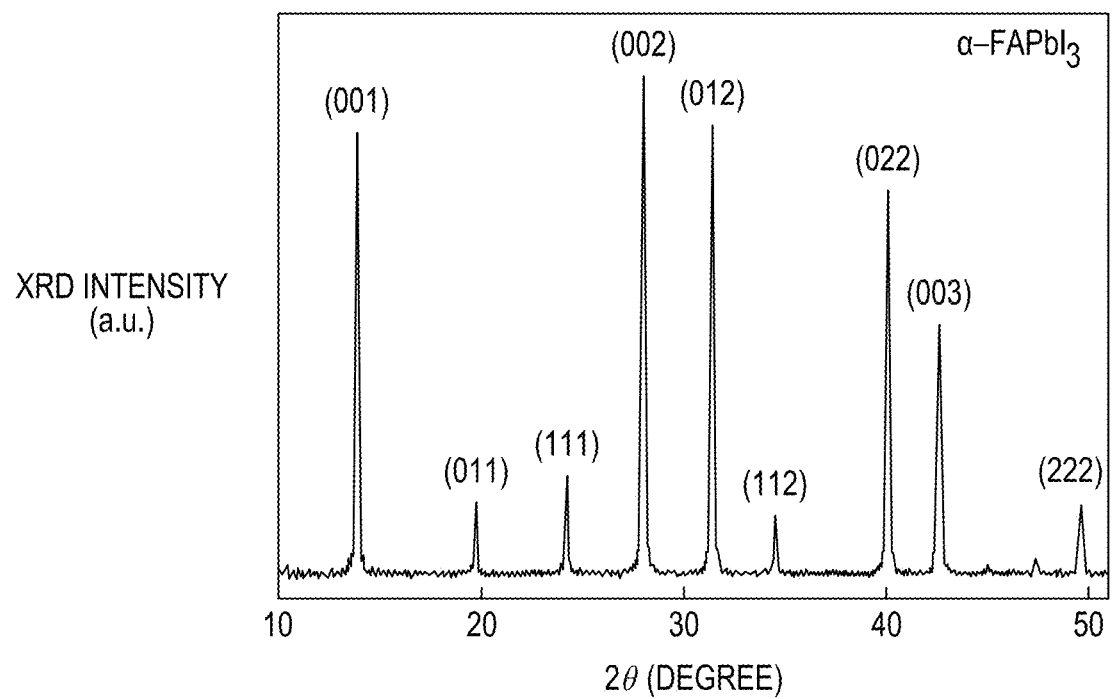
FIG. 8a shows a powder x-ray diffraction (XRD) pattern of α-FAPbI$_3$ that is used of a reference of strain-free α-FAPbI$_3$.
Figure 8B:
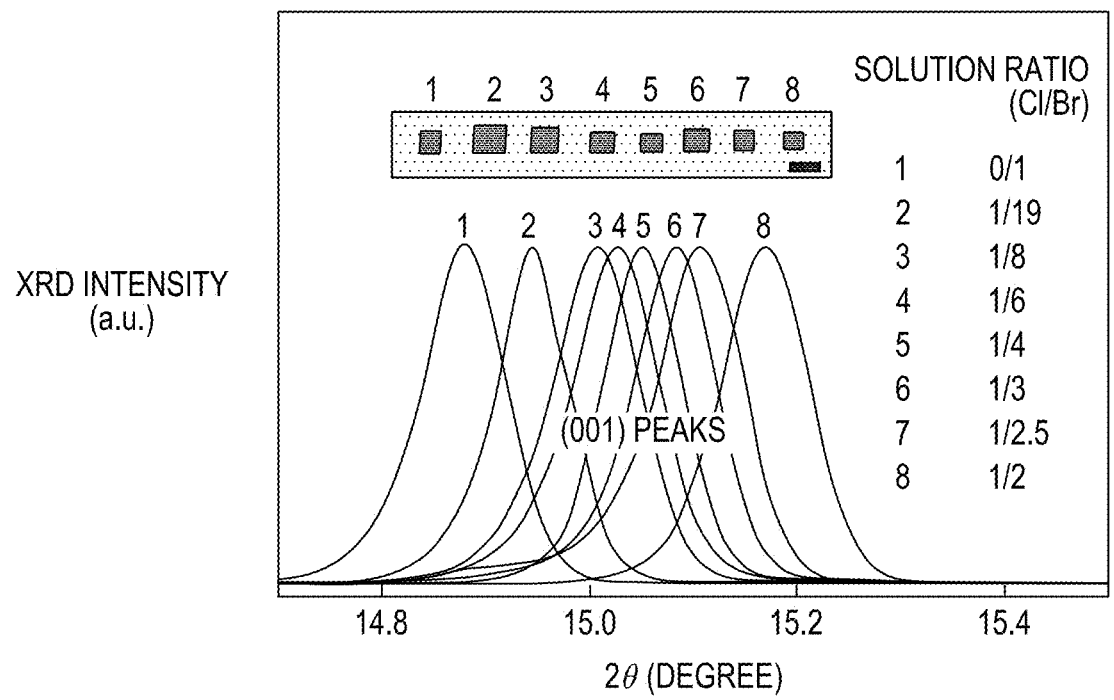
FIG. 8b shows powder XRD patterns of substrates with different ratios of their composition.

The crystallographic relationships between the MAPbCl$_x$Br$_{3-x}$ substrates and the epitaxial α-FAPbI$_3$ thin films are illustrated by High-resolution X-ray Diffraction (HRXRD) (FIG. 1c). In their freestanding form, both α-FAPbI$_3$ and MAPbCl$_x$Br$_{3-x}$ have a cubic structure. The lattice parameters of freestanding α-FAPbI$_3$ (Pm3m space group) and MAPbCl$_x$Br$_{3-x}$ substrates (Pm3m space group) are calculated to be 6.35 Å (FIGS. 8a and 8b) and 5.83-5.95 Å, respectively. The ratio x for each composition is then calculated to be 0-1.50, according to the Vegard's Law (Table 1). As x increases, the MAPbCl$_x$Br$_{3-x}$ (001) peaks shift to a higher 2θ angle, indicating a decrease of the substrates' lattice parameters and therefore an increase of the lattice mismatch (FIG. 1c and Table 2). Meanwhile, the α-FAPbI$_3$ (001) peak shifts to a lower 2θ angle, indicating an increase of the out-of-plane lattice parameter as the in-plain compressive strain increases.

TABLE 2

Summary of epitaxial growth substrates and the corresponding strain measured in α-FAPbI$_3$.

| Substrate Composition | α-FAPbI$_3$ (001) Peak (degree) | Strain (%) |
| --- | --- | --- |
| $MAPbCl_{1.50}Br_{1.50}$ | 13.82 | −2.4 |
| $MAPbCl_{1.05}Br_{1.95}$ | 13.84 | −1.9 |
| $MAPbCl_{0.70}Br_{2.30}$ | 13.86 | −1.4 |
| $MAPbCl_{0.60}Br_{2.40}$ | 13.87 | −1.2 |
| $MAPbCl_{0.00}Br_{3.00}$ | 13.89 | −0.8 |

Figure 8C:
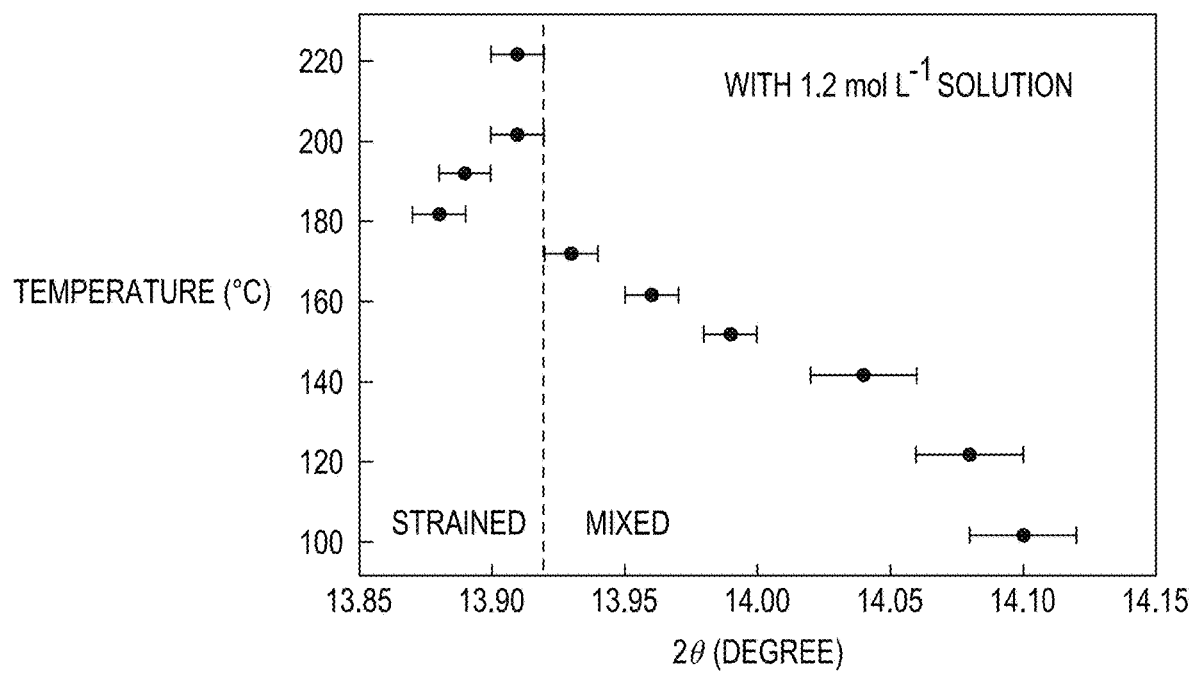
FIG. 8c shows the XRD peak positions of α-FAPbI$_3$ at different growth temperatures.
Figure 8D:
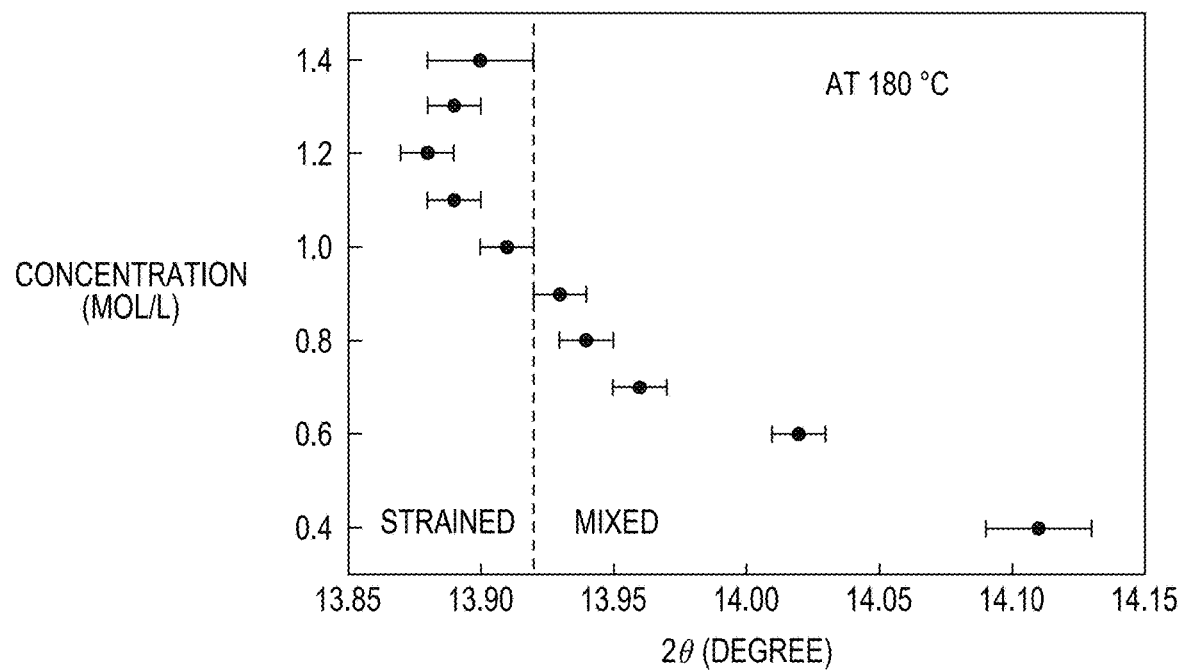
FIG. 8d shows XRD (100) peak positions of α-FAPbI$_3$ at different growth solution concentrations.

The growth conditions are systematically studied. FIG. 8c shows the XRD (100) peak positions of α-FAPbI$_3$ at different growth temperatures. The temperature to grow α-FAPbI$_3$ with the highest strain is found to be ~180° C. Further increasing the growth temperature results in a high growth rate and a thick epitaxial layer of α-FAPbI$_3$ and therefore low crystal quality that relaxes the strain. Decreasing the growth temperature below 180° C. can lead to slow crystallization and thus a mixed epitaxial alloy layer at the interface, which shifts the XRD peak position to higher angles. FIG. 8d shows the XRD (100) peak positions of α-FAPbI$_3$ at different growth solution concentrations. Concentrations above 1.2 mol L$^{-1}$ result in high defect concentration and therefore strain relaxation, due to the fast crystallization rate and the thick epitaxial layer. Concentrations below 1.0 mol L$^{-1}$ will slow down the crystallization process and lead to a mixed epitaxial alloy layer at the interface. The vertical dash lines show the peak position of a strain-free powder sample.

Figure 1D:
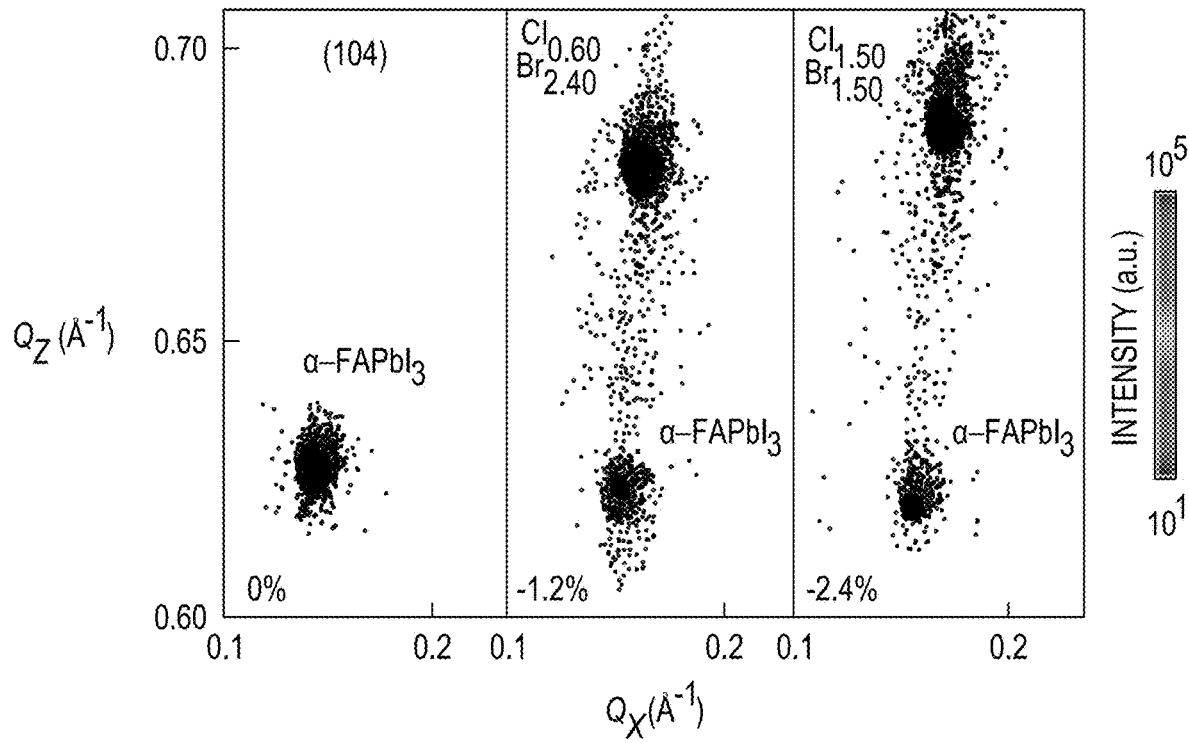
FIG. 1d shows reciprocal spacing mapping with (104) asymmetric reflection of the α-FAPbI$_3$ for different lattice mismatches with the substrate.
Figure 8E:
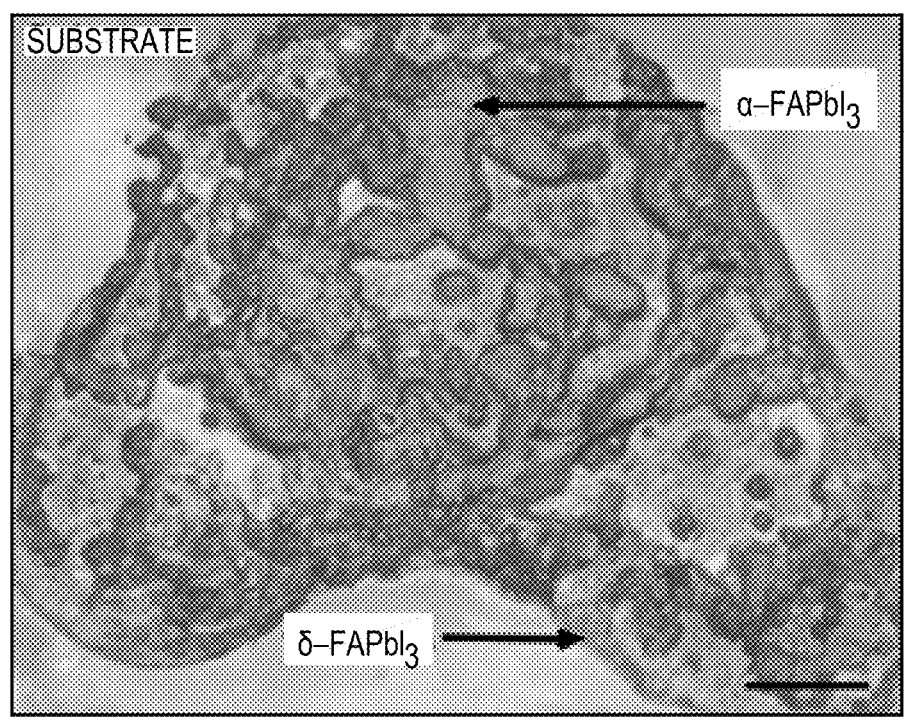
FIG. 8e shows an optical image of FAPbI$_3$ grown on a MAPbCl2.00Br1.00 substrate.

When x exceeds 1.50, the strain energy dramatically increases, and epitaxial growth becomes less thermodynamically favorable. α-FAPbI$_3$ then randomly crystalizes on the substrate (FIG. 8e). Peak broadening of the epitaxial α-FAPbI$_3$ is induced by the epitaxial strain and reduction in film thickness rather than the strain-induced dislocations or strain relaxation. FIG. 1d shows the reciprocal space mapping (RSM) of strain-free as well as strained α-FAPbI3 thin films with different lattice mismatch with the substrate. An increase of tetragonality of the lattice is evident as the compressive strain increases. The corresponding strain levels of the α-FAPbI$_3$ in those three cases are calculated to be 0%, −1.2% and −2.4%, respectively, based on lattice distortion (the negative sign denotes compressive strain).

Figure 1E:
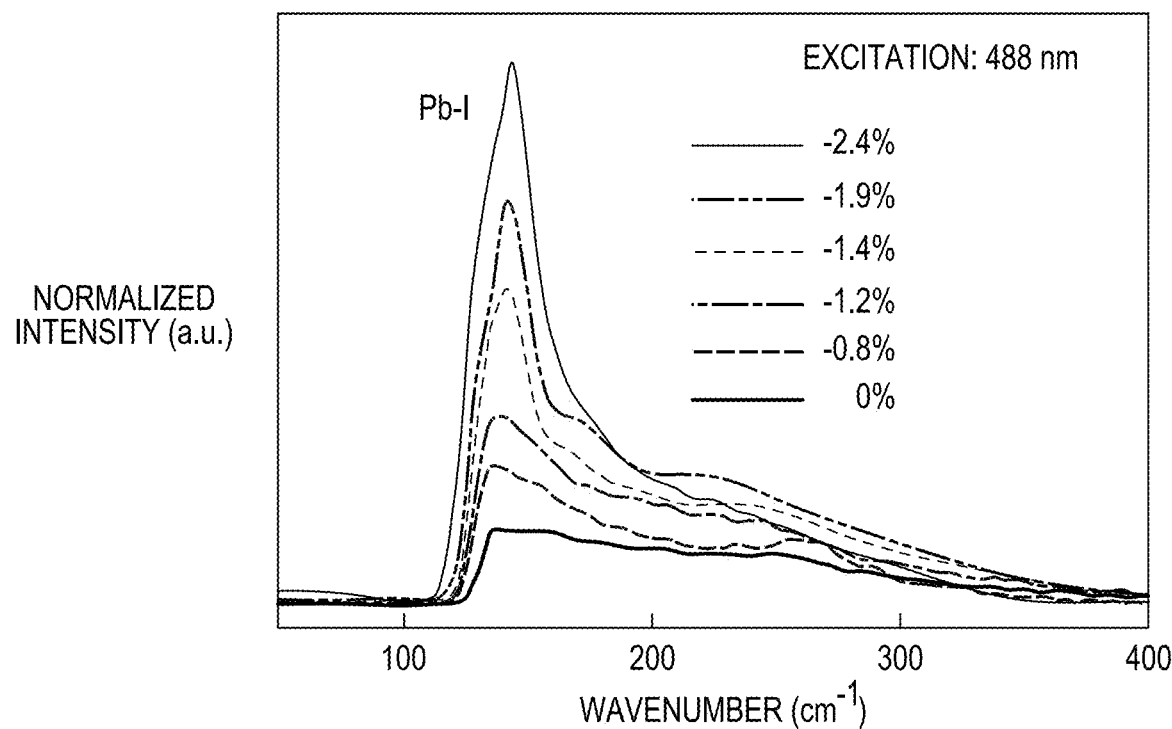
FIG. 1e shows confocal Raman spectra of the epitaxial layer at different strains.
Figure 1F:
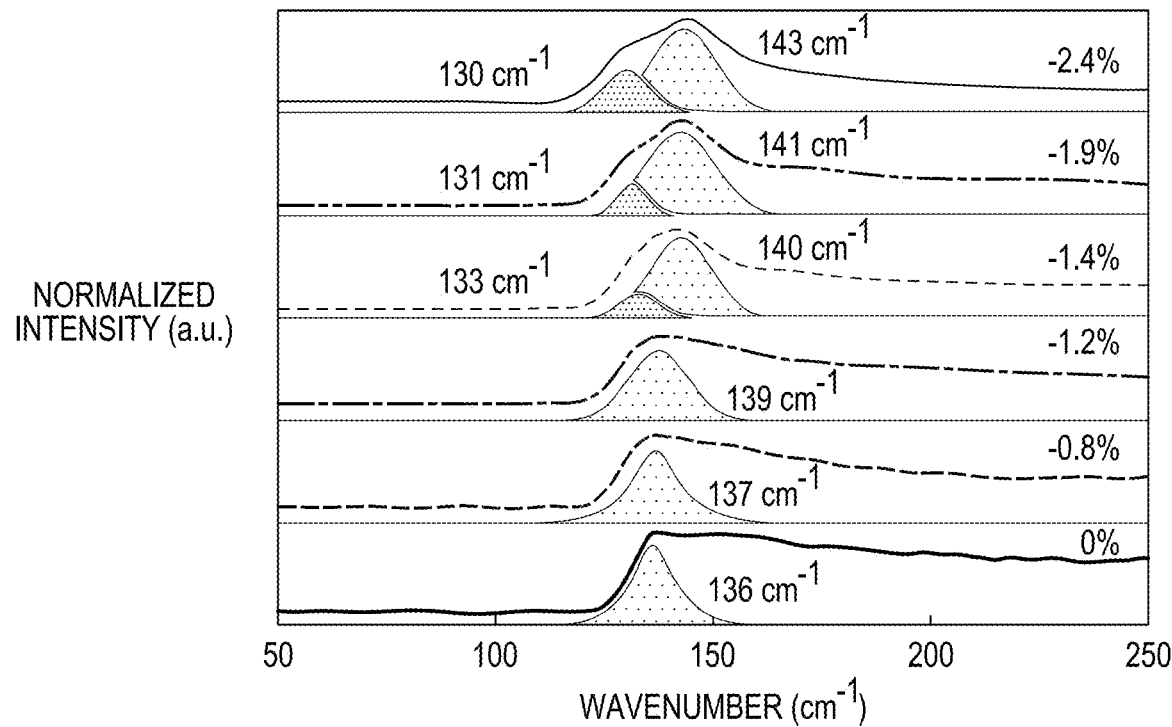
FIG. 1f shows a fitting analysis of the Raman peaks in the confocal Raman spectra.

The structure of α-FAPbI$_3$ at different strain (0%--2.4%, on different substrates) is also studied by Raman spectroscopy (FIG. 1e). The peak at around 136 cm$^{-1}$ in FIG. 1d, originated from the stretching of the Pb—I bond[21], increases in intensity and broadens in width as the strain increases. The cubic structure of strain-free α-FAPbI$_3$ is less Raman-active, and the detectable signal is usually broad and weak. When in-plane compressive strain increases, the inorganic framework gradually gains tetragonality and produces a stronger Raman signal with a well-distinguishable shape. What is more interesting is that at ~−1.4% strain, the peak at 136 cm$^{-1}$ starts to split into two: a main peak at ~140 cm$^{-1}$ and a shoulder at ~133 cm$^{-1}$ (FIG. 1f). When the strain is further increased to −2.4%, these two peaks shift to 143 cm$^{-1}$ and 130 cm$^{-1}$, respectively. We attribute the blueshift of the main peak to the compression of the in-plane Pb—I bond, and the redshift of the shoulder peak to the stretching of the out-of-plane Pb—I bond.

Figure 2A:
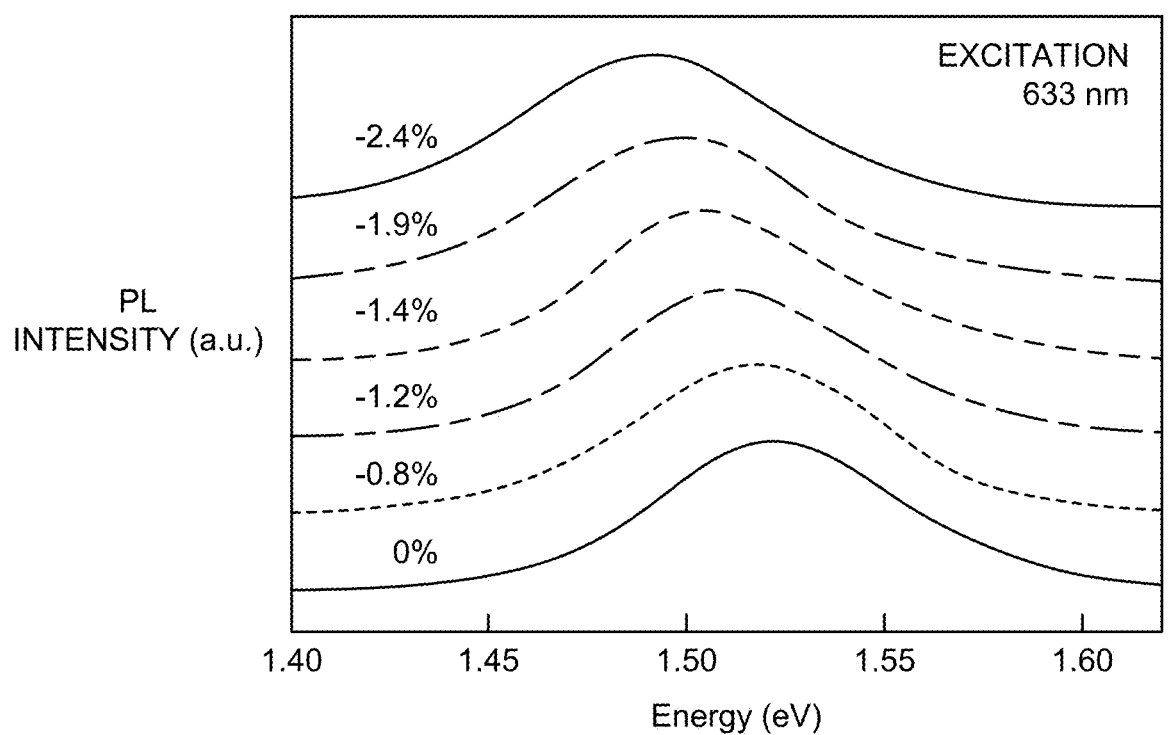
FIG. 2a shows the photoluminescence spectra of α-FAPbI$_3$ at different strains.
Figure 9B:
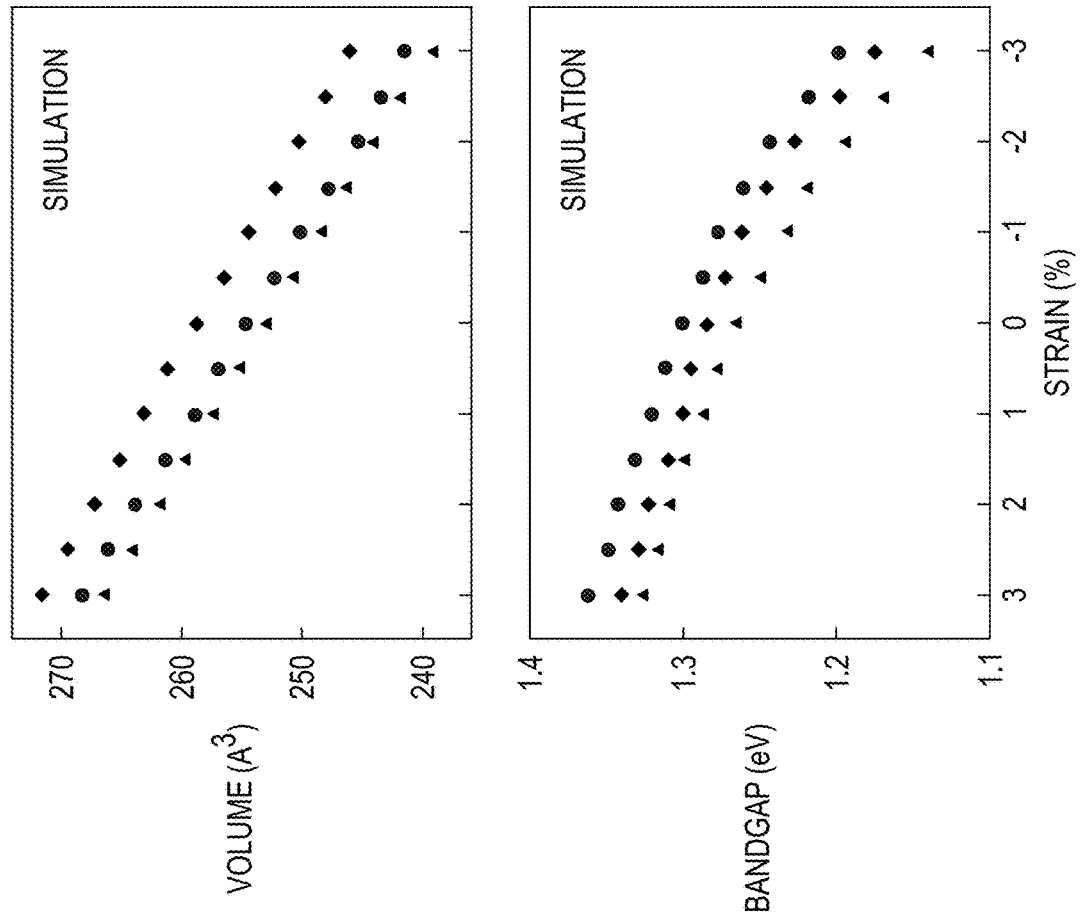
FIG. 9 shows the evolution of lattice volume and bandgap as a function of strain for three α-FAPbI$_3$ lattices with different FA+ organic cation orientations.
Figure 9A:
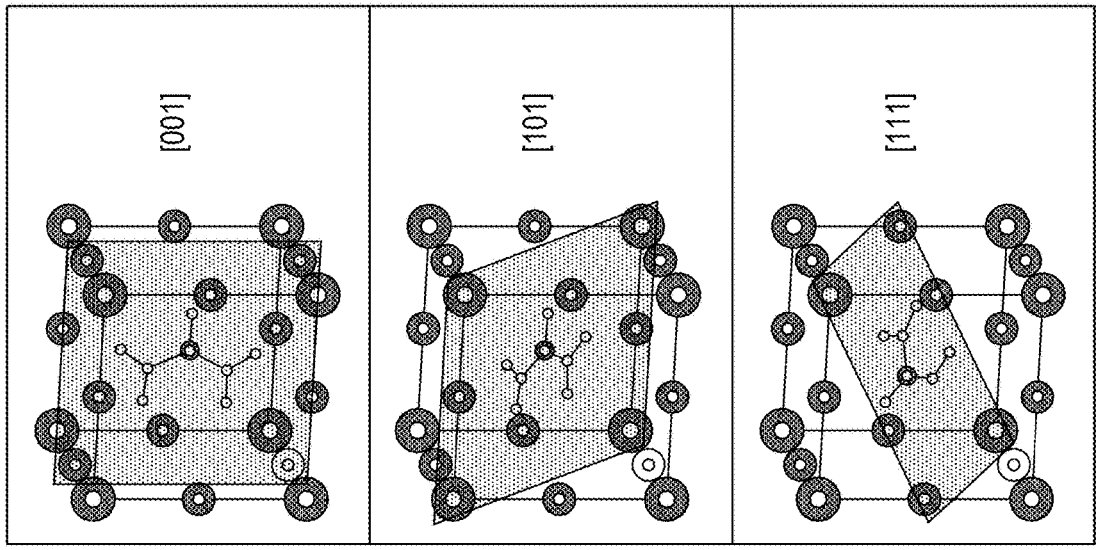
Figure 10A:
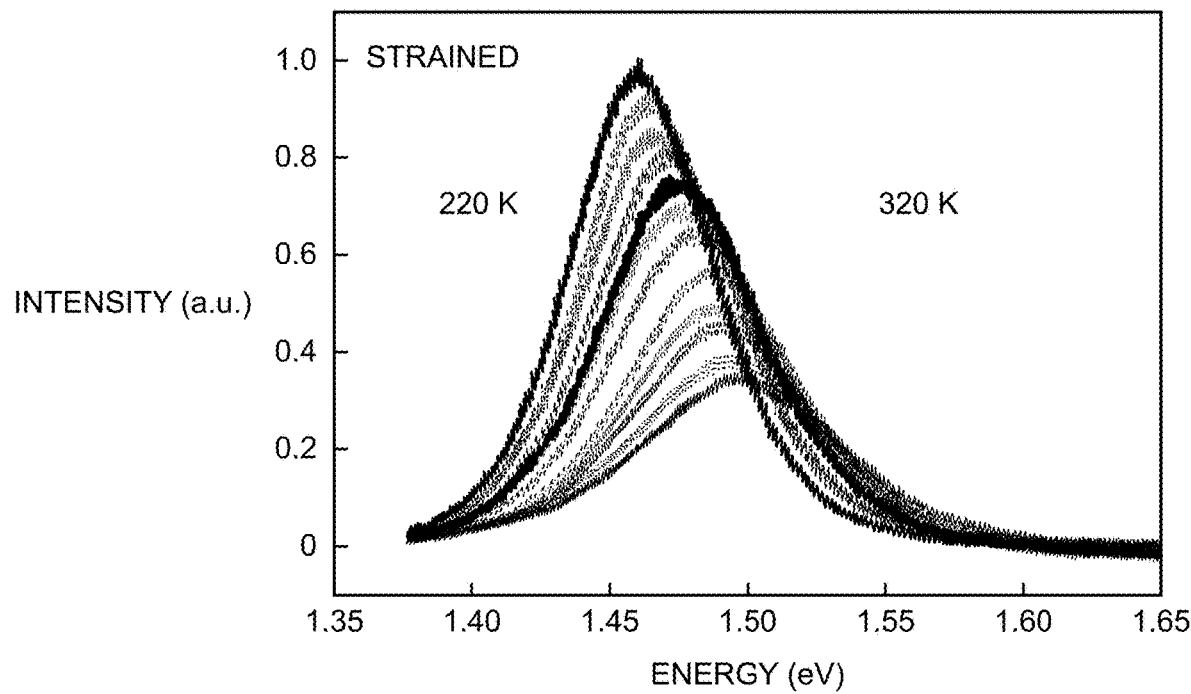
FIG. 10a shows the temperature-dependent photoluminescence of strained α-FAPbI$_3$ before normalization.
Figure 10B:
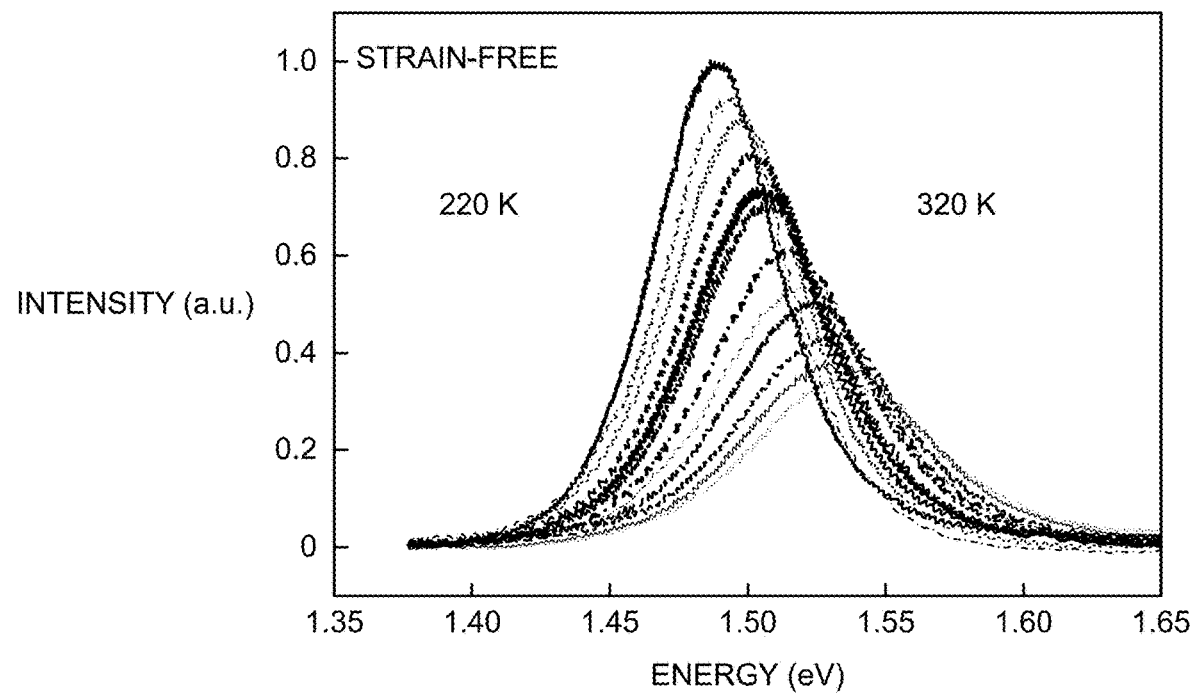
FIG. 10b shows the temperature-dependent photoluminescence of strain-free α-FAPbI$_3$ before normalization.
Figure 10C:
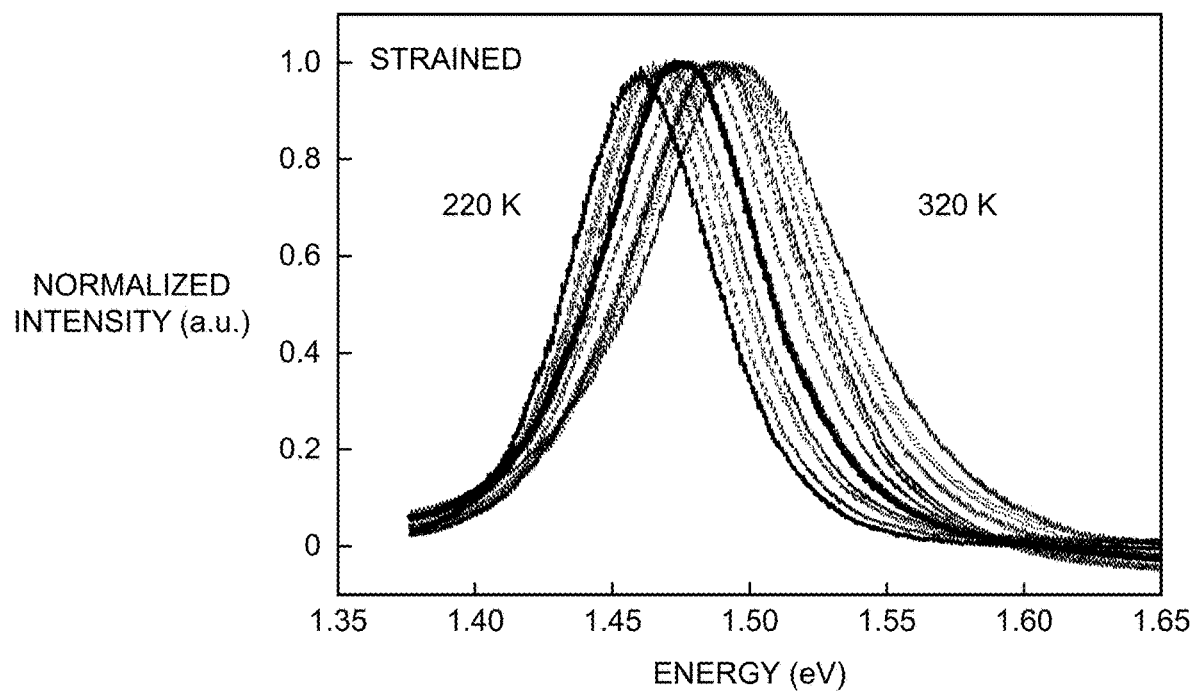
FIG. 10c shows the temperature dependent photoluminescence of strained α-FAPbI$_3$ after normalization.
Figure 10D:
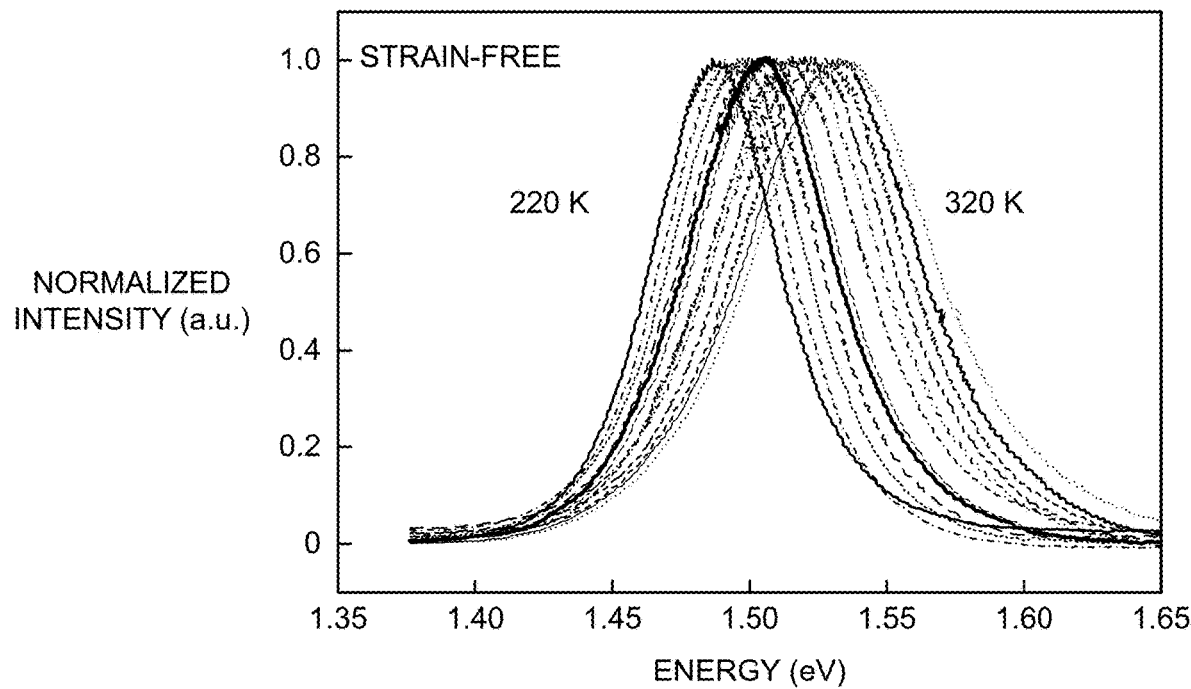
FIG. 10d shows the temperature dependent photoluminescence of strain-freeα-FAPbI$_3$ after normalization.
Figure 10E:
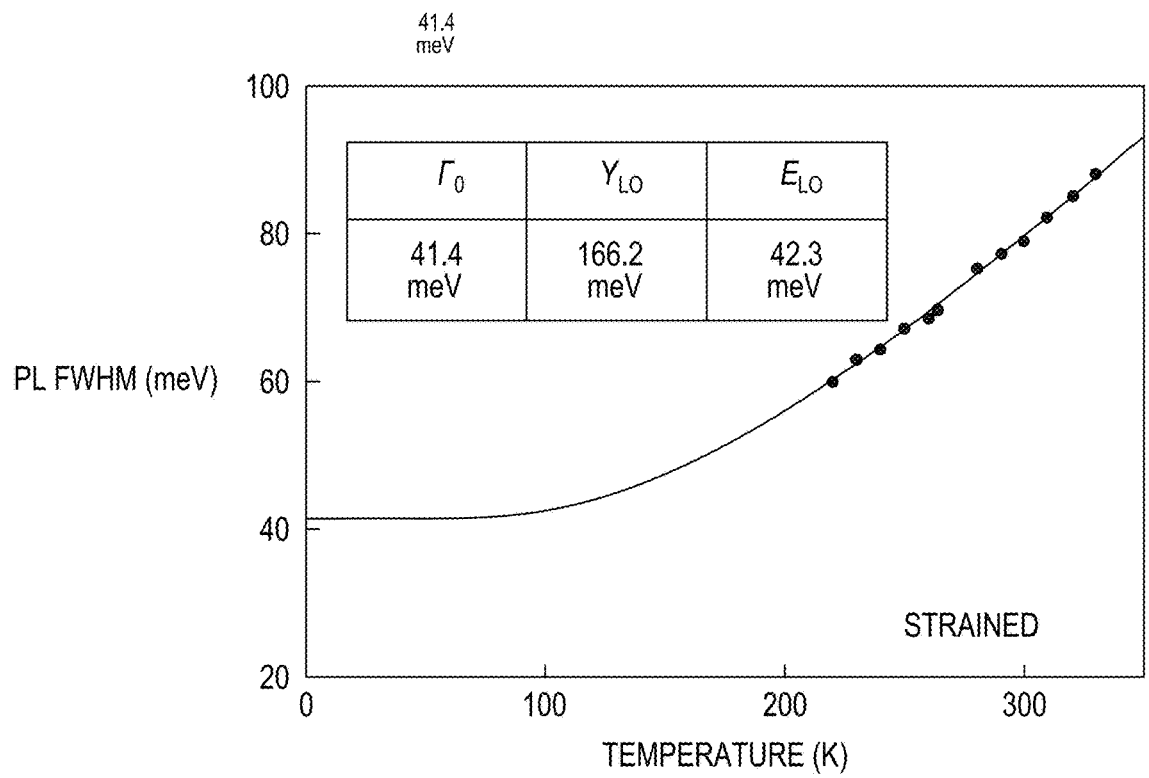
FIG. 10e shows the temperature dependent photoluminescence (PL) FWHM of strained α-FAPbI$_3$ with fitting.
Figure 10F:
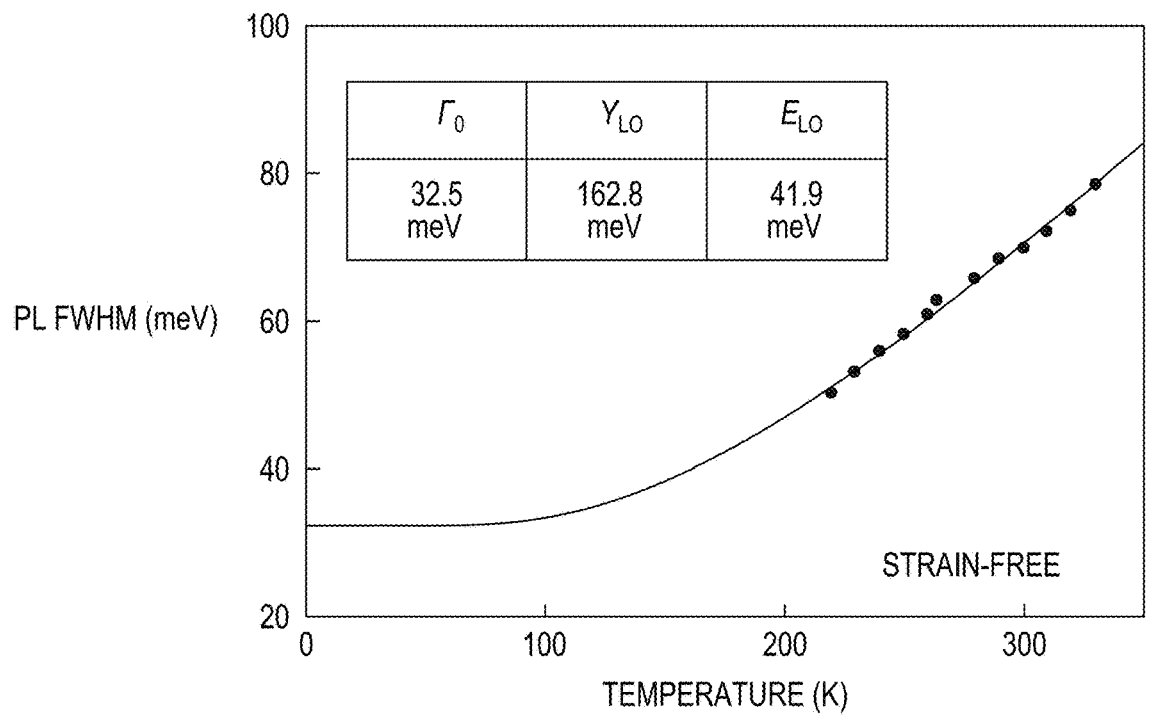
FIG. 10f shows the temperature dependent photoluminescence (PL) FWHM of strain-freeα-FAPbI$_3$ with fitting.

Photoluminescence (PL) spectra (FIG. 2a) reveal changes in the bandgap of a sub-100 nm epitaxial α-FAPbI$_3$ thin films under different strain (0%--2.4%, on different substrates). The PL peak of α-FAPbI$_3$ gradually shifts from ~1.523 eV at 0% strain to ~1.488 eV at −2.4% strain, corresponding to a ~35 meV reduction in the bandgap. We exclude the possible contributions to this PL redshift from thickness-dependent bandgap, reabsorption, or halide migration. The bandgap change is consistent with the first-principles calculations and absorption measurements. FIG. 9 shows the evolution of lattice volume and bandgap as a function of strain for three α-FAPbI$_3$ lattices with different FA$^+$ organic cation orientations. For the bandgap calculations, spin-orbit coupling is incorporated due to the heavy element Pb, and the hybrid functionals within Heyd-Scuseria-Ernzerhof (HSE) formalism with 25% Hartree-Fock (HF) exchange are employed. The PL peak in FIG. 2a also broadens with increasing strain, which is not due to the possible charge transfer between the epitaxial α-FAPbI$_3$ and the substrate because of the straddling band alignment with a prohibited carrier transfer direction and a large energy barrier. Temperature-dependent PL studies suggest that the emission peak broadening originates from the reduced crystalline quality and the enhanced carrier-phonon coupling under the strain due to the fact that the strained α-FAPbI$_3$ has a higher $\Gamma_0$ and $\Gamma_{LO}$ than that of strain-free α-FAPbI$_3$ (FIG. 10).

Figure 2B:
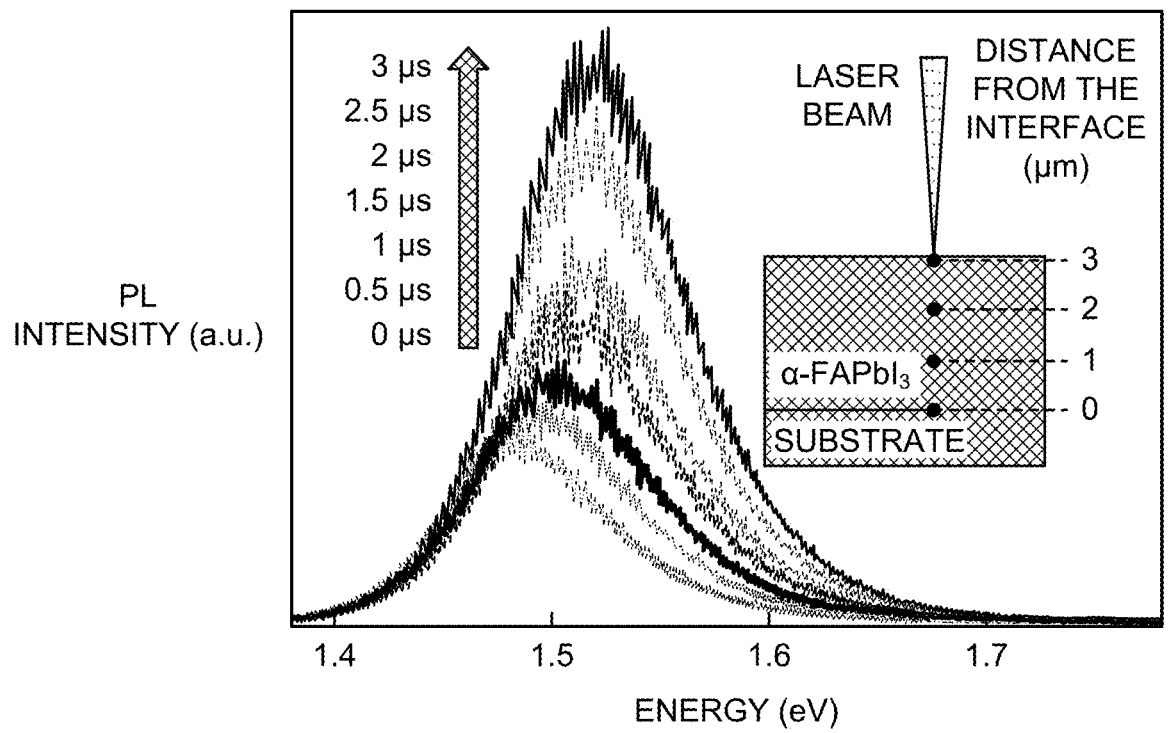
FIG. 2b shows focal point dependent confocal PL spectra of a 3 μm thick film.
Figure 2C:
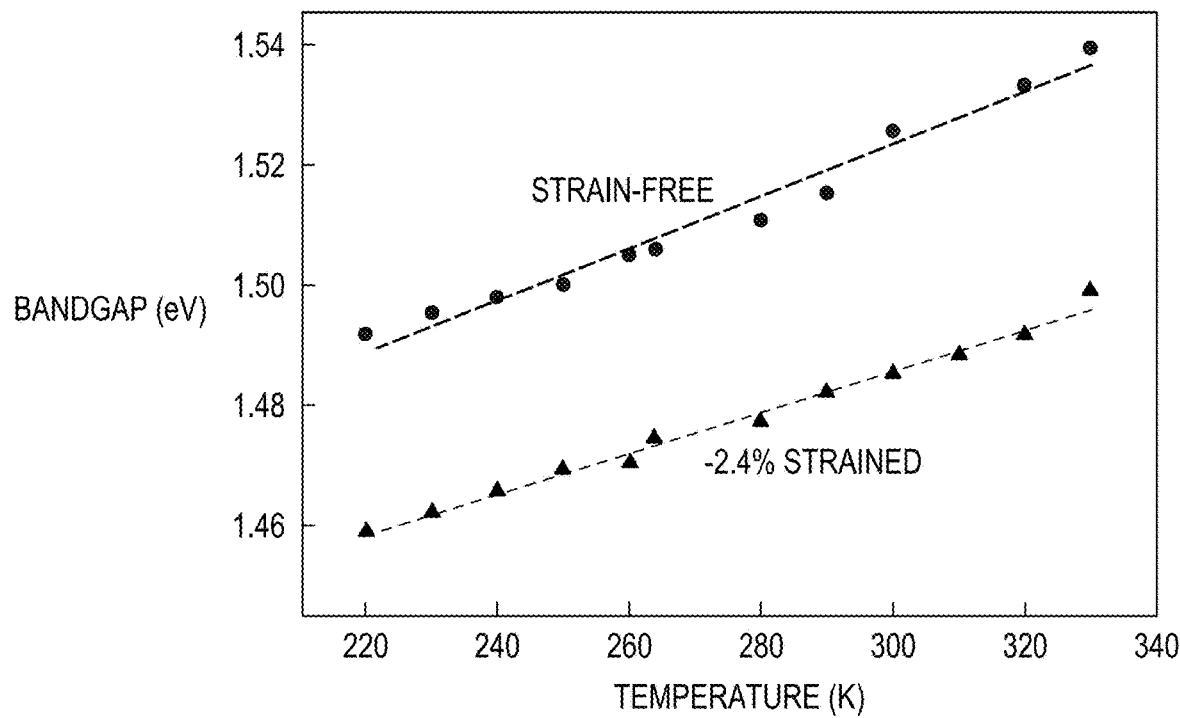
FIG. 2c shows the temperature-dependent PL spectra of a strained and a strain-free sample.
Figure 11:
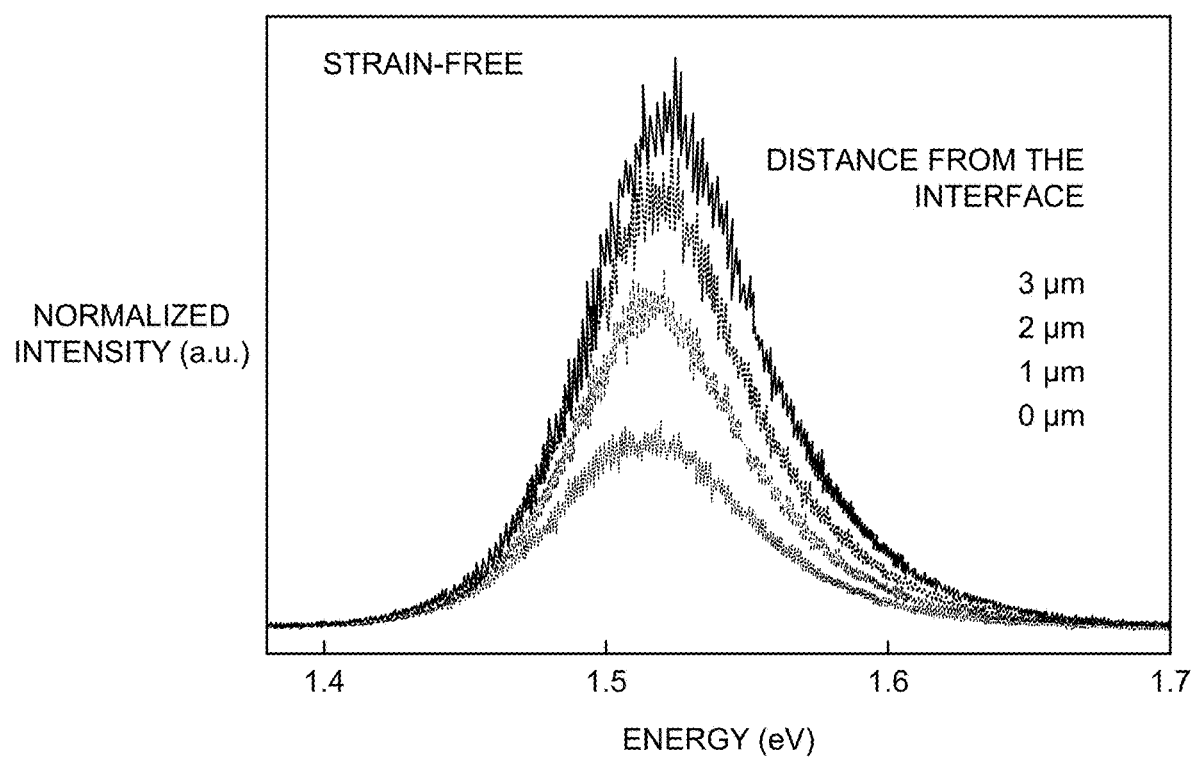
FIG. 11 shows the PL redshift in a strain-free α-FAPbI$_3$ film on a MAPbCl$_{1.50}$Br$_{1.50}$ substrate.
Figure 12B:
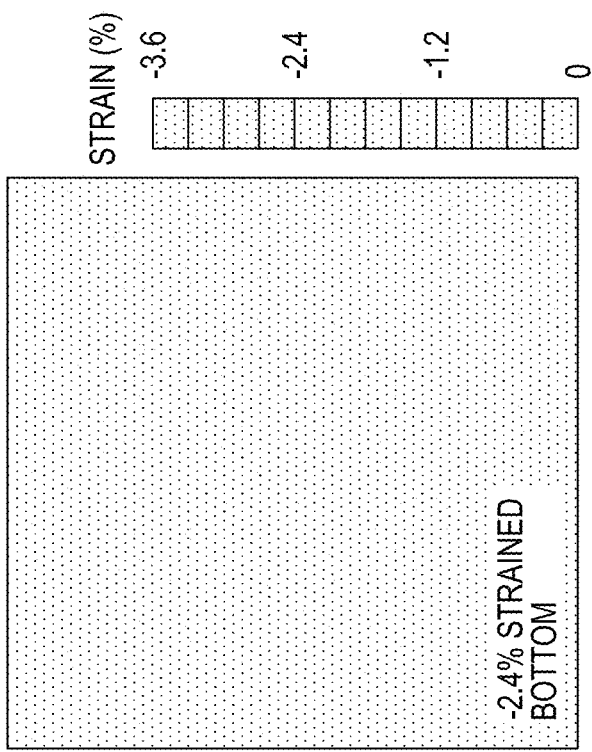
FIG. 12b shows the planar strain distribution of the α-FAPbI$_3$ with −2.4% strain.
Figure 12D:
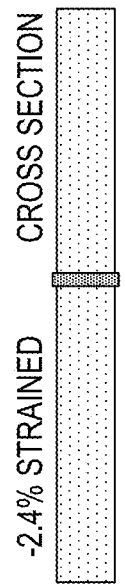
FIG. 12d shows the vertical strain distribution of the α-FAPbI$_3$ with −2.4% strain.
Figure 12A:
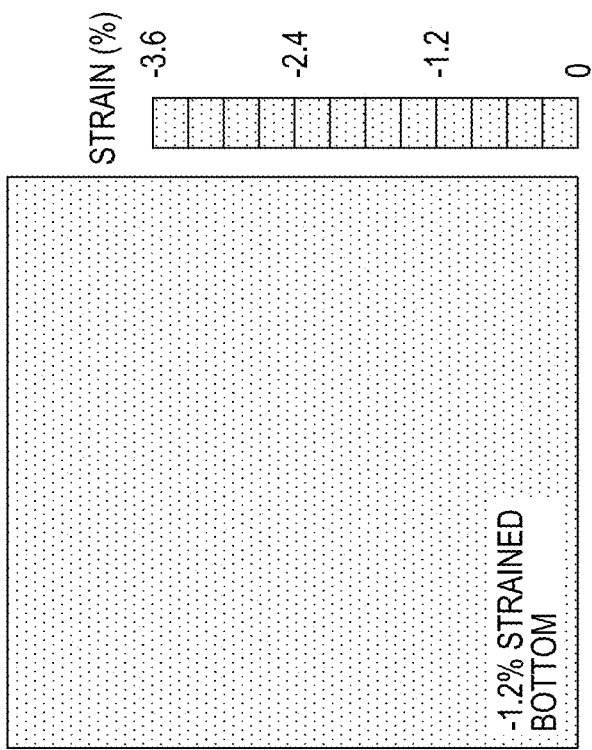
FIG. 12a shows the planar strain distribution of the α-FAPbI$_3$ with −1.2% strain.
Figure 12C:
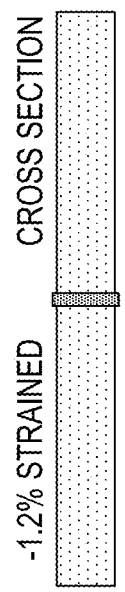
FIG. 12c shows the vertical strain distribution of the α-FAPbI$_3$ with −1.2% strain.
Figure 12E:
FIG. 12e shows the thickness-dependent strain distribution of the α-FAPbI$_3$ with −1.2% strain.
Figure 12F:
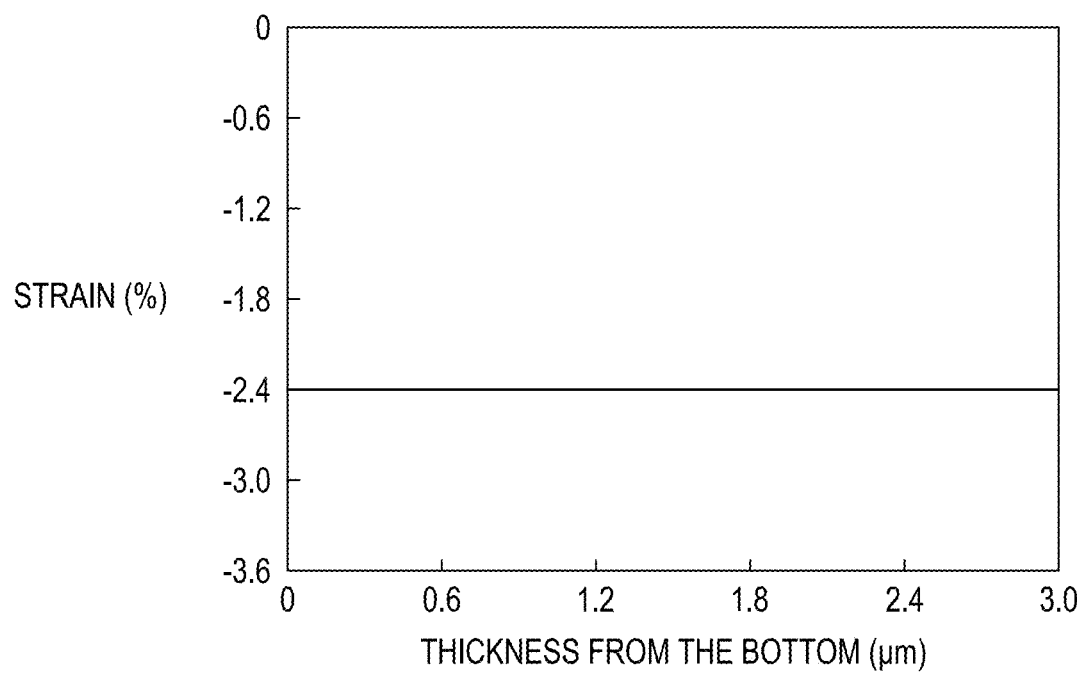
FIG. 12f shows the thickness-dependent strain distribution of the α-FAPbI$_3$ with −2.4% strain.
Figure 13A:
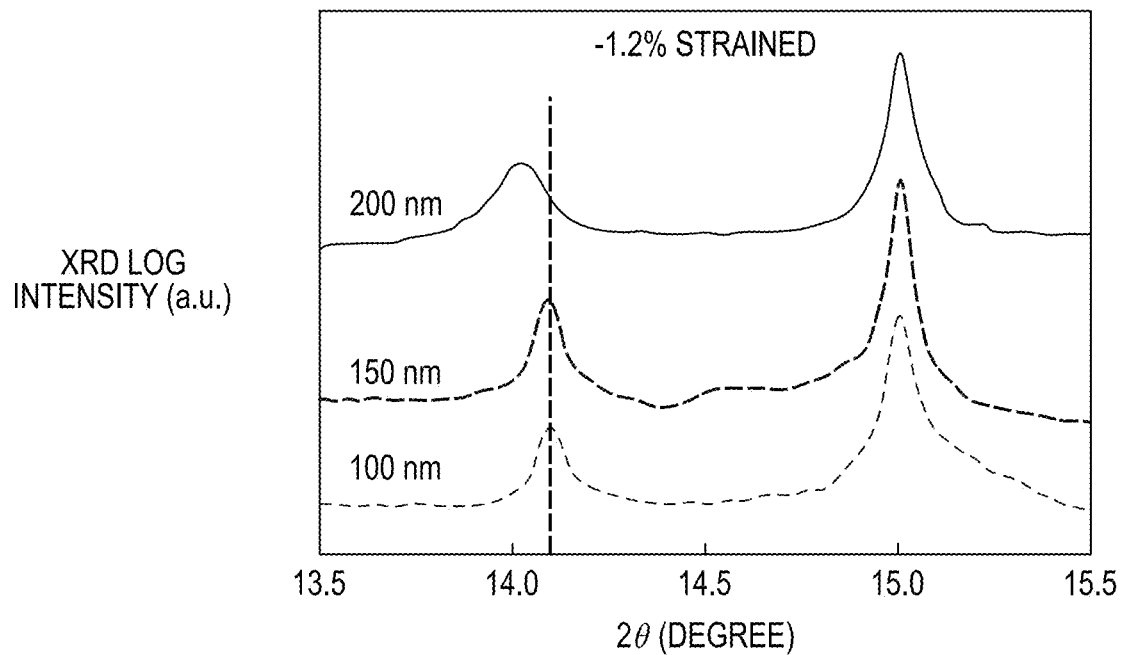
FIG. 13a shows thickness-dependent in-plane x-ray diffraction (XRD) of −1.2% strainedα-FAPbI$_3$ thin films.
Figure 13B:
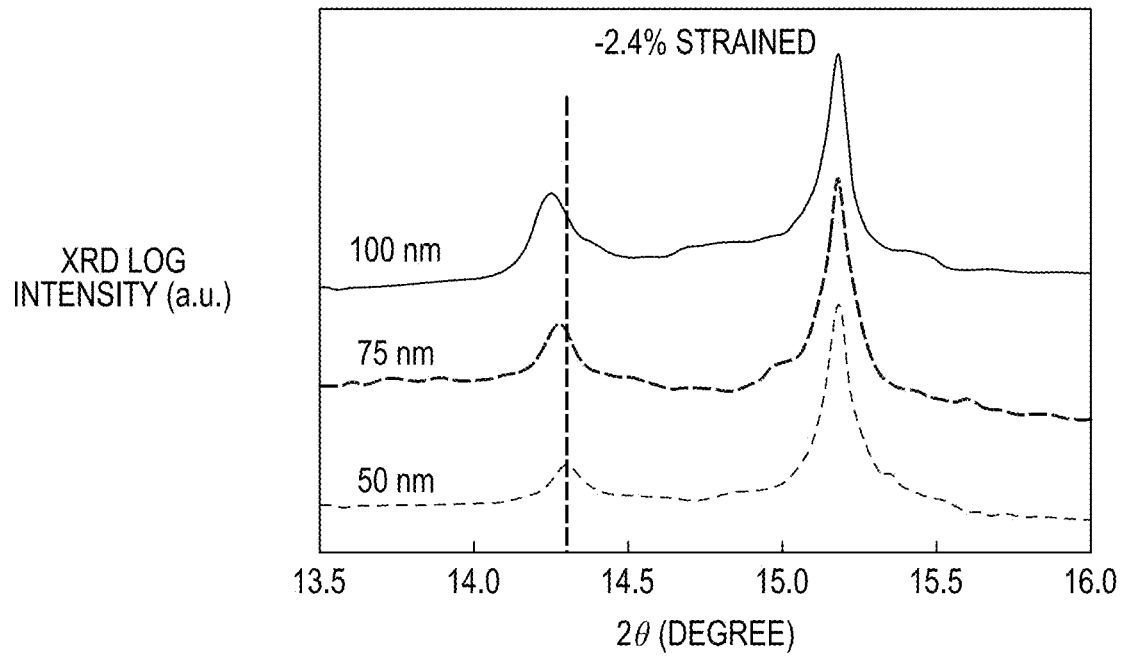
FIG. 13b shows thickness-dependent in-plane XRD of −2.4% strained α-FAPbI$_3$ thin films.
Figure 13C:
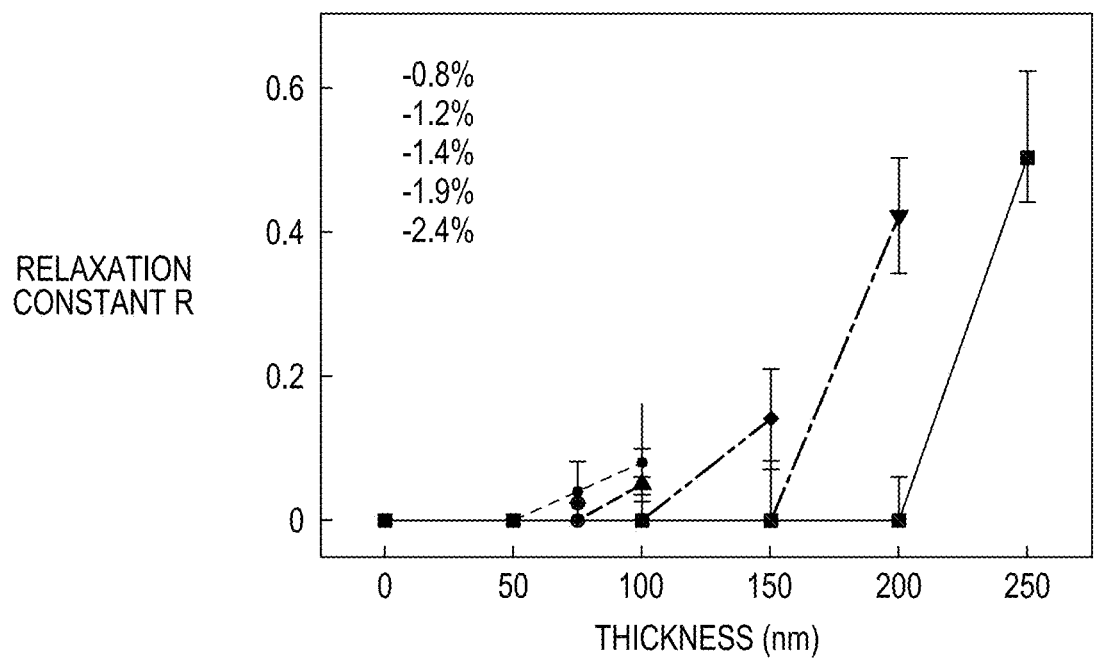
FIG. 13c shows the thickness-dependent relaxation constant R of the epitaxialα-FAPbI$_3$ thin films with different strains.
Figure 13D:
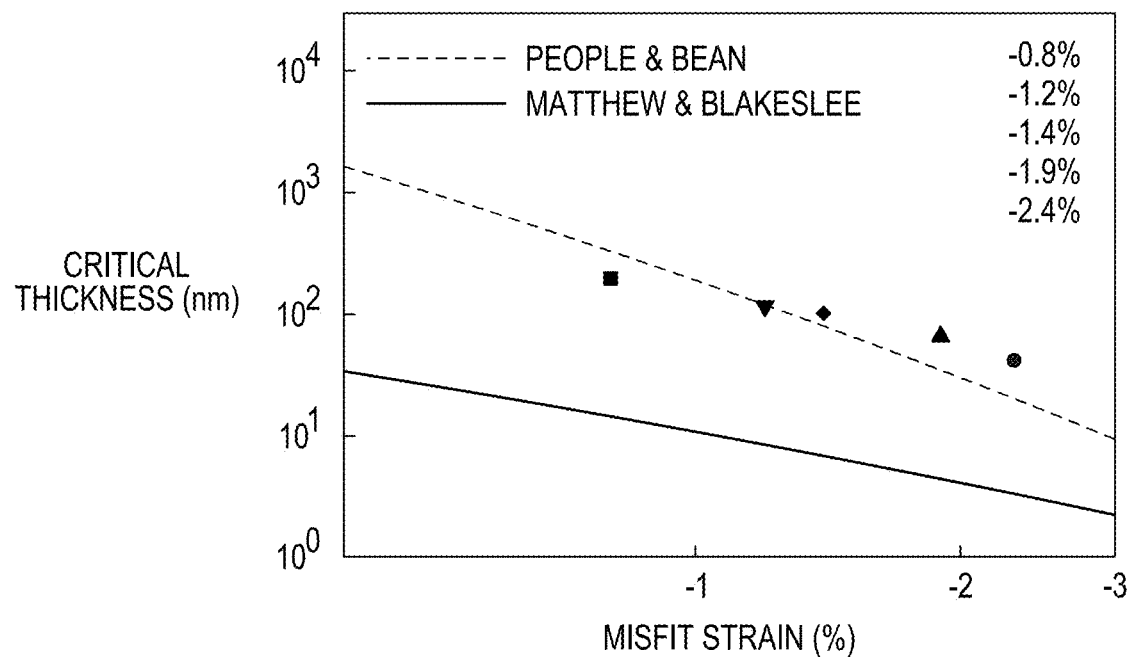
FIG. 13d shows the fitting of the experimental critical thicknesses with the People and Bean and the Matthew and Blakeslee models.

Additionally, we studied confocal PL spectra at different locations in a ~3 μm α-FAPbI$_3$ film on MAPbCl$_{1.50}$Br$_{1.50}$ (FIG. 2b). The PL peak shifts from ~1.479 eV when the laser is focused at the interface where the local strain is high, to ~1.523 eV at 3 μm from the interface where the strain is relaxed. As a control, the PL redshift in a strain-free sample is less obvious (from ~1.516 eV to ~1.523 eV, FIG. 11), which is attributed to reabsorption. In the strained sample, we exclude elastic relaxation although halide perovskites are much softer than conventional semiconductors. Our finite element analysis (FEA) simulation results show the elastic relaxation for a 3 μm thick α-FAPbI$_3$ thin film is negligible, only ~0.09% (FIG. 12). Thickness-dependent in-plane XRD is used to study the critical thickness at which the strain will start to be plastically relaxed (FIG. 13). The results show that the relaxation can be attributed to the plastic relaxation by forming dislocations. Temperature-dependent PL studies show the bandgap of α-FAPbI$_3$ under both 0% and −2.4% strain shows a strong temperature dependence due to the soft nature of α-FAPbI$_3$ (FIG. 2c). The strained sample bandgap is less temperature-dependent compared to the strain-free sample, because of the constraint from the substrate that has a smaller thermal expansion coefficient than that of the epitaxial layer.

Figure 2D:
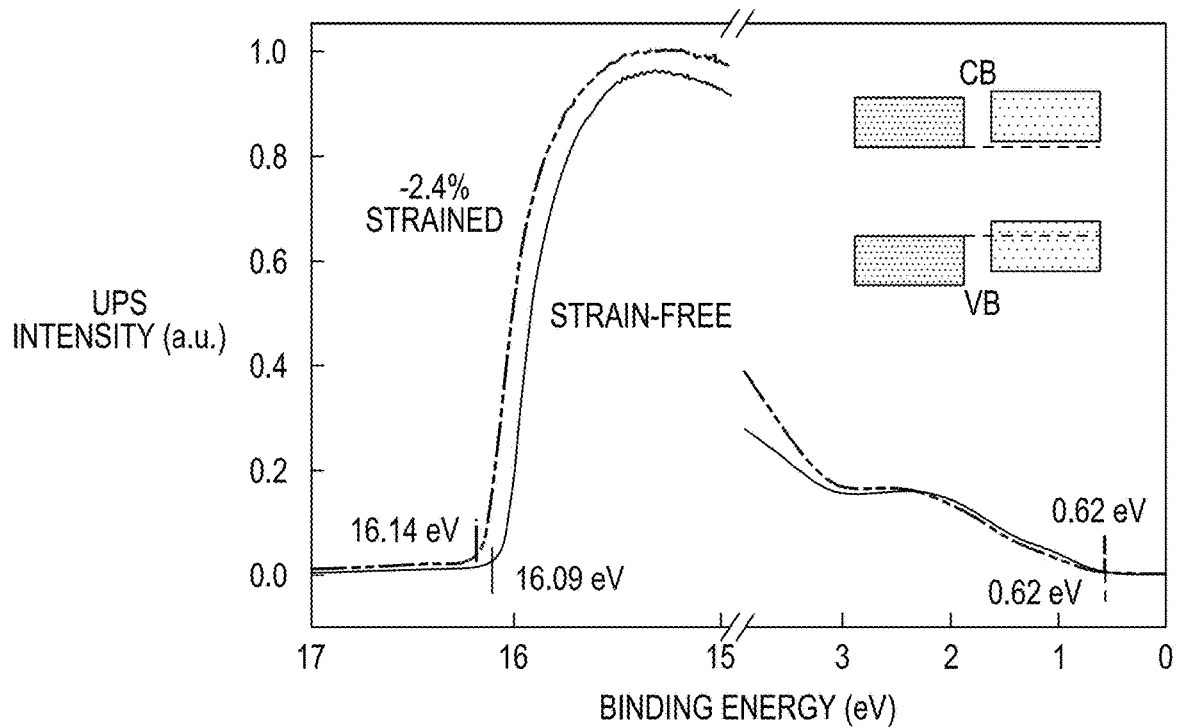
FIG. 2d shows UPS spectra of a −2.4% strained and a strain-free sample.
Figure 14A:
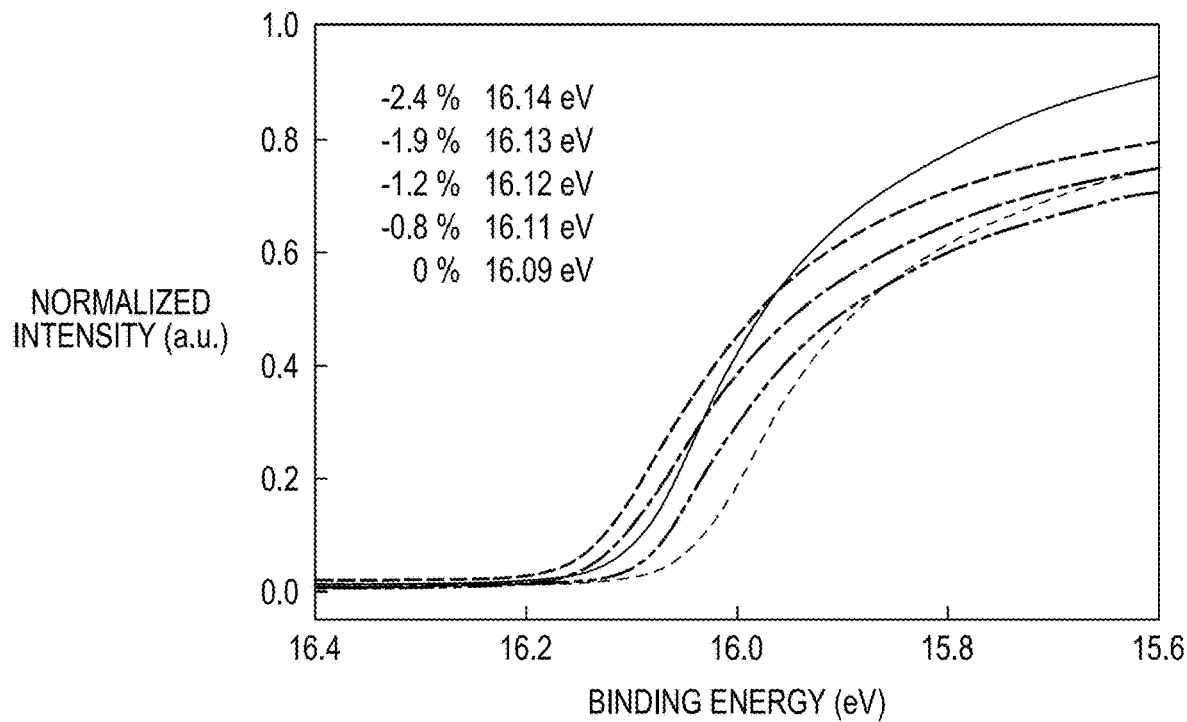
FIG. 14a shows ultraviolet photoelectron spectroscopy (UPS) spectra of α-FAPbI$_3$ under different strains, where the intersects of the curves with the baseline in the high-binding-energy region give the Fermi level position of corresponding strained α-FAPbI$_3$ films.
Figure 14B:
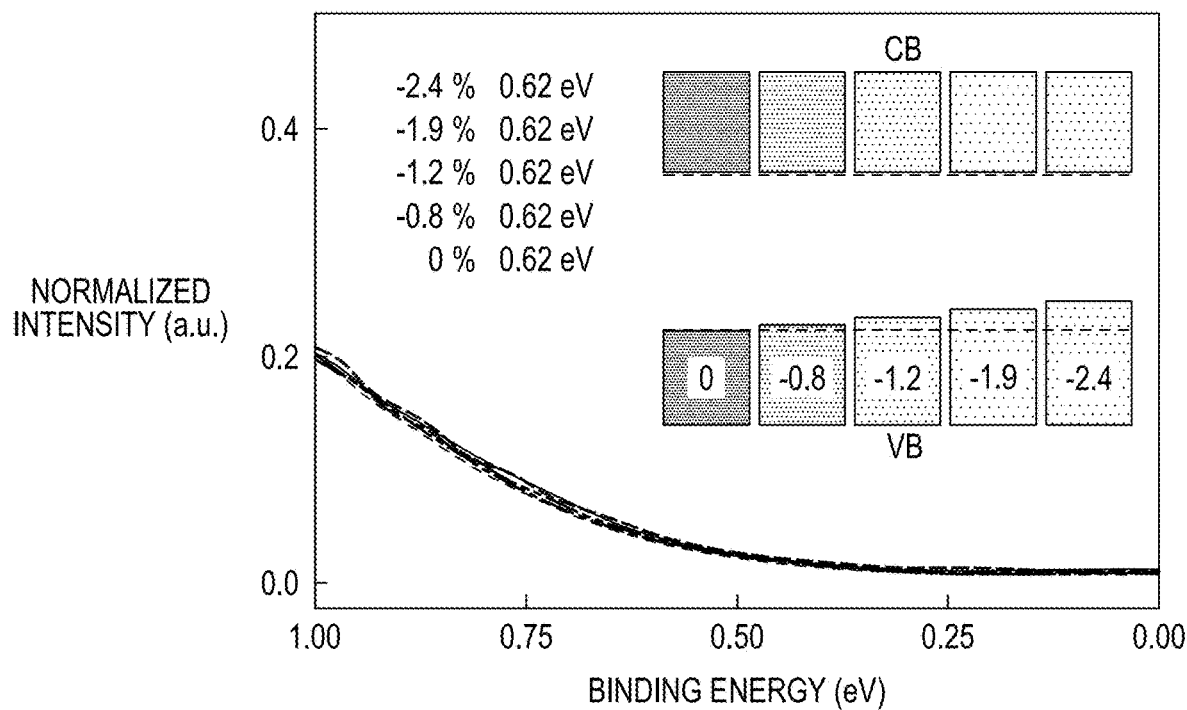
FIG. 14b shows UPS spectra of α-FAPbI$_3$ under different strains, where the intersects of the curves with the baseline in the low-binding-energy region give the energy difference between the Fermi level and the valance band maximum (VBM).
Figure 15A:
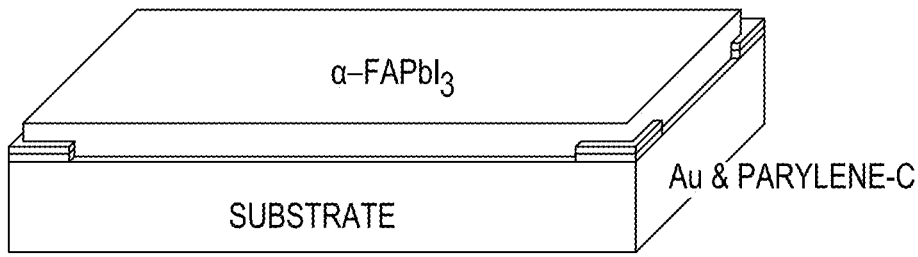
FIG. 15a shows a schematic diagram of the photodetector device, where parylene-C is used as an insulating layer to prevent the injection of carriers from the Au electrode to the substrate.
Figure 15B:
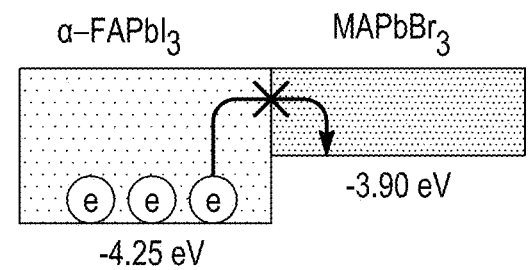
FIG. 15b shows the bandgap diagram of the heterostructure.
Figure 15B:
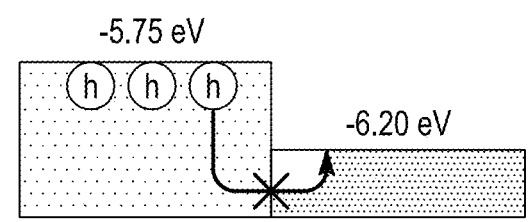
Figure 15C:
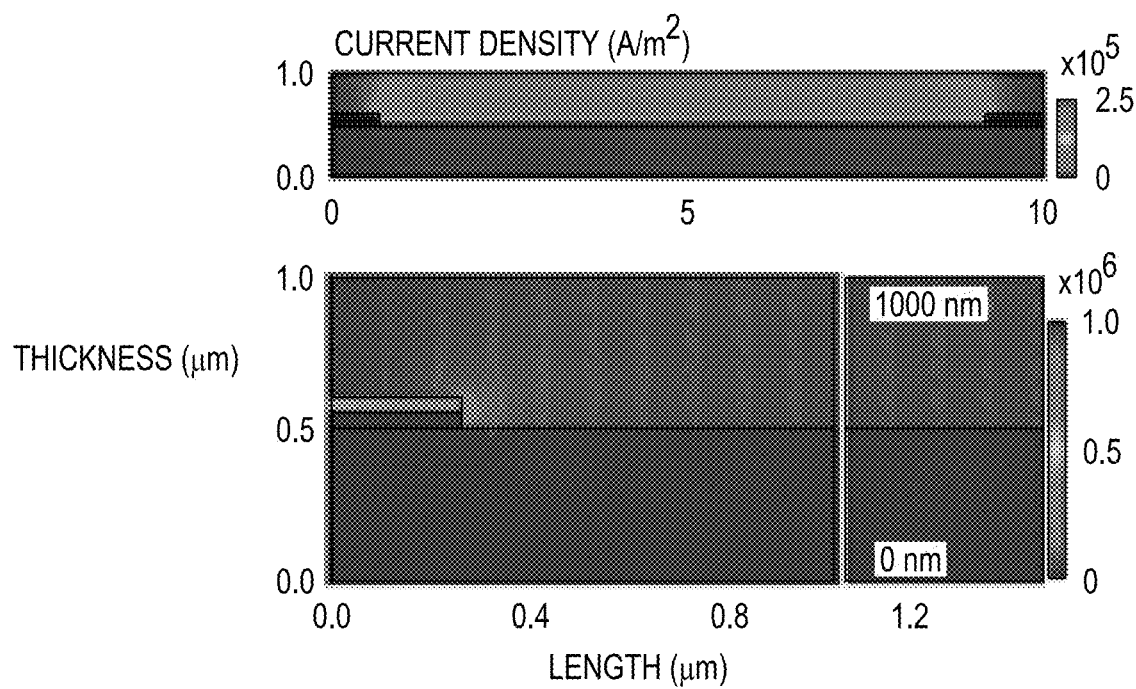
FIG. 15c shows current density distribution by FEA simulation, where the upper panel shows the current mapping where the current density in the epitaxial layer is much higher than that of the substrate and the lower panel shows the zoomed-in current distribution image around the electrode.
Figure 15D:
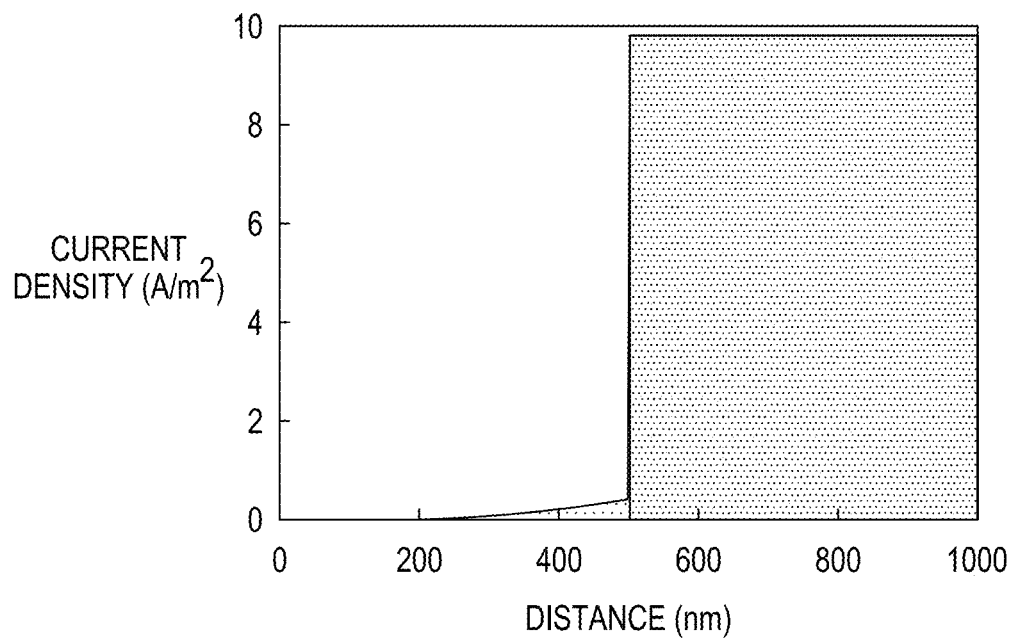
FIG. 15d shows the current density distribution along the vertical line in e where the current in the substrate takes 0.8% of the total current.
Figure 16A:
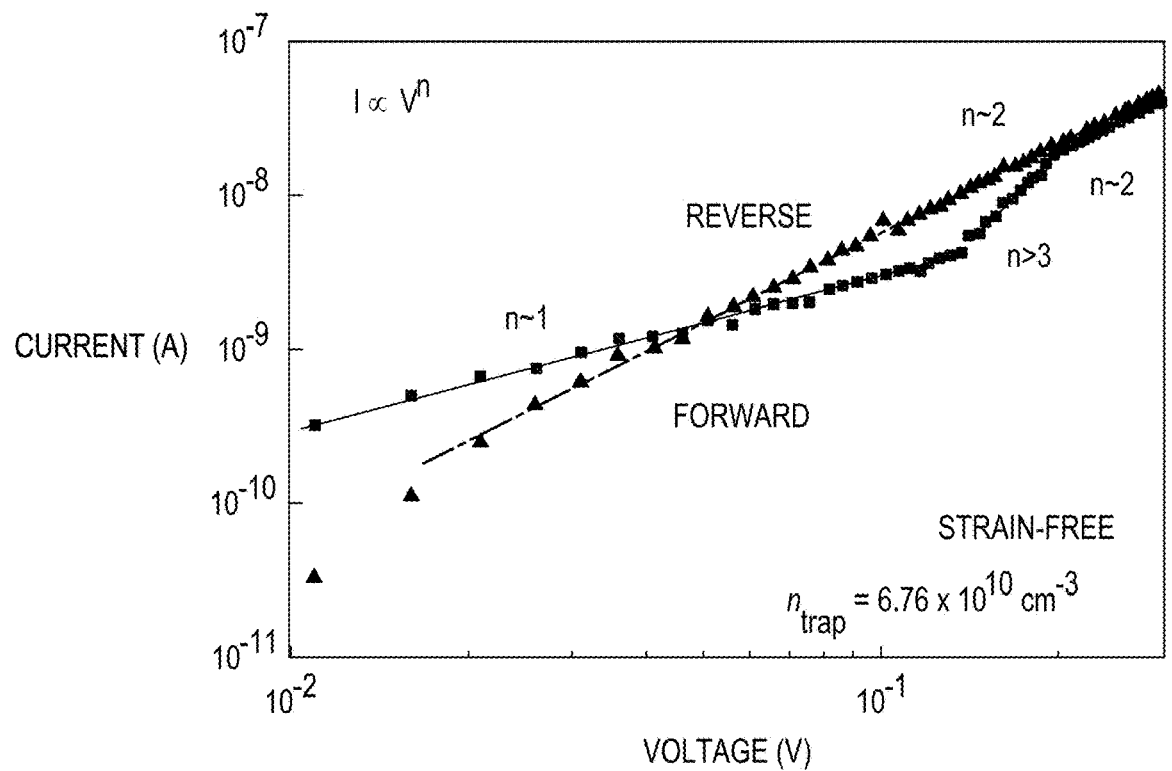
FIGS. 16a-16d shows I-V characteristic curves for the space-charge-limited-current measurement of the epitaxial α-FAPbI$_3$ film with different strains.
Figure 16B:
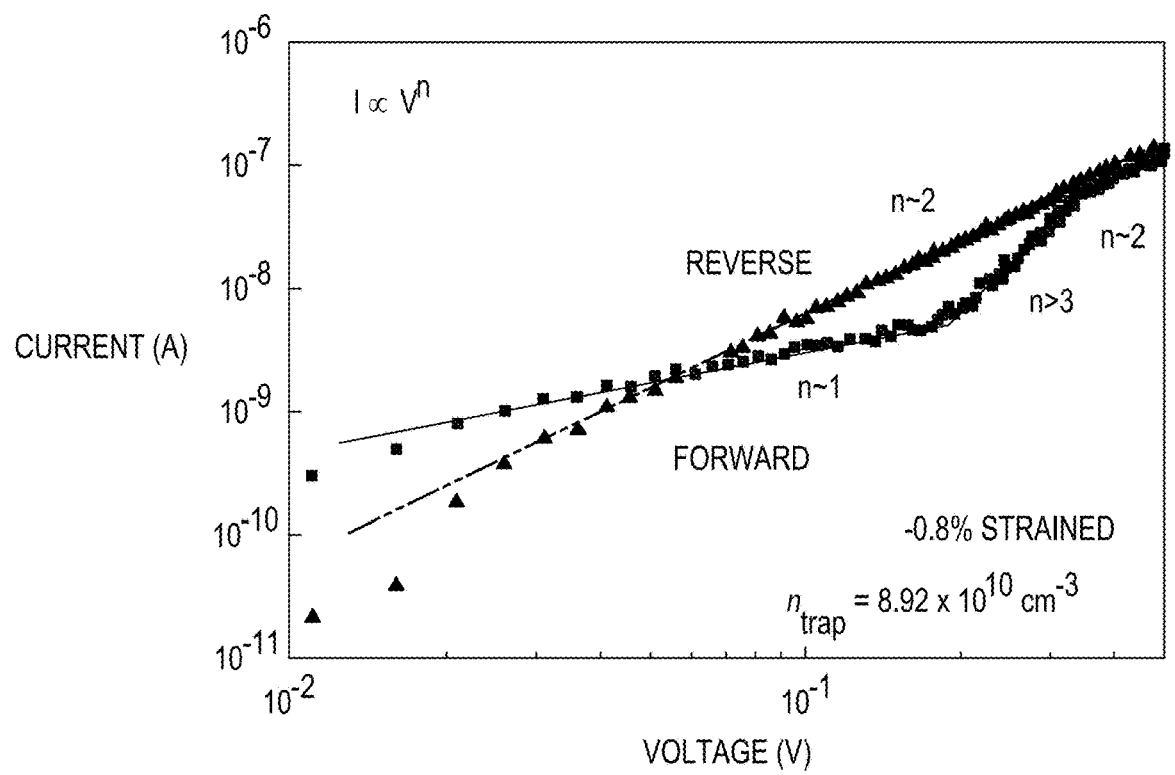
Figure 16C:
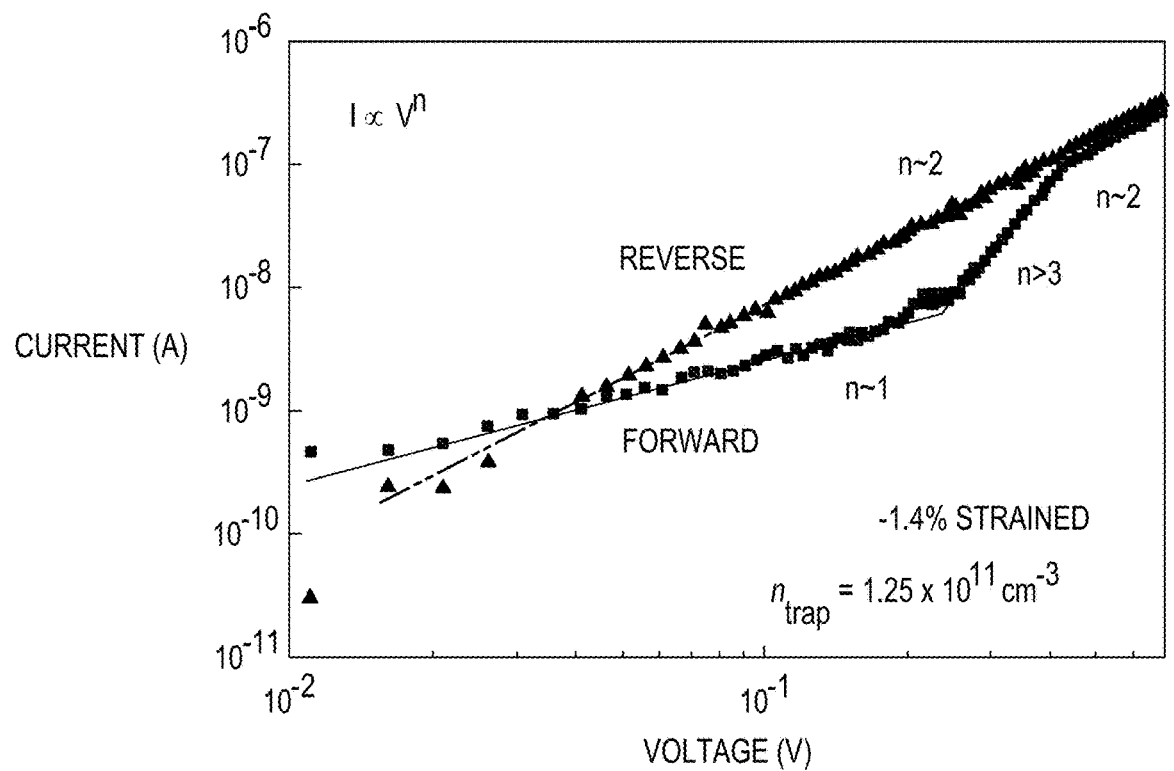
Figure 16D:
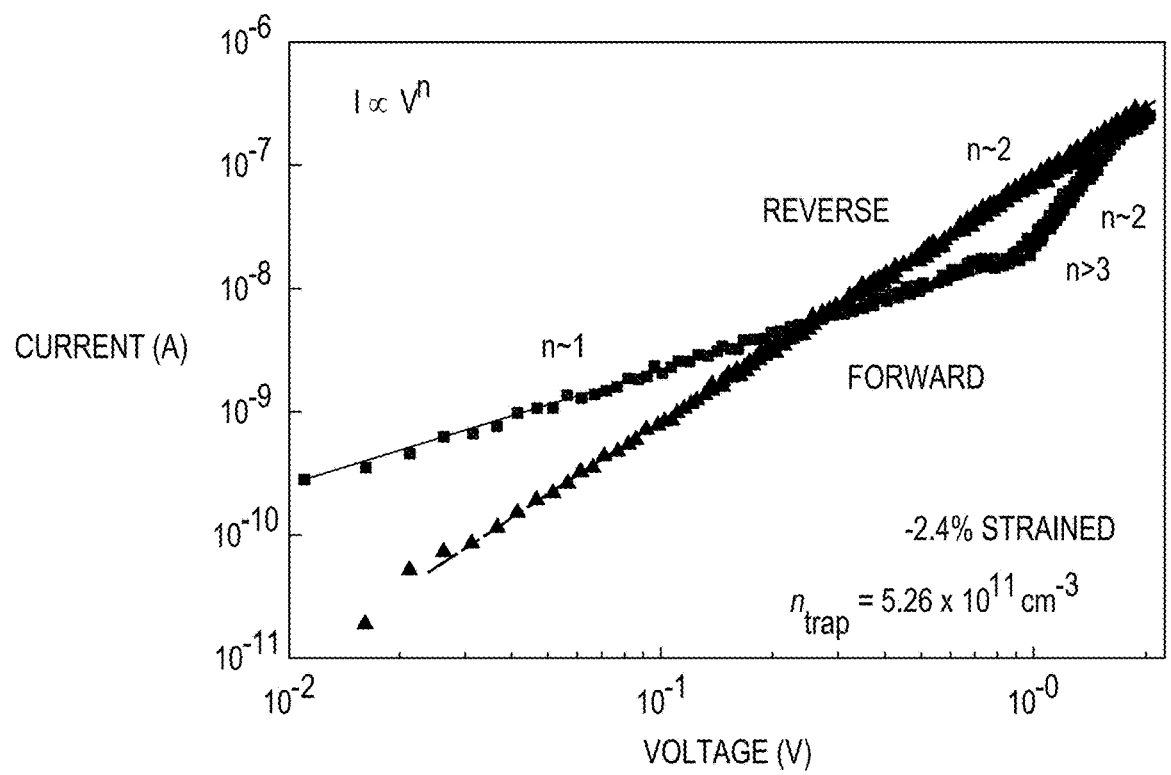

Ultraviolet photoelectron spectroscopy (UPS) reveals the band structure evolution of the α-FAPbI$_3$ under strain (FIG. 2d for 0% and −2.4% strain; FIG. 14 for other strain levels). All samples exhibit p-type behavior. The Fermi level and the valence band maximum (VBM) of the samples can be extracted from the UPS data. The results show that −2.4% strain lifts the VBM upward by ~50 meV compared to the strain-free scenario. Considering the change in the bandgap (~35 meV), the −2.4% strain pushes the conduction band minimum (CBM) position upward by ~15 meV compared to the strain-free scenario. The VBM mainly consists of Pb 6s and I 5p orbitals, and the enhanced coupling between these orbitals under compressive strain pushes the VBM upward. The CBM, which consists mostly of nonbonding localized states of Pb p orbitals, is less sensitive to the deformation of PbI$_6$ octahedrons. Therefore, the in-plane compressive strain pushes up the VBM more than the CBM.

Figure 3A:
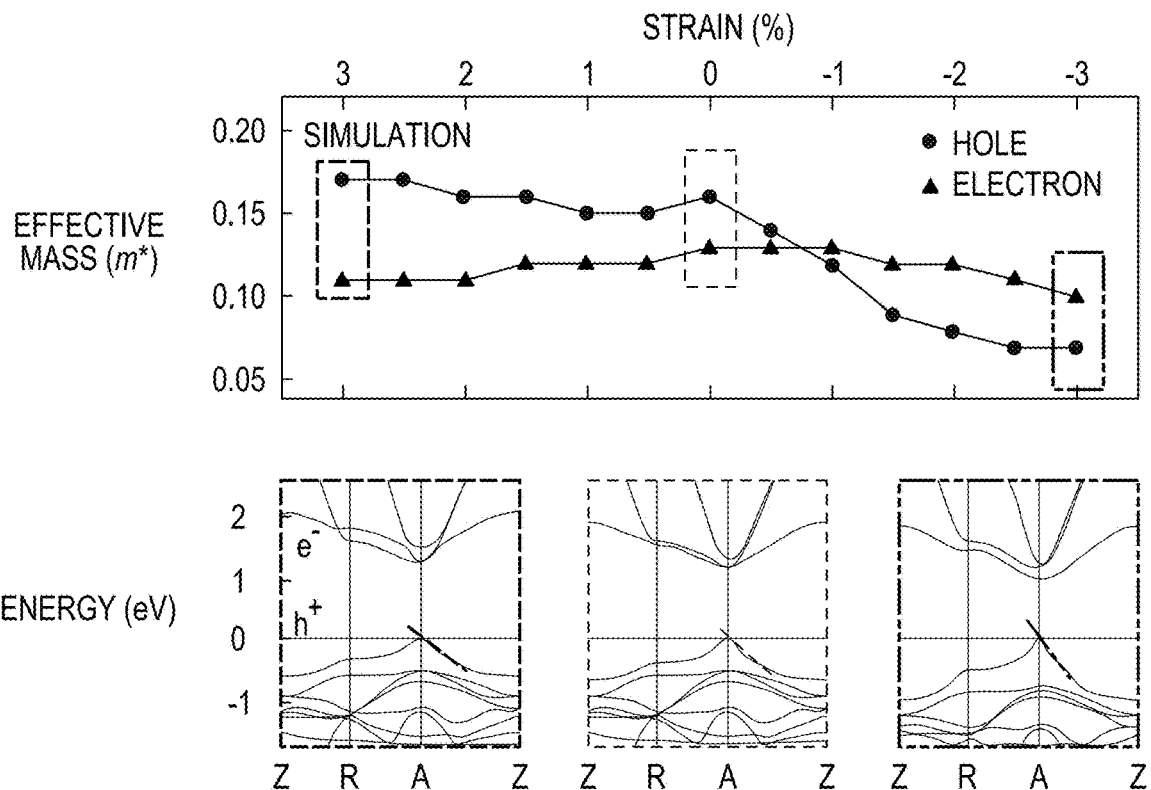
FIG. 3a shows the calculated carrier effective masses at different strains, and electronic band structures under three strain levels (3%, 0%, and −3%)

The lattice deformation can alter the electronic band structure and, therefore, the carrier dynamics. The effective mass of charge carriers can be assessed by the band curvature extracted from first-principles calculations. FIG. 3a shows calculated results of electron effective mass, m*$_e$, and hole effective mass, m*$_h$ (top panel) and three typical electronic band structures (bottom panels) under different strain. The E-k dispersion of the conduction band remains relatively unaltered, and m*$_e$ only shows a slight variation from 3% to −3% strain. On the other hand, compressive strain can modulate the E-k dispersion of the valence band and reduce m*$_h$ considerably.

Figure 3B:
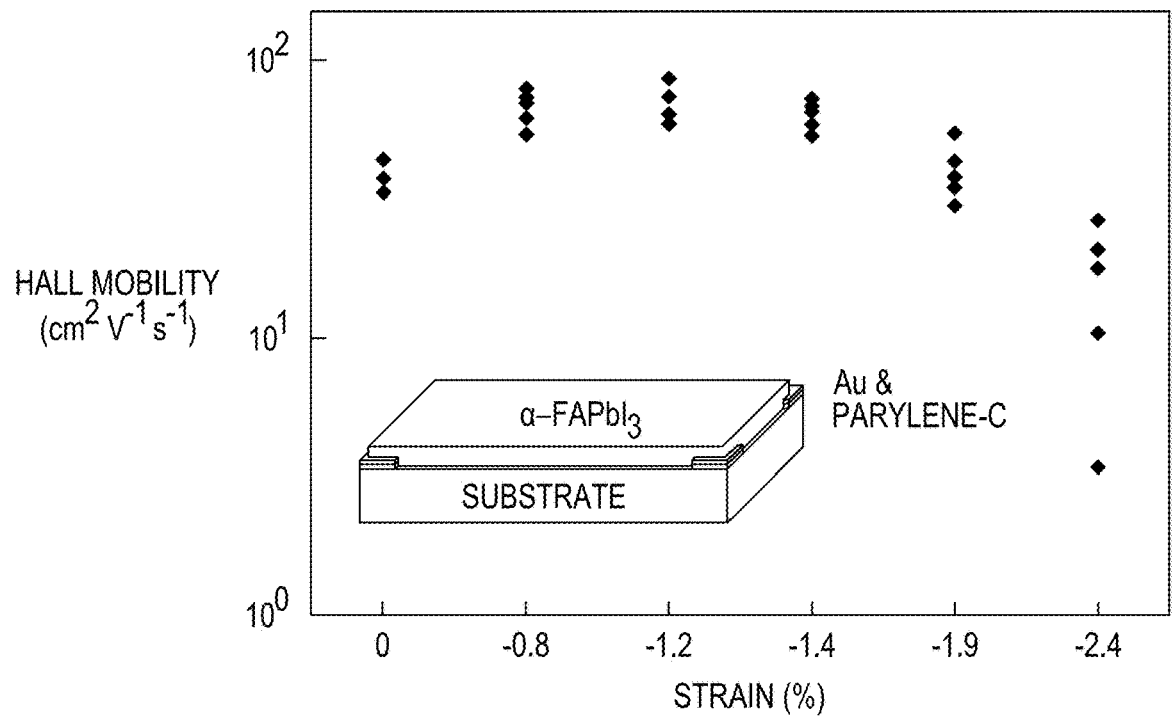
FIG. 3b shows hole mobilities by Hall effect measurements showing that a −1.2% strained α-FAPbI$_3$ has the highest hole mobility.

To validate these calculations, Hall effect carrier mobilities of the α-FAPbI$_3$ thin films under 0--2.4% strain are measured (FIG. 3b). FEA simulation results show that potential carrier transfer from the substrate to the epitaxial layer is negligible due to the insulating Parylene-C layer and the energy barrier between the epitaxial layer and the substrate (FIG. 15). All samples measured by the Hall effect show p-type character, which is consistent with the UPS results. Of all strain levels tested, films under −1.2% strain on MAPbCl$_{0.60}$Br$_{2.40}$ have the highest hole mobility (FIG. 3b). Further increasing the strain will result in a drastic drop in the hole mobility, because of higher dislocation densities that arise at higher strain levels. Note that the devices for Hall effect measurements have an epitaxial layer thickness larger than the critical thickness to ensure a sufficient contact area between the halide perovskite and the bottom electrode. Therefore, a high strain level will induce a high concentration of dislocations that degrade the hole mobility.

Figure 3C:
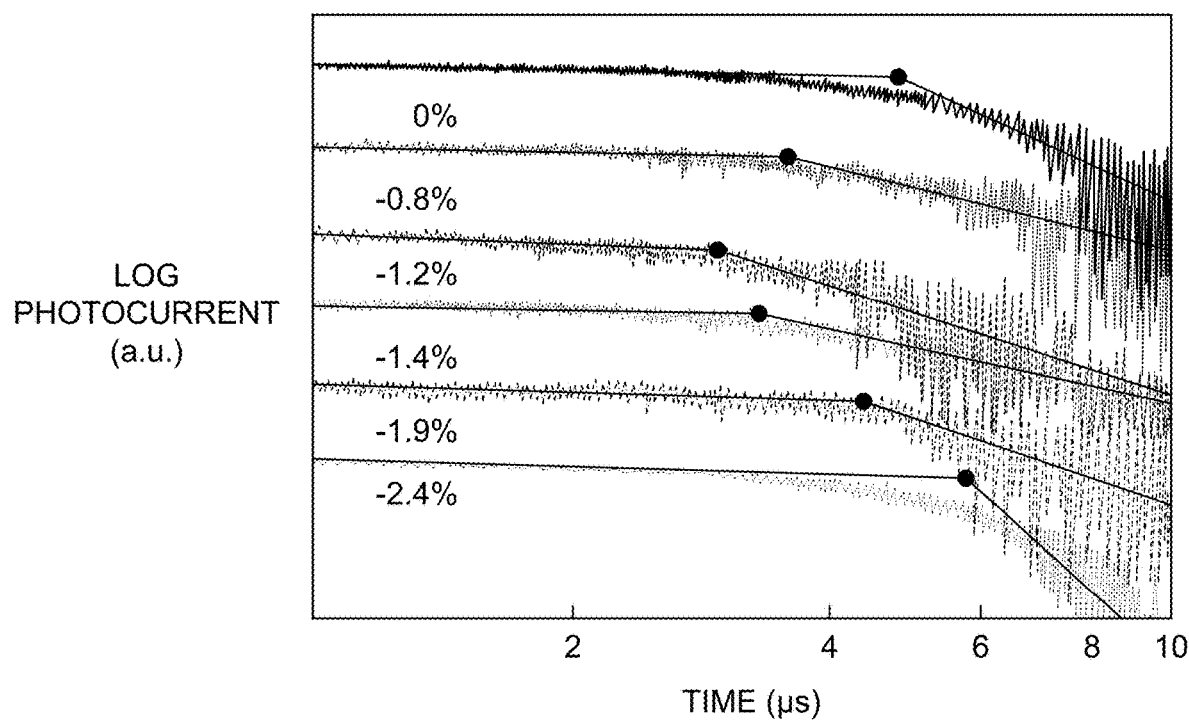
FIG. 3c shows transient photocurrent curves of the epitaxial α-FAPbI$_3$ under different strains.
Figure 3D:
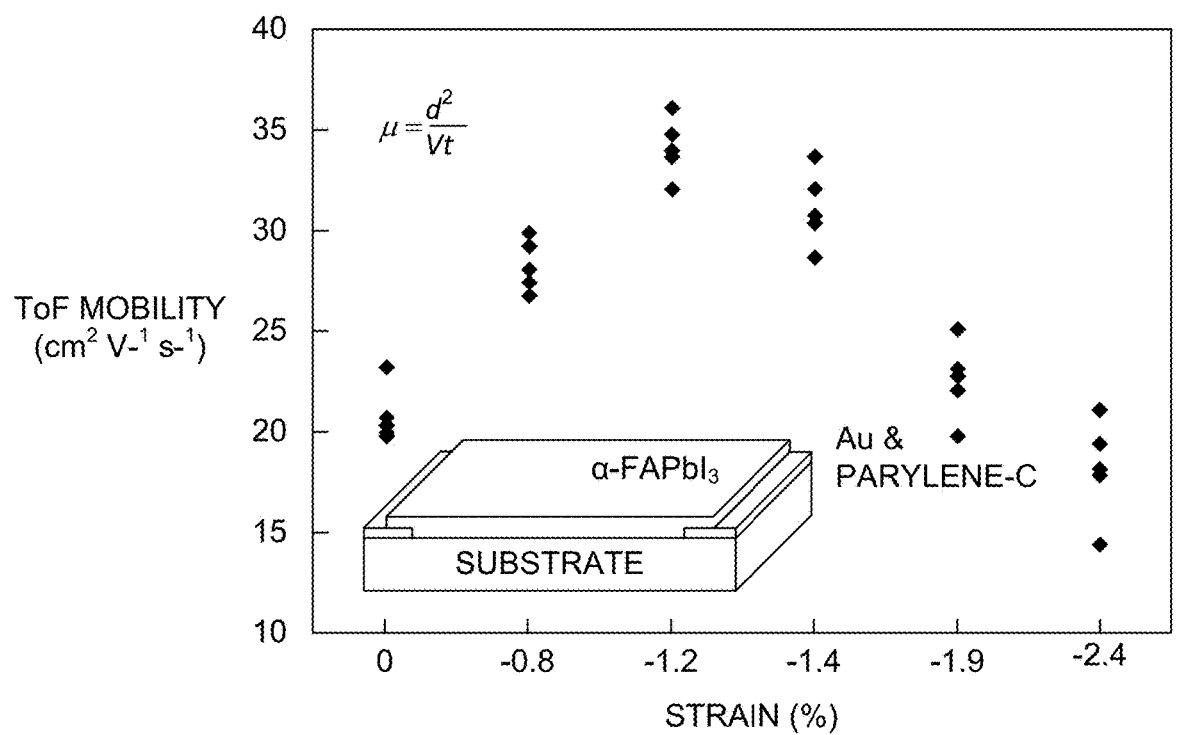
FIG. 3d shows plots of calculated carrier mobilities as a function of the strain magnitudes.

To validate the Hall mobility, time-of-flight (ToF) measurements are carried out. The transient photocurrents after single excitation are plotted logarithmically in FIG. 3c. The carrier transit time shows the smallest value of the film under −1.2% strain. The calculated carrier mobility is plotted as a function of the strain applied (FIG. 3d), which shows a similar trend to that by the Hall effect. Note that the absolute mobility values from the ToF and Hall effect measurements differ, due to experimental uncertainties in the type and quality of electronic contacts made during the fabrication processes[30]. The space charge limited current (SCLC) method can quantify trap density. Results show that a higher strain level leads to a higher trap density (FIG. 16), which explains the observed decrease in mobility under a higher strain magnitude. Capacitance-frequency (C-ω) spectroscopy is also used to cross-check the trap density (FIG. 17), whose results correspond well with those by the SCLC method.

Figure 17A:
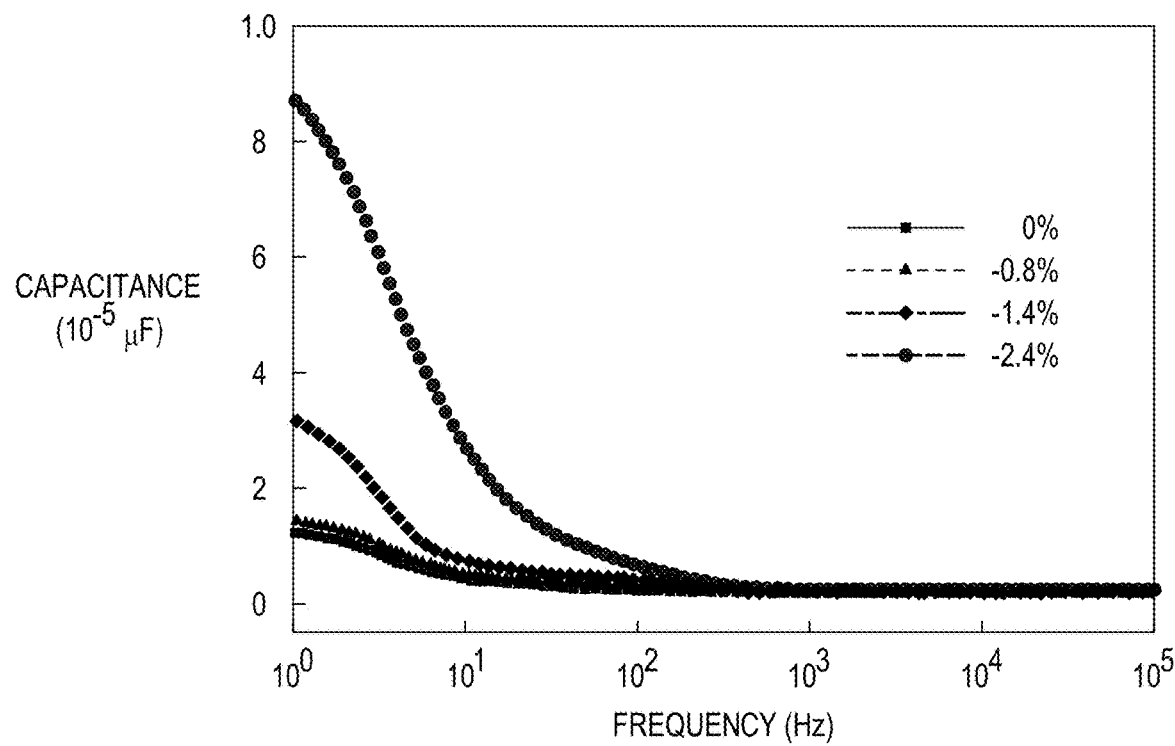
FIG. 17a shows the C-ω spectra of the epitaxial α-FAPbI$_3$ thin films with different strain magnitudes.
Figure 17B:
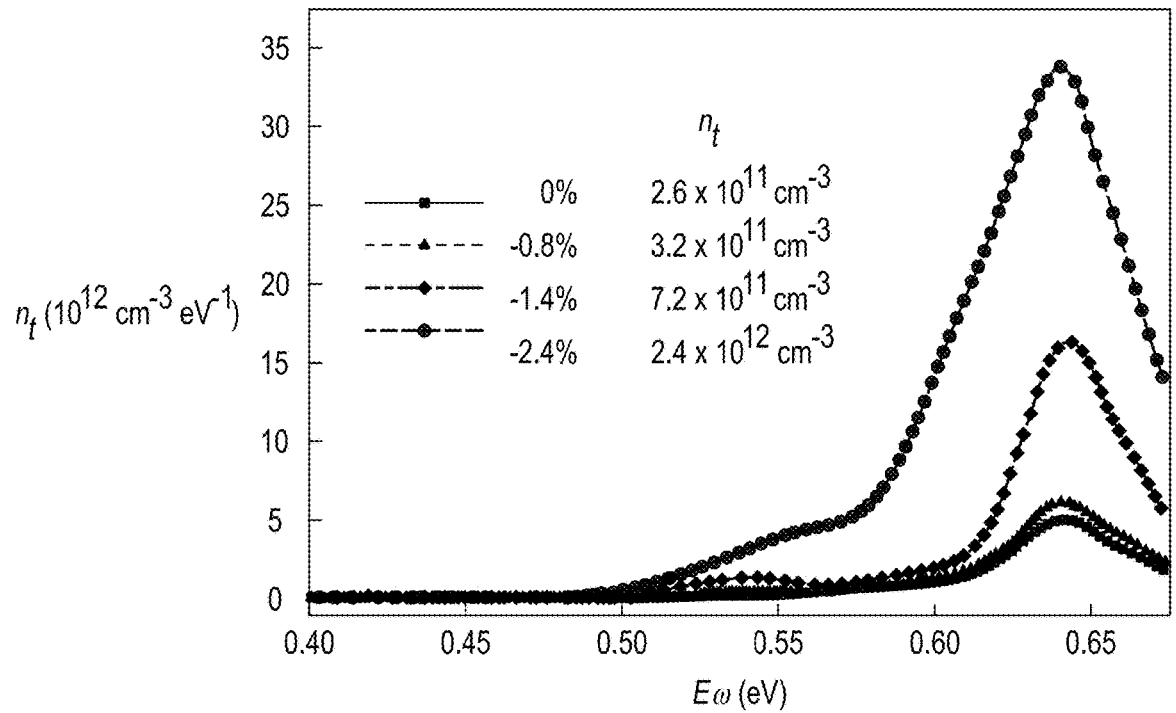
FIG. 17b shows the trap density distribution extracted from the C-ω spectra.
Figure 18A:
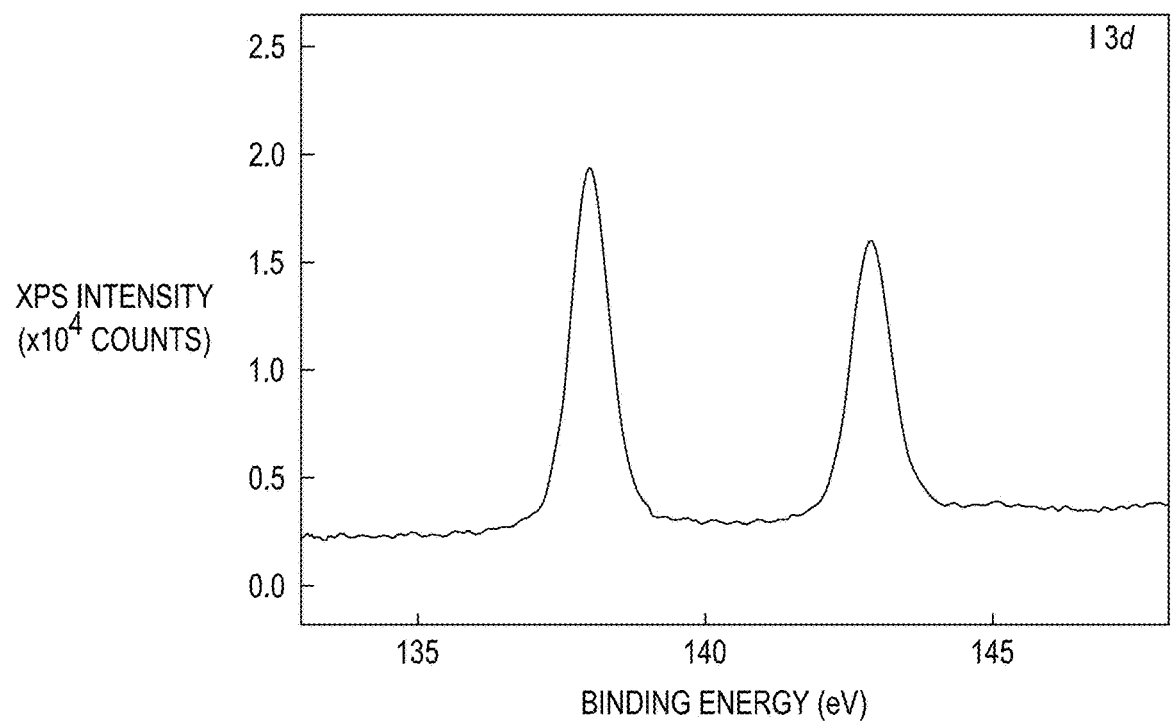
FIG. 18 shows XPS spectra of: I 3d (FIG. 18a); Pb 4f (FIG. 18b); Br 4p (FIG. 18c); and Cl 2p photoelectrons (FIG. 18d) from a strained α-FAPbI$_3$ film.
Figure 18B:
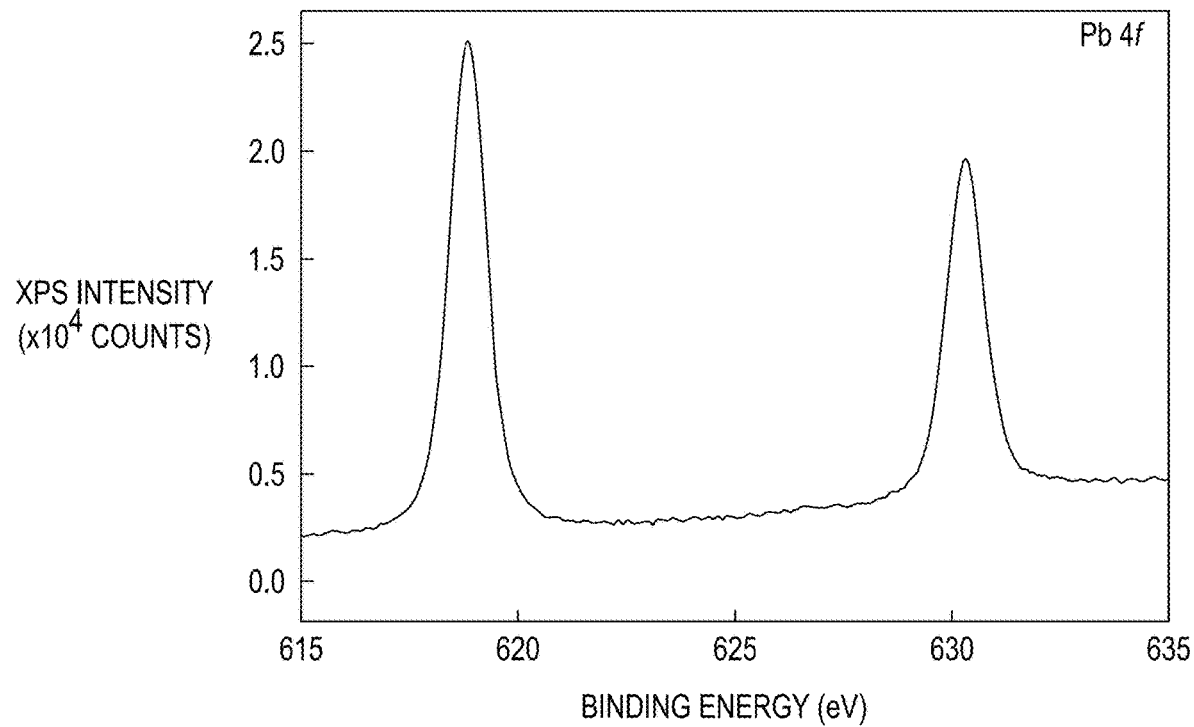
Figure 18C:
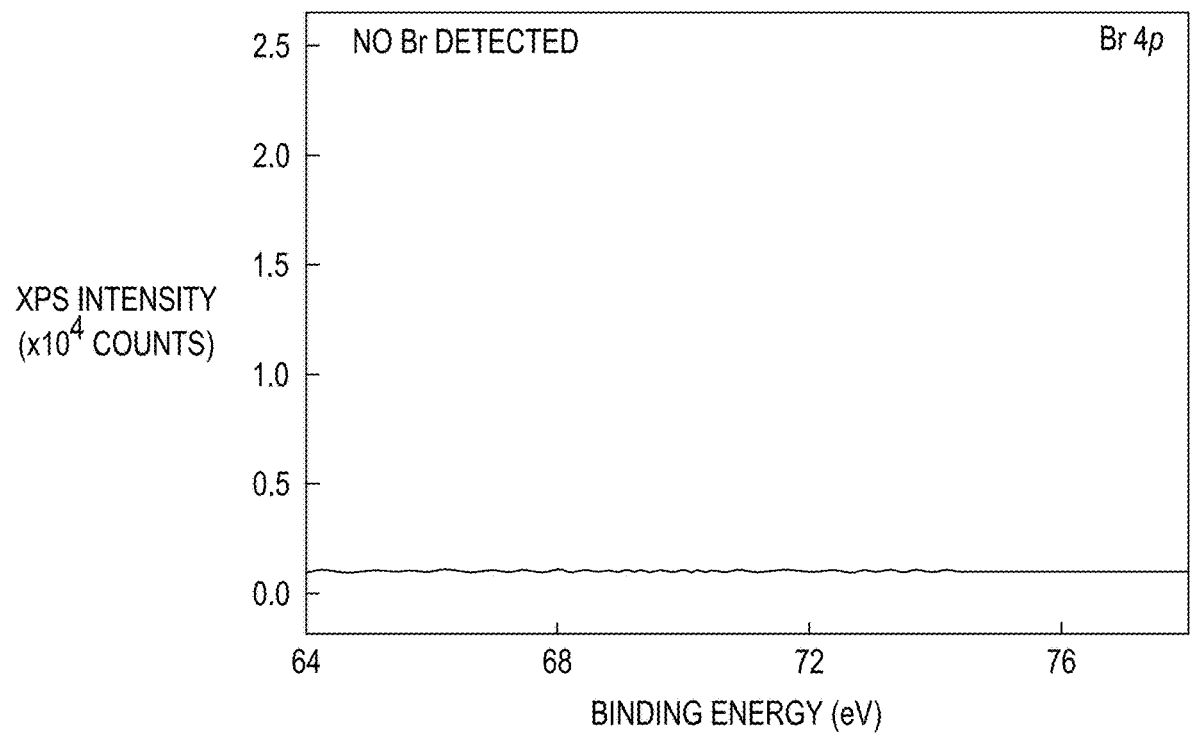
Figure 18D:
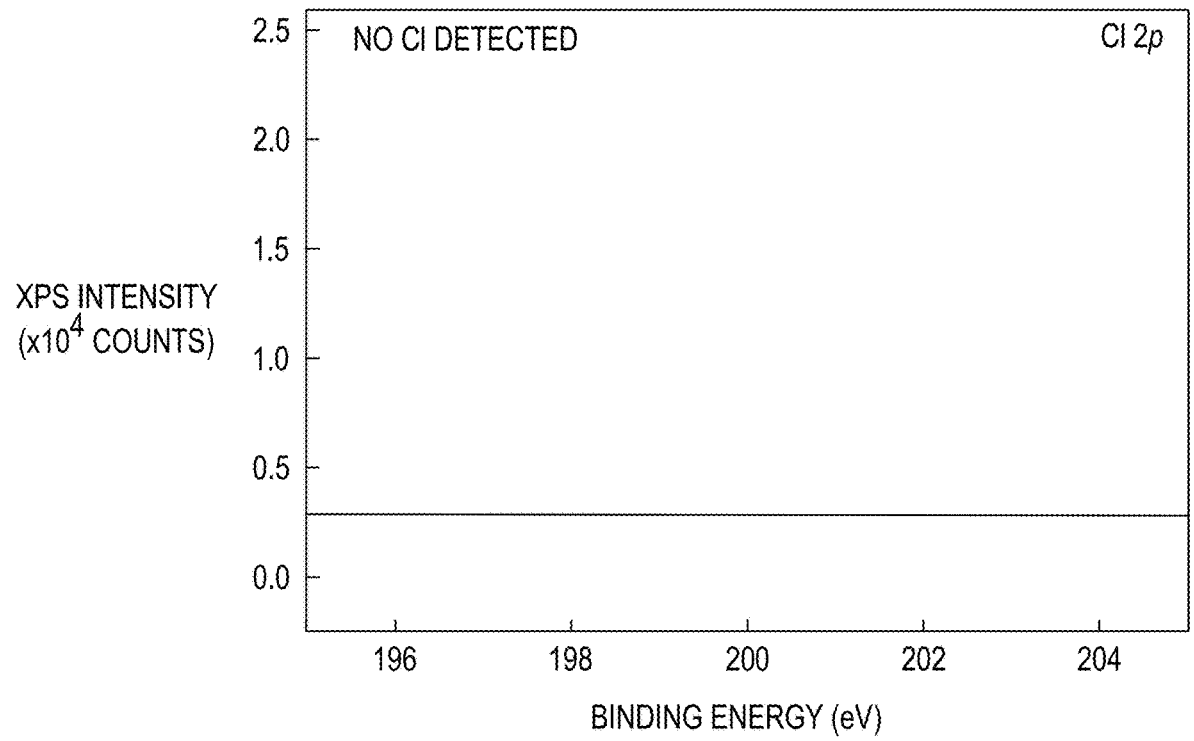

FIG. 17a shows the C-ω spectra of the epitaxial α-FAPbI$_3$ thin films with different strain magnitudes. The low-frequency capacitance originates from the carrier trapping/detrapping processes. The larger capacitance at a higher strain magnitude suggests a higher density of traps. The high-frequency capacitance is attributed to the geometrical capacitance and the depletion capacitance; FIG. 17b shows the trap density distribution extracted from the C-ω spectra. An obvious trap density increment is evident with increasing the strain magnitude. The fitted trap densities (n$_t$) by the Gaussian distribution equation indicate a higher trap density at a higher strain magnitude.

It has been widely accepted that α-FAPbI$_3$ crystals are metastable at room temperature and can quickly phase transform to photo-inactive δ-FAPbI$_3$ within ~24 hours because of its internal lattice strain and low entropy. Existing strategies for α-FAPbI$_3$ stabilization including alloying and surface passivation to either enlarge the bandgap or raise the carrier transport barrier by introducing nonconductive ligands. Surprisingly, the epitaxial α-FAPbI$_3$ thin film exhibits long-lasting phase stability at room temperature.

Figure 4A:
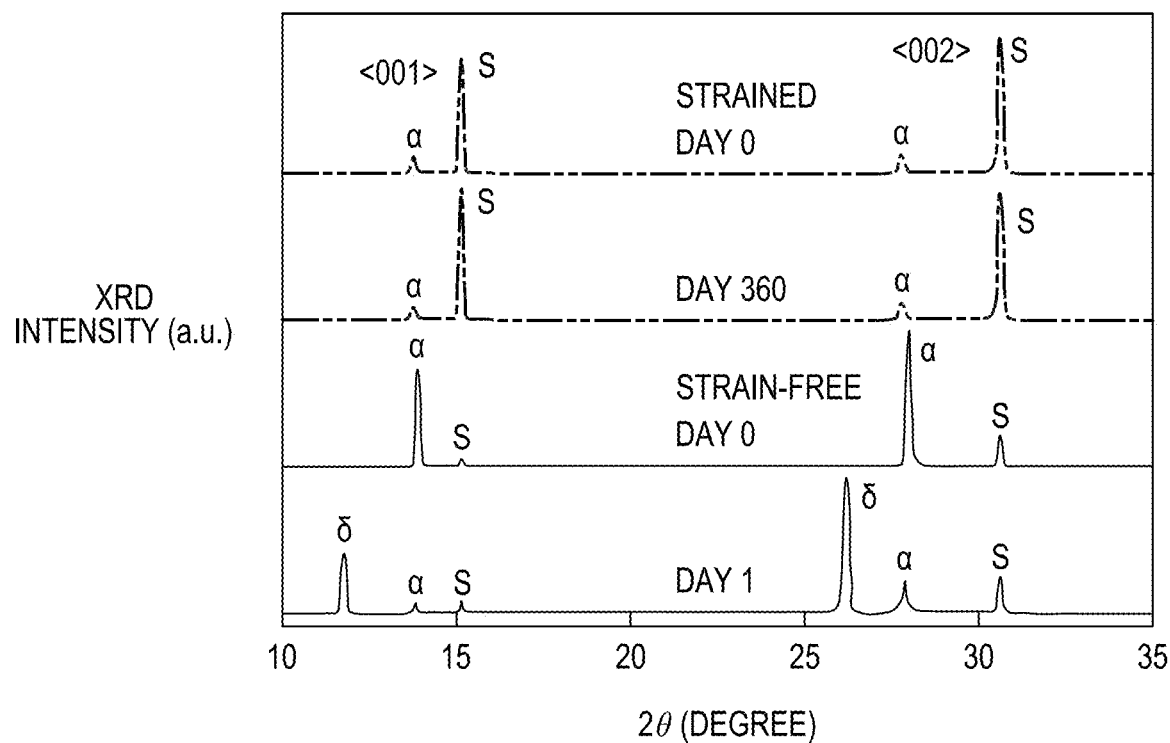
FIG. 4a shows a phase stability comparison of thin (~100 nm, strained) and thick (~10 μm, strain-free) epitaxial α-FAPbI$_3$ on MAPbCl$_{1.50}$Br$_{1.50}$ substrates by XRD, where α0 represents α-FAPbI$_3$, δ represents δ-FAPbI$_3$, and S represents the substrates.
Figure 4B:
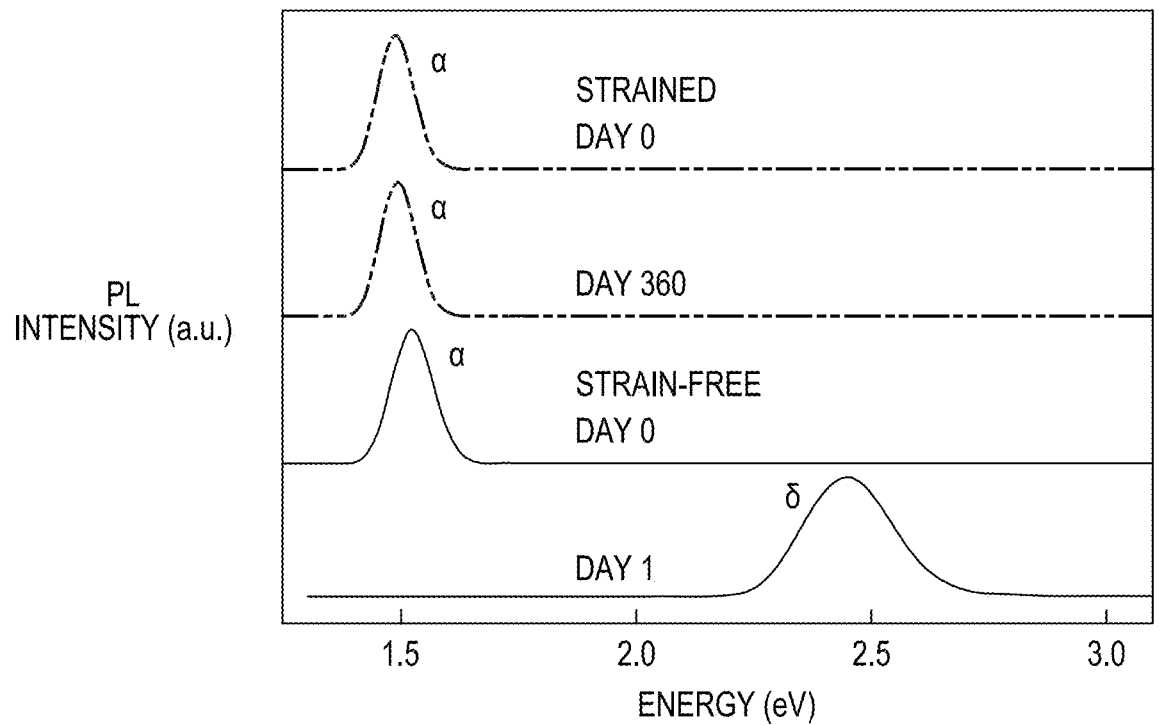
FIG. 4b Phase stability study by photoluminescence spectroscopy.
Figure 4C:
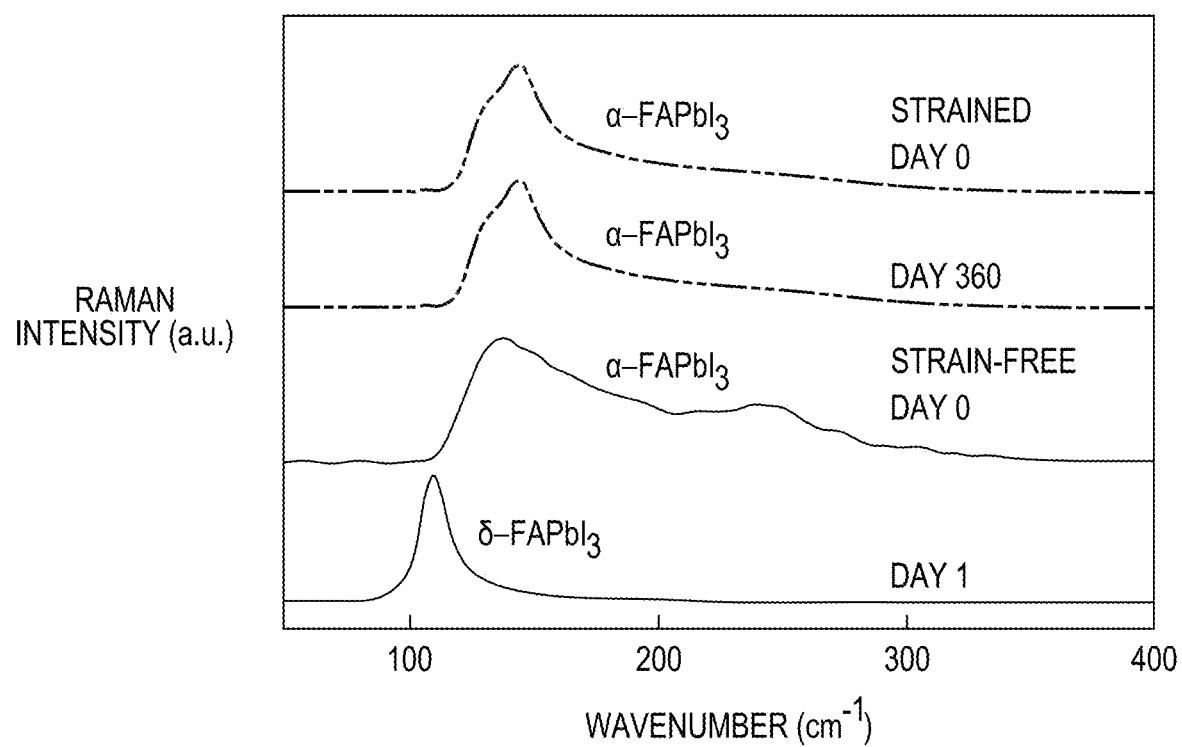
FIG. 4c shows a phase stability study by Raman spectroscopy.

FIG. 4a shows XRD results of a sub-100 nm epitaxial α-FAPbI$_3$ thin film that is stable for at least 360 days after growth. In the 10 μm epitaxial thick film, which is far beyond the threshold thickness at which the strain is fully relaxed, the stabilization effect disappears: after 24 hours, XRD peaks from δ-FAPbI$_3$ can be detected. The phase stability of the strained α-FAPbI$_3$ is also verified by PL (FIG. 4b) and Raman spectroscopy (FIG. 4c). Possible stabilization effect by incorporating Br or Cl into the α-FAPbI$_3$ is excluded because those foreign ions will stabilize the α-phase regardless of the epilayer thickness. X-ray photoelectron spectroscopy (XPS) measurements showing the absence of Br and Cl provide more evidence (FIG. 18).

The mechanism of the stable thin α-FAPbI$_3$ can be explained by two reasons. First, the interfacial energy of cubic α-FAPbI$_3$/cubic substrate is much lower than that of hexagonal δ-FAPbI$_3$/cubic substrate, which is the most critical factor for the stabilization effect. The epitaxial lattice will be constrained to the substrate due to the strong covalent bonds between them and, therefore, restricted from the phase transition. Second, the driving force of the α to δ phase transition is believed to be the internal tensile strain in the α-FAPbI$_3$ unit cell, which can induce the formation of vacancies and subsequent phase transition[34]. In this study, the epitaxial film is under compressive strain, which can neutralize the effect of the internal tensile strain. Therefore, the synergistic effect of the low-energy coherent epitaxial interface and the neutralizing compressive strain are the key to α-FAPbI$_3$ stabilization.

Figure 5A:
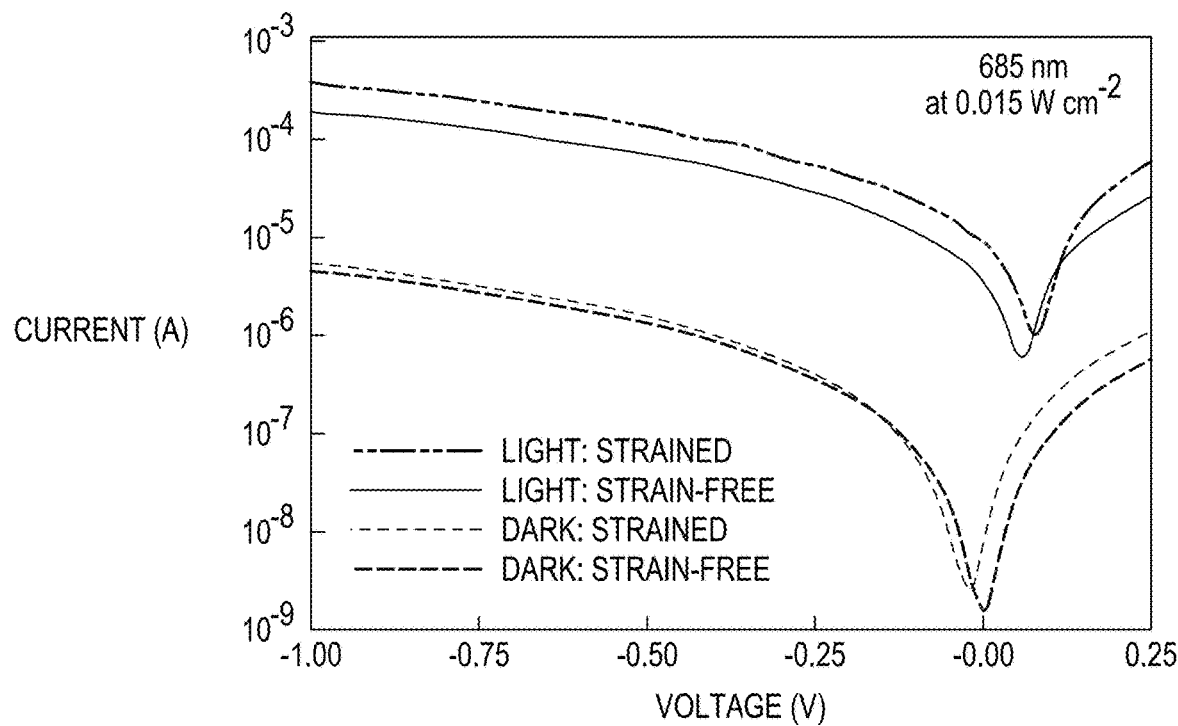
FIG. 5a shows the I-V characteristics of Au/α-FAPbI3/indium tin oxide (ITO) photoconductor structured photodetectors.
Figure 19:
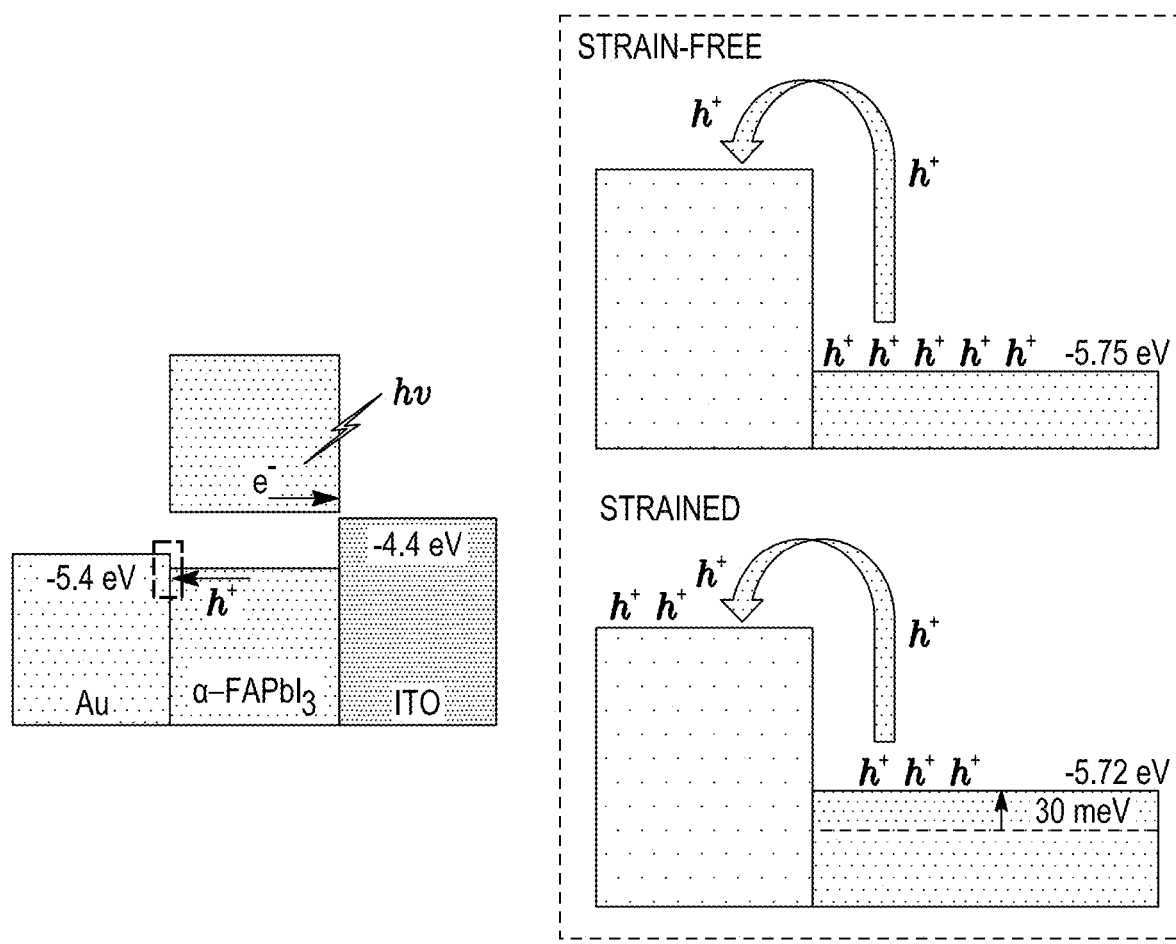
FIG. 19 shows the flat band diagram of the photodetector (left panel) and the strained and strain-free band diagrams illustrating the alignment of the valance band maximum (VBM) to the Au Fermi level under compressive strain (right panel).

High responsivity photodetectors are demonstrated as an illustrative use case of the strain engineered α-FAPbI$_3$ thin film. FIG. 5a shows the I-V characteristics of a strain-free device and a device under −1.2% strain. The dark current at −1 V of the strained device is ~15% higher than that of the strain-free one, indicating its higher defect density of the strained device. However, the photocurrent of the strained device shows a ~180% increase compared to the strain-free one. We attribute the photocurrent enhancement to the higher carrier mobility and the better alignment of VBM to the Au Fermi level under compressive strain (FIG. 19).

Figure 5B:
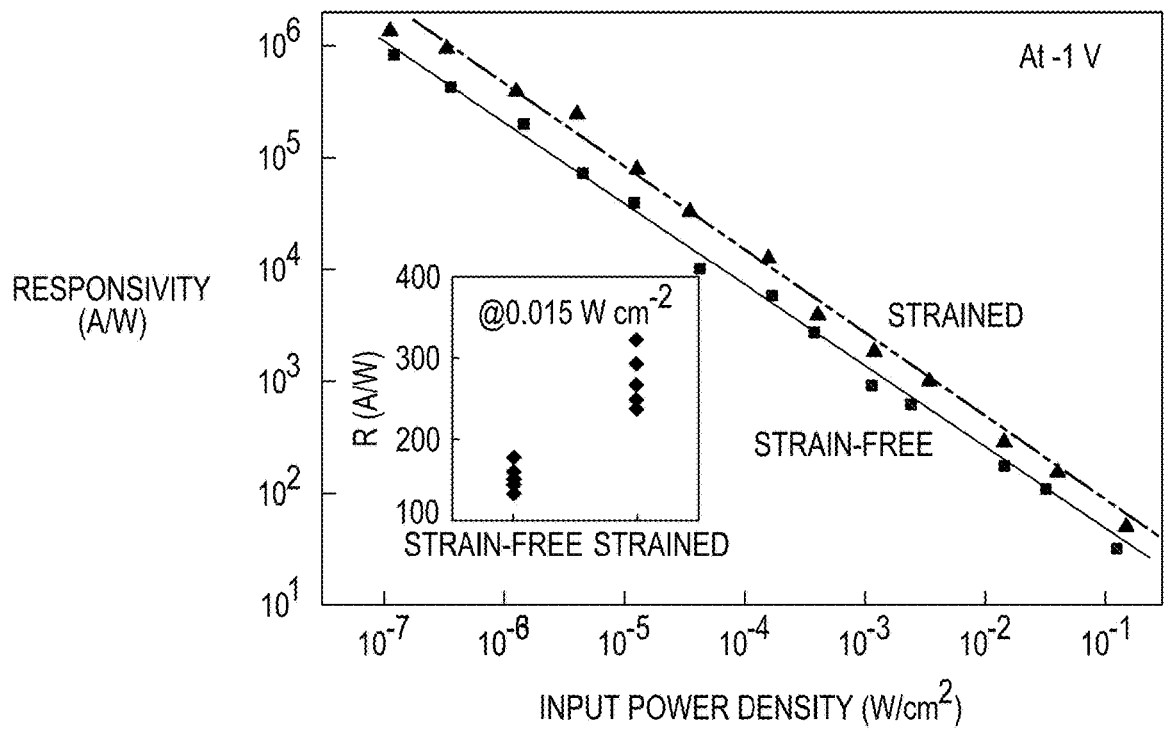
FIG. 5b shows a comparison of responsivity of the strained and strain-free photodetectors.
Figure 20A:
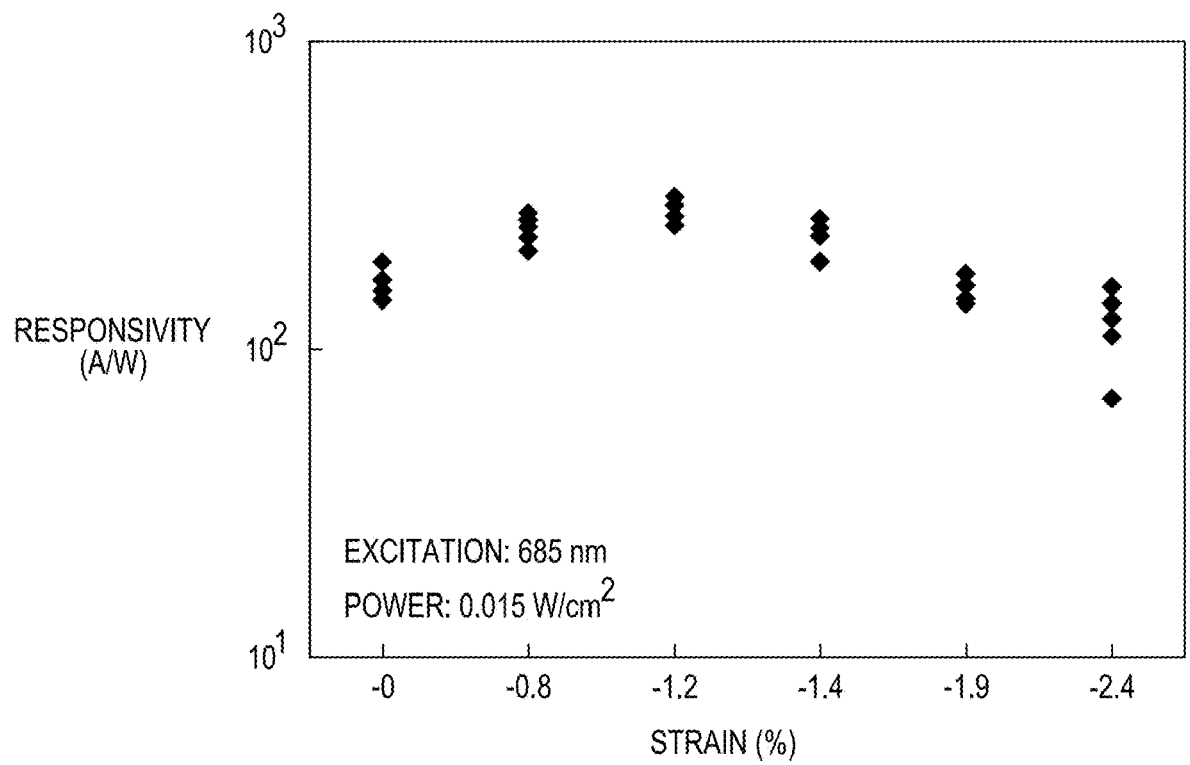
FIG. 20a shows the responsivity as a function of strain level in α-FAPbI$_3$ photodetector devices under −0.8%, −1.2% and −1.4% compressive strain.
Figure 20B:
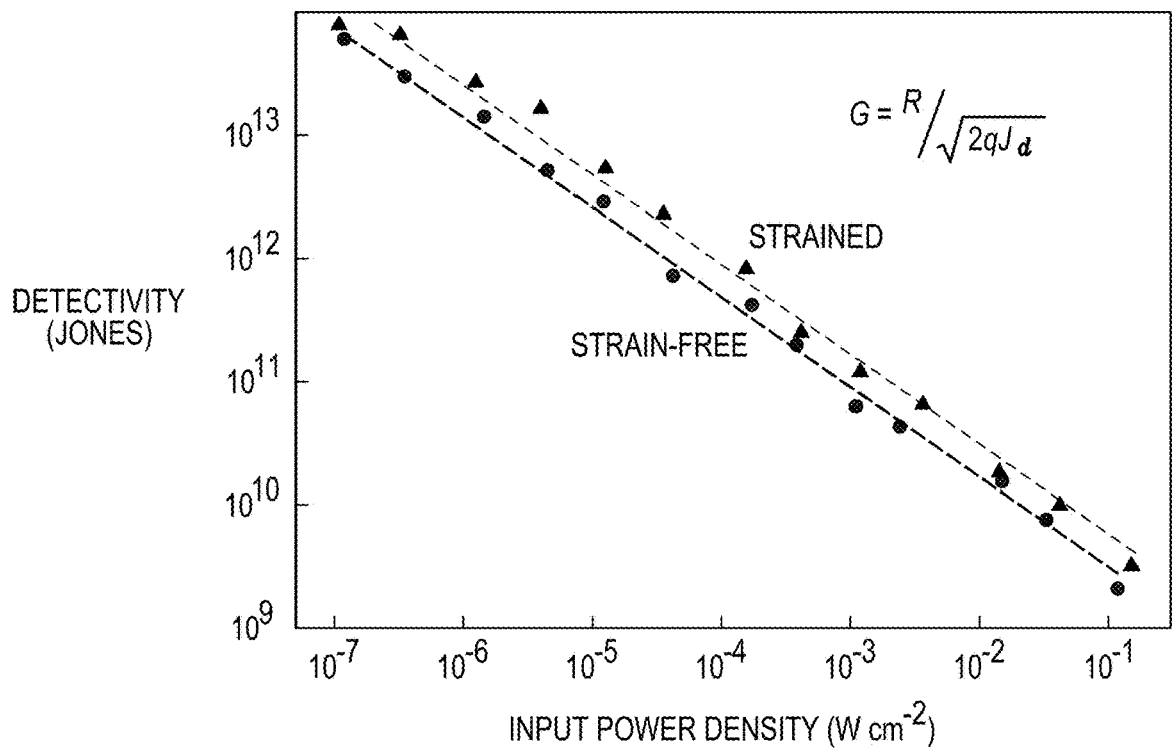
FIG. 20b shows the detectivity of the photodetector based on α-FAPbI$_3$ under −1.2% strain.
Figure 20C:
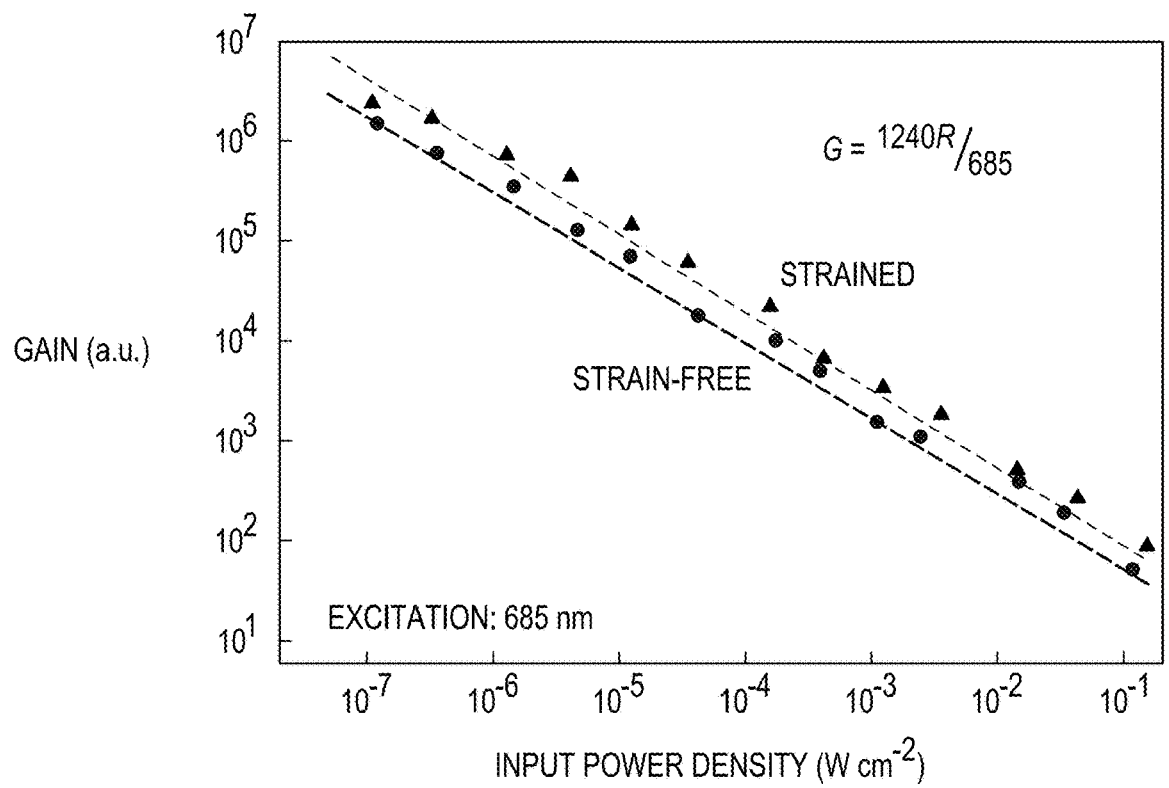
FIG. 20c shows the gain of the photodetector based on α-FAPbI$_3$ under −1.2% strain.

Responsivity of the two photodetectors, defined as the change in photocurrent per unit illumination intensity, is measured at various illumination intensities (FIG. 5b). The responsivity of the strained device, with a maximum of 1.3×10$^6$ A/W at an incident power density of 1.1×10$^{-7}$ W/cm$^2$, is almost twice of that of the strain-free device. This is again attributed to the enhanced carrier mobility and the better band alignment of the strained device. Similar to the trend in Hall effect carrier mobility, the measured responsivity peaks at −1.2% strain (FIG. 20a). Compressive strain also improves the detectivity and the gain of the photodetector (FIGS. 20b and 20c).

Figure 5C:
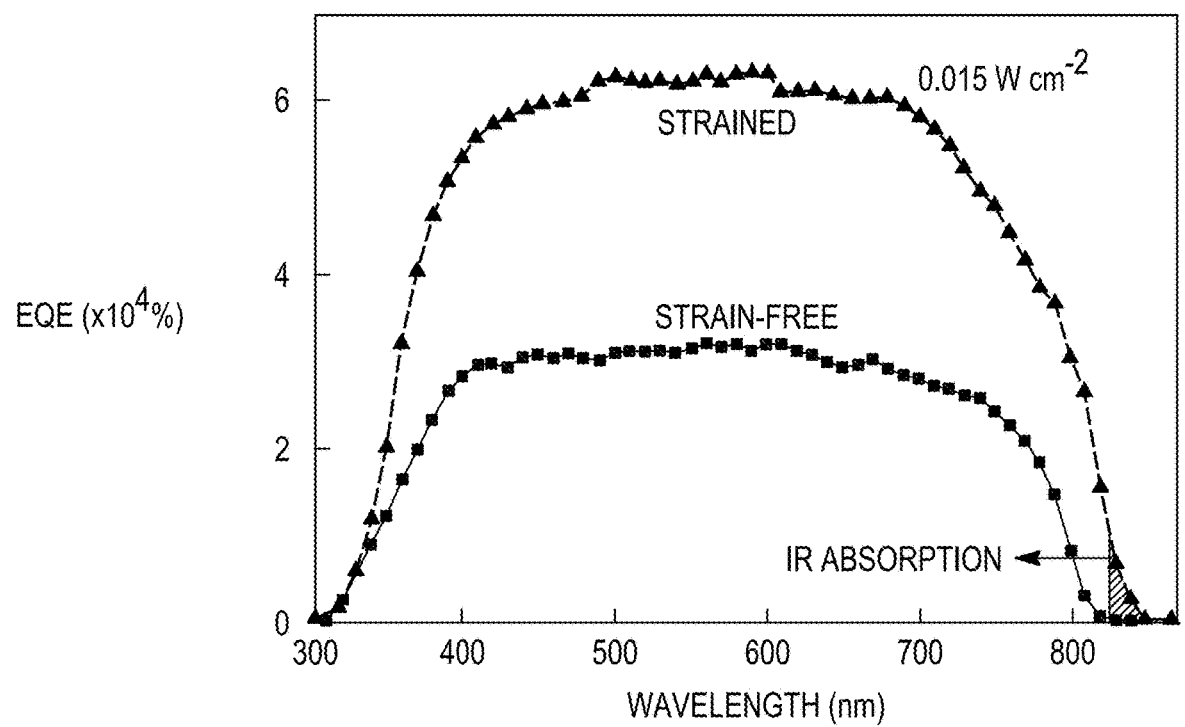
FIG. 5c shows external quantum efficiency (EQE) spectra of the strained and strain-free photodetectors showing that the strained photodetector yields a higher EQE as well as a broader absorption spectrum due to enhanced carrier mobility and bandgap reduction.
Figure 5D:
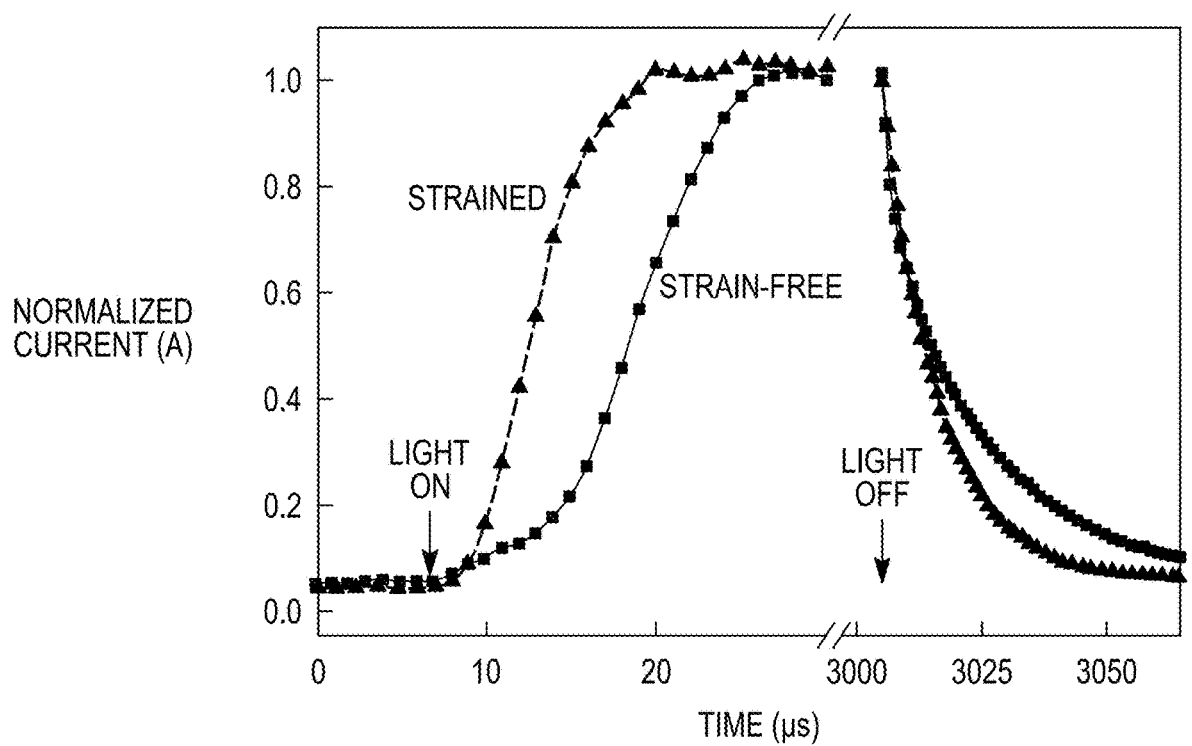
FIG. 5d shows the response times of the photodetectors, with faster rise and fall times for the strained (9 μs and 34 μs) than the strain-free (14 μs and 50 μs) device due to the enhanced carrier mobility and transport.
Figure 20D:
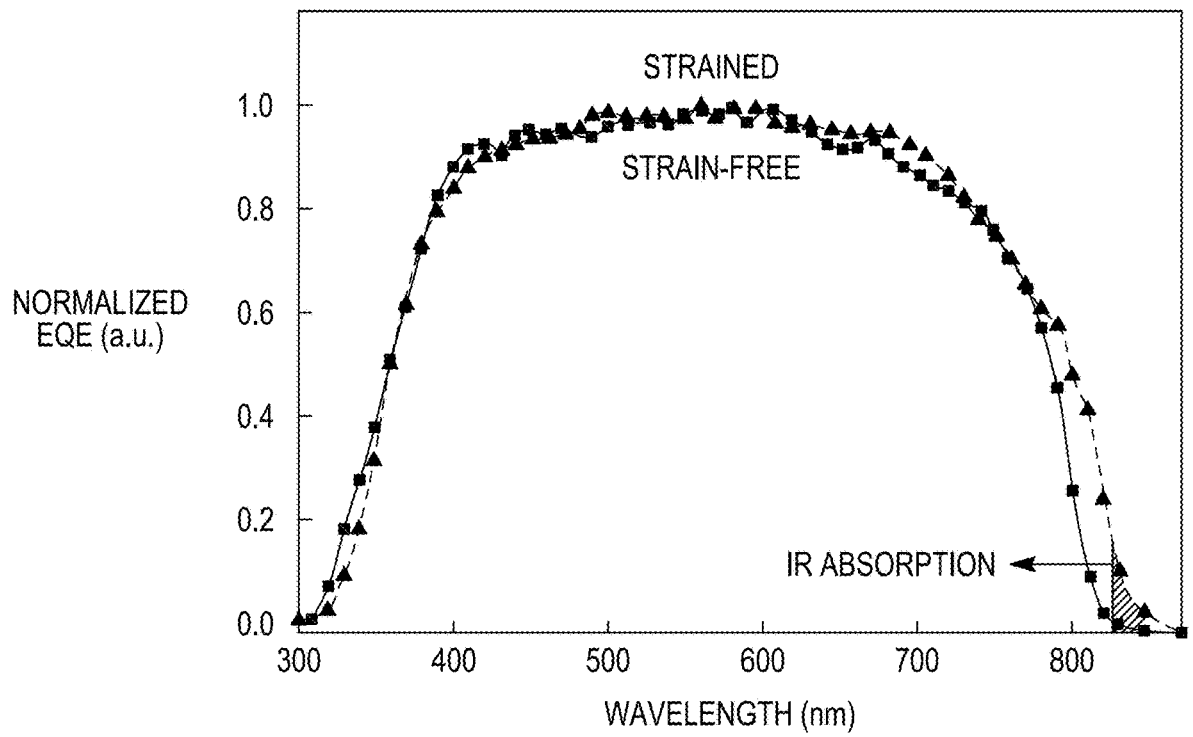
FIG. 20d shows the normalized external quantum efficiency (EQE) of the photodetector based on α-FAPbI$_3$ under −1.2% strain.

The strained device shows a much-enhanced external quantum efficiency (EQE) over the visible range (FIG. 5c) due to the enhanced carrier mobility as well as better carrier transport across the Au/perovskite interface. Additionally, after normalizing the spectra, a distinct response in the short-wave infrared region can be identified for the strained device (FIG. 20d), consistent with the PL measurements showing bandgap reduction under compressive strain. The rise and fall times of the strained device are ~30% shorter than those of the strain-free device, indicating an improvement in carrier dynamics.

Illustrative Methods

The following discussion presents illustrative methods and techniques that were used to fabricate the thin films and other devices described herein. Of course, more generally, a wide variety of other methods and techniques may be used to fabricate the various thin films and other devices described herein.

As part of the substrate fabrication process, methylammonium bromine (MABr) was synthesized as the precursor for the substrate growth. First, 20 mL methylamine (40% in methanol, Tokyo Chemical Industry Co.) and 21.2 mL hydrobromic acid (48 wt % in water, Sigma Aldrich) are mixed in an ice bath and the temperature is maintained for the reaction to continue for 2 hours. The mixture was heated up to 80° C. to evaporate the solvent. The precipitate was dissolved in anhydrous ethanol (Sigma Aldrich) at 80° C. and cooled down for recrystallization. The crystals were then centrifuged with diethyl ether and dried at 80° C. for overnight.

Methylammonium lead chloride (MAPbCl$_3$) solution was prepared by mixing 0.6752 g methylammonium chloride (MACl, 98%, Tokyo Chemical Industry Co.) and 2.781 g lead chloride (PbCl$_2$, 99%, Alfa Aesar) in a mixed solution of 5 mL anhydrous dimethylformamide (DMF, 99.8%, Aldrich) and 5 mL anhydrous dimethyl sulfoxide (DMSO, 99.8%, Aldrich). Methylammonium lead bromine (MAPbBr$_3$) solution was prepared by mixing 1.120 g MABr and 3.670 g lead bromine (PbBr$_2$, 98%, Acros) in 10 mL DMF. MAPbCl$_3$ and MAPbBr$_3$ solutions were mixed with different ratios. The mixed solutions were kept at room temperature to slowly evaporate the solvent, and single crystals can be collected to be used as substrates. FAPbI$_3$ solutions were prepared by mixing formamidinium iodide (FAI, 99.9%, Greatcell Solar) and lead iodide (PbI$_2$, 99.99%, Tokyo Chemical Industry Co.) at a molar ratio of 1:1 in anhydrous gamma-Butyrolactone (GBL, Sigma Aldrich) with different concentrations. Strain-free α-FAPbI$_3$ single crystals were obtained by heating the FAPbI$_3$ solutions to 120° C.

To epitaxially grow the α-FAPbI$_3$ on the substrates, the substrates were heated to different temperatures, and the preheated FAPbI$_3$ solutions (100° C.) were then deposited onto the substrates for epitaxial growth.

As part of the structural and optical characterizations process, SEM images were taken with a Zeiss Sigma 500 SEM operated at 3 kV. The 2θ/ω XRD patterns, the rocking curve (ω scan), and the asymmetrical RSM around the (104) reflection of the substrate were measured by a Rigaku Smartlab diffractometer equipped with a Cu Kα1 radiation source (λ=0.15406 nm) and a Ge (220×2) monochromator. The (a,c) for (104) reflection RSM is converted from ($Q_x$, $Q_z$) by a=1/$Q_x$, c=4/$Q_z$. Raman and PL spectra were measured by a Renishaw inVia Raman spectrometer. AFM was carried out by a Veeco Scanning Probe Microscope under a tapping mode. XPS and UPS were carried out by Kratos AXIS Supra with an Al Kα anode source and a He I (21.22 eV) source, respectively. Measurements were operated under 10$^{-8}$ Torr chamber pressure. XPS data were calibrated with the C1s peak (284.8 eV). Note that bulk α-FAPbI$_3$ single crystals were used as the strain-free samples during structural and optical characterizations if not specified.

Devices described herein with a vertical structure were fabricated based on a lithography based method. Parylene-C (50 nm) and Au (50 nm) were sequentially deposited on the substrates, followed by a photolithography process with AZ-1512 as the photoresist. The pattern was composed of an array of 2 μm diameter circles (exposed) with 1 μm inter-distance (covered by photoresist). Au was chemically etched with wet etchants while Parylene-C was precisely etched by reactive ion etching. The etched substrates underwent secondary growth in their corresponding growth solutions so that the substrate surface reaches the same height as the electrode. Epitaxial growth on the patterned substrate allows the α-FAPbI$_3$ crystals to start from the exposed patterns and gradually merge into a thin film with a controllable thickness. Note that MAPbCl$_x$Br$_{(3-x)}$ substrates were used for strained (heteroepitaxy) while α-FAPbI$_3$ substrates were used for strain-free devices (homoepitaxy). Top electrodes were then deposited by sputtering (for ITO, 200 nm). For vertical devices, the area of the top electrode was controlled to be 1×1 mm$^2$ using a shadow mask. For planar devices, Parylene-C (50 nm) and the electrode (Au 50 nm) were deposited using a shadow mask with designed electrode layouts.

SCLC measurements were carried out by a Keithley 2400 source meter and a customized probe station in a dark environment. Devices with an Au/Perovskite/Au structure were used. C-ω measurements were carried out by an Agilent Parameter Analyzer B1500 in a dark environment. Devices with an Au/Perovskite/ITO structure were used. The α-FAPbI$_3$ thickness of all devices for SCLC and C-w measurements was controlled to be 500 nm. Hall effect measurements were carried out with a Lake Shore Hall measurement system (HM 3000) using the van der Pauw method. Note that the Parylene-C layer prevented direct contact between the substrate and electrodes, eliminating possible carriers extracted from the substrates. The α-FAPbI$_3$ thickness of all devices for Hall effect measurement was controlled to be 500 nm. For the ToF measurement, a 685 nm pulse laser (10 mW/cm$^2$) with <10$^{-10}$ s pulse width was used as the light source. The photoresponse was measured with an oscilloscope (Agilent MSO6104A Channel Mixed Signal). An external bias of 1 V was applied to drive the carriers in the device while a 1 MΩ resistor was connected in series to simulate the open-circuit condition so that the carriers were effectively blocked in the devices. The measurement was carried out in dark while the bias and the laser power were kept at constant. The experiment setup followed the reported ToF measurement of halide perovskite single crystals. The α-FAPbI$_3$ thickness of all devices for ToF measurements was controlled to be 500 nm.

Photodetector characterization was conducted using a 685 nm laser as the light source. The I-V characteristics were collected on a probe station with an Agilent B2912A source meter.

First-principles DFT calculations were performed using the Vienna ab Initio Simulation Package. Electron-ion interactions were described using the Projector Augmented Wave pseudopotential. Electron-electron exchange-correlation functional was treated using the Generalized Gradient Approximation parametrized by Perdew, Burke, and Ernzerhof. For band gap calculations, spin-orbit coupling (SOC) was incorporated due to the heavy element Pb, and the hybrid functionals within Heyd-Scuseria-Ernzerhof (HSE) formalism with 25% Hartree-Fock (HF) exchange were employed. A cutoff energy of 400 eV for the plane-wave basis set was used. All structures were fully optimized until all components of the residual forces were smaller than 0.01 eV/Å. The convergence threshold for self-consistent-field iteration was set at 10$^{-5}$ eV. For optimization of the cubic lattice parameter, a Γ-centered 3×3×3 k-point mesh was used. A denser k-point mesh of 4×4×4 was used to get accurate energies and electronic structures for strained cells. For optimization and static calculations of the heterostructural models, Γ-centered 4×4×1 and 5×5×1 k-point meshes were used, respectively. Raman intensities were calculated by the CASTEP module in Materials Studios with a 3×3×3 k-point mesh and a 400 eV cutoff energy.

Finite element analysis simulations of the current density was done by the multiphysics analysis in COMSOL. Simulation of the elastic strain relaxation was done by the ABAQUS.

Other Halide Perovskite Material Systems

While the discussion above has presented one particular pair of halide perovskite material systems (i.e., α-FAPbI$_3$ and MAPbCl$_x$Br$_{3-x}$) to illustrate the methods and techniques described herein, more generally these methods and techniques are applicable to a wide variety of alternative combinations of halide perovskites. For instance, in some implementations, the halide perovskite material chosen for the thin film and/or the substrate may be, for example, MAPbI$_3$, MAPbBr$_3$, MAPb(I,Br)$_3$, FAPbI$_3$, FAPbBr$_3$, FAPb(I,Br)$_3$, CsPbI$_3$, CsPbBr$_3$, CsPb(I,Br)$_3$, (Cs,FA)Pb(I,Br)$_3$, MAPbCl$_3$, MAPb(BrCl)$_3$, MAPb(I,Cl)$_3$, FAPbCl$_3$, FAPb(BrCl)$_3$, or FAPb(I,Cl)$_3$ where MA is methyl ammonium and FA is formamidinium.

More generally still, the halide perovskite material chosen for the thin film and/or the substrate may have the formula ABX$_3$; wherein: A is at least one monovalent or divalent organic cation, inorganic cation or a combination thereof; X is at least one halide anion, a pseudohalide anion or a combination thereof; and B is at least one metal cation wherein, when combined with A and X, forms a perovskite material; wherein the inorganic cation of A is different from the metal cation of B.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

The invention claimed is:

1. A method of forming a device, comprising:
   choosing a first halide perovskite material from which a halide perovskite thin film is to be formed from a solvent-based liquid solution;
   choosing an epitaxial substrate formed from a second halide perovskite material;
   fabricating a patterned mask to control solvent-based liquid solution growth behavior of the halide perovskite thin film on the epitaxial substrate; and
   epitaxially forming the halide perovskite thin film on the epitaxial substrate from the first halide perovskite material, the first halide perovskite material being α-FAPbI$_3$, where FA is formamidinium, wherein the epitaxial substrate is chosen such that the halide perovskite thin film formed on the substrate has a selected value of at least one property, the property being selected from the group including crystal structure stability, charge carrier mobility and band gap, and wherein the epitaxially forming includes epitaxially forming an elastically strained halide perovskite thin film on the epitaxial substrate from the first halide perovskite material, wherein the elastically strained halide perovskite thin film has a thickness less than 100 nm, and the first halide perovskite has a compressive strain between 0% and −2.4%, wherein the elastically strained halide perovskite thin film has a room temperature bandgap between 1.488 eV and 1.523 eV, an External Quantum Efficiency (EQE) between $3\times10^{-4}$%, and $6\times10^{-4}$% and a time-of-flight electron mobility between 20 $cm^2V^{-1}s^{-1}$ and 30 $cm^2V^{-1}s^{-1}$.

2. The method of claim 1, wherein the second halide perovskite material is $MAPbCl_xBr_{3-x}$, wherein MA is methyl ammonium and x is between 0 and 1.5.

3. The method of claim 2, wherein the halide perovskite thin film has a compressive strain up to −2.4% 2.4%.

4. The method of claim 2, wherein the halide perovskite thin film has a pseudo-cubic lattice structure.

5. The method of claim 1, further comprising adjusting the compressive strain of the halide perovskite thin film to a particular value so that the halide perovskite thin film has the selected value of the at least one property.

6. The method of claim 1, wherein forming the thin film from solution includes depositing the solution onto a preheated substrate.

7. The method of claim 1, further comprising depositing the solution onto a preheated substrate using an inverse temperature growth method.

8. The method of claim 1, wherein the first and/or second halide perovskite materials are selected from the group consisting of a halide perovskite material having the formula $ABX_3$; wherein: A is at least one monovalent or divalent organic cation, inorganic cation or a combination thereof; X is at least one halide anion, a pseudohalide anion or a combination thereof; and B is at least one metal cation wherein, when combined with A and X, forms a perovskite material; wherein the inorganic cation of A is different from the metal cation of B.

9. A device formed in accordance with the method of claim 1.

10. The method of claim 1, wherein the first halide perovskite material is $\alpha$-$FAPbI_3$, where FA is formamidinium and the second halide perovskite material is $MAPbCl_xBr_{3-x}$, wherein MA is methyl ammonium and x is between 0 and 1.5.

11. The method of claim 1, further comprising;
prior to epitaxially forming the halide perovskite thin film, sequentially depositing Parylene-C and Au layers on the epitaxial substrate so that the Parylene-C layer prevents an injection of carriers from the Au layer to the epitaxial substrate;
etching the Parylene-C and Au layers to establish a pattern on the epitaxial substrate;
forming an electrode on the halide perovskite thin film.

12. The method of claim 11 wherein epitaxially forming the halide perovskite thin film includes epitaxially forming the halide perovskite thin film from solution.

13. A method of forming a device, comprising:
choosing a first halide perovskite material from which a halide perovskite thin film is to be formed from a solvent-based liquid solution and a single crystal halide perovskite substrate from a second halide perovskite material on which the halide perovskite thin film is to be formed to tune a property of the halide perovskite thin film using strain modulation to thereby impose a compressive or tensile strain on the halide perovskite thin film, wherein the first halide perovskite material is $\alpha$-$FAPbI_3$, where FA is formamidinium;
fabricating a patterned mask to control solvent-based liquid solution growth behavior of the halide perovskite thin film on the single crystal halide perovskite substrate; and
epitaxially forming the halide perovskite thin film on the chosen single crystal halide perovskite substrate from the first halide perovskite material, wherein the epitaxially forming includes epitaxially forming an elastically strained halide perovskite thin film on the epitaxial substrate from the first halide perovskite material, wherein the elastically strained halide perovskite thin film has a thickness less than 100 nm, and the first halide perovskite has a compressive strain between 0% and −2.4%, wherein the elastically strained halide perovskite thin film has a room temperature bandgap between 1.488 eV and 1.523 eV, an External Quantum Efficiency (EQE) between $3\times10^{-4}$%, and $6\times10^{-4}$% and a time-of-flight electron mobility between 20 $cm^2V^{-1}s^{-1}$ and 30 $cm^2V^{-1}s^{-1}$.

14. The method of claim 13, wherein the first and second halide perovskite materials have a lattice parameter mismatch that gives rise to the compressive or tensile strain.

15. The method of claim 14, where the lattice parameter mismatch gives rise to a compressive strain of up to −2.4%.

16. The method of claim 13, wherein the first and/or second halide perovskite materials are selected from the group consisting of a halide perovskite material having the formula $ABX_3$; wherein: A is at least one monovalent or divalent organic cation, inorganic cation or a combination thereof; X is at least one halide anion, a pseudohalide anion or a combination thereof; and B is at least one metal cation wherein, when combined with A and X, forms a perovskite material; wherein the inorganic cation of A is different from the metal cation of B.

17. The method of claim 16, wherein forming the thin film from solution includes depositing the solution onto a preheated substrate.

18. The method of claim 13, further comprising adjusting the compressive strain of the halide perovskite thin film to a particular value so that the halide perovskite thin film has a selected value of the at least one property.

19. The method of claim 18, wherein the property of halide perovskite thin film is selected from the group consisting of crystal structure stability, charge carrier mobility and band gap.

20. The method of claim 13, further comprising:
prior to epitaxially forming the halide perovskite thin film, sequentially depositing Parylene-C and Au layers on the single crystal halide perovskite substrate so that the Parylene-C layer prevents an injection of carriers from the Au layer to the single crystal halide perovskite substrate;
etching the Parylene-C and Au layers to establish a pattern on the single crystal halide perovskite substrate;
forming an electrode on the halide perovskite thin film.

21. The method of claim 20 wherein epitaxially forming the halide perovskite thin film includes epitaxially forming the halide perovskite thin film from solution.

* * * * *